United States Patent
Ghantous et al.

(10) Patent No.: US 9,385,555 B2
(45) Date of Patent: **\*Jul. 5, 2016**

(54) METHOD AND CIRCUITRY TO DETERMINE THE RELAXATION TIME OF A BATTERY/CELL

(71) Applicant: Qnovo Inc., Newark, CA (US)

(72) Inventors: Dania Ghantous, Walnut Creek, CA (US); Nadim Maluf, Los Altos, CA (US); Fred Berkowitz, Los Gatos, CA (US)

(73) Assignee: Qnovo Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/851,921

(22) Filed: Sep. 11, 2015

(65) Prior Publication Data

US 2015/0380957 A1 Dec. 31, 2015

Related U.S. Application Data

(63) Continuation of application No. 14/615,491, filed on Feb. 6, 2015, which is a continuation of application No. 14/161,755, filed on Jan. 23, 2014, now Pat. No. 8,975,874, which is a continuation of application No. 13/111,902, filed on May 19, 2011, now Pat. No. 8,638,070.

(60) Provisional application No. 61/346,953, filed on May 21, 2010, provisional application No. 61/358,384, filed on Jun. 24, 2010, provisional application No. 61/368,158, filed on Jul. 27, 2010, provisional application No. 61/439,400, filed on Feb. 4, 2011, provisional application No. 61/468,051, filed on Mar. 27, 2011.

(51) Int. Cl.
*H01M 10/44* (2006.01)
*H01M 10/46* (2006.01)
*H02J 7/00* (2006.01)
*G01R 31/36* (2006.01)

(52) U.S. Cl.
CPC ............. *H02J 7/007* (2013.01); *G01R 31/36* (2013.01); *H02J 7/0052* (2013.01); *H02J 7/0086* (2013.01); *Y02T 10/7011* (2013.01)

(58) Field of Classification Search
CPC H02J 2007/0049; H02J 7/0057; H02J 7/0075
USPC ........................... 320/127, 128, 133, 139, 141
See application file for complete search history.

(56) References Cited

U.S. PATENT DOCUMENTS

| | | |
|---|---|---|
| 4,680,241 A | 7/1987 | Dyer |
| 4,829,225 A | 5/1989 | Podrazhansky et al. |
| 5,410,238 A | 4/1995 | Ishizuka et al. |
| 5,442,274 A | 8/1995 | Tamai |
| 5,500,583 A | 3/1996 | Buckley et al. |
| 5,684,386 A | 11/1997 | Okada |
| 5,747,969 A | 5/1998 | Tamai |
| 5,808,447 A | 9/1998 | Hagino |
| 5,888,665 A | 3/1999 | Bugga et al. |
| 5,900,718 A | 5/1999 | Tsenter |
| 5,905,364 A | 5/1999 | Ookita |
| 5,923,149 A | 7/1999 | Umetsu |
| 5,945,811 A | 8/1999 | Hasegawa et al. |
| 5,982,152 A | 11/1999 | Watanabe et al. |
| 5,994,875 A | 11/1999 | Lee |
| 6,040,685 A | 3/2000 | Tsenter et al. |
| 6,043,631 A | 3/2000 | Tsenter |
| 6,074,771 A | 6/2000 | Cubukcu et al. |
| 6,094,033 A | 7/2000 | Ding et al. |
| 6,097,172 A | 8/2000 | Podrazhansky et al. |
| 6,127,804 A | 10/2000 | Oglesbee et al. |
| 6,127,809 A | 10/2000 | Kates et al. |
| 6,137,265 A | 10/2000 | Cummings et al. |
| 6,144,187 A | 11/2000 | Bryson |
| 6,154,011 A | 11/2000 | Lam et al. |
| 6,194,867 B1 | 2/2001 | Cummings et al. |
| 6,204,634 B1 | 3/2001 | Zimmerman et al. |
| 6,215,281 B1 | 4/2001 | Koch |
| 6,259,231 B1 | 7/2001 | Hansen |

(Continued)

FOREIGN PATENT DOCUMENTS

| | | |
|---|---|---|
| CN | 1985183 A | 6/2007 |
| EP | 1 191 622 A1 | 3/2002 |
| WO | WO 00/13288 | 3/2000 |
| WO | WO 00/75678 | 12/2000 |
| WO | WO 02/21149 | 3/2002 |
| WO | WO 02/21662 | 3/2002 |
| WO | WO 02/41466 | 5/2002 |

(Continued)

OTHER PUBLICATIONS

U.S. Appl. No. 61/044,160, filed Apr. 11, 2008, Greening et al.

(Continued)

*Primary Examiner* — Edward Tso
(74) *Attorney, Agent, or Firm* — Weaver Austin Villeneuve & Sampson LLP

(57) ABSTRACT

The present inventions, in one aspect, are directed to techniques and/or circuitry to adaptively charge a battery/cell using data which is representative of a change in terminal voltage of the battery/cell. In another aspect, the present inventions are directed to techniques and/or circuitry to adaptively charge a battery/cell using data which is representative of partial and/or full relaxation time of the battery/cell. In yet another aspect the present inventions are directed to techniques and/or circuitry to determine whether the data which is representative of partial and/or full relaxation time exceeds a predetermined range and/or is greater than a predetermined value.

19 Claims, 33 Drawing Sheets

(56) References Cited

U.S. PATENT DOCUMENTS

| | | |
|---|---|---|
| 6,262,577 B1 | 7/2001 | Nakao et al. |
| 6,307,353 B1 | 10/2001 | Shiojima |
| 6,313,605 B1 | 11/2001 | Tsenter |
| 6,362,598 B2 | 3/2002 | Laig-Horstebrock et al. |
| 6,366,056 B1 | 4/2002 | Podrazhansky et al. |
| 6,377,028 B1 | 4/2002 | Armstrong, II et al. |
| 6,441,585 B1 | 8/2002 | Bertness |
| 6,441,586 B1 | 8/2002 | Tate, Jr. et al. |
| 6,469,471 B1 | 10/2002 | Anbuky et al. |
| 6,532,425 B1 | 3/2003 | Boost et al. |
| 6,630,814 B2 | 10/2003 | Ptasinski et al. |
| 6,631,293 B2 | 10/2003 | Lyden |
| 6,646,419 B1 | 11/2003 | Ying |
| 6,707,272 B1 | 3/2004 | Thandiwe |
| 6,789,026 B2 | 9/2004 | Barsoukov et al. |
| 6,832,171 B2 | 12/2004 | Barsoukov et al. |
| 6,833,686 B2 | 12/2004 | Veselic et al. |
| 6,841,974 B2 | 1/2005 | Dykeman |
| 6,892,148 B2 | 5/2005 | Barsoukov et al. |
| 6,924,622 B1 | 8/2005 | Anbuky et al. |
| 7,005,830 B2 | 2/2006 | Moore et al. |
| 7,034,503 B2 | 4/2006 | Veselic et al. |
| 7,072,871 B1 | 7/2006 | Tinnemeyer |
| 7,180,298 B2 | 2/2007 | Nakamura et al. |
| 7,199,557 B2 | 4/2007 | Anbuky et al. |
| 7,205,748 B2 | 4/2007 | Nishida et al. |
| 7,227,336 B1 | 6/2007 | van Schalkwijk et al. |
| 7,245,107 B2 | 7/2007 | Moore et al. |
| 7,248,023 B2 | 7/2007 | Takezawa et al. |
| 7,324,902 B2 | 1/2008 | Verbrugge et al. |
| 7,362,074 B2 | 4/2008 | Iwane et al. |
| 7,402,980 B2 | 7/2008 | Al-Anbuky et al. |
| 7,492,130 B2 | 2/2009 | Daboussi |
| 7,557,541 B2 | 7/2009 | Marinka-Tóth et al. |
| 7,570,015 B2 | 8/2009 | Bansal et al. |
| 7,595,611 B2 | 9/2009 | Reynier et al. |
| 7,626,394 B2 | 12/2009 | Kimura et al. |
| 7,737,665 B2 | 6/2010 | Grewe et al. |
| 7,772,804 B2 | 8/2010 | Bhardwaj et al. |
| 7,788,052 B2 | 8/2010 | Iwane et al. |
| 8,040,106 B2 | 10/2011 | Ishikawa |
| 8,350,531 B2 | 1/2013 | Morimoto et al. |
| 8,368,357 B2 | 2/2013 | Ghantous et al. |
| 8,427,112 B2 | 4/2013 | Ghantous et al. |
| 8,513,921 B2 | 8/2013 | Berkowitz et al. |
| 8,638,070 B2 | 1/2014 | Maluf et al. |
| 8,791,669 B2 | 7/2014 | Ghantous et al. |
| 8,970,178 B2 | 3/2015 | Berkowitz et al. |
| 8,975,874 B2 * | 3/2015 | Berkowitz ............ H02J 7/0052 320/141 |
| 9,035,621 B2 | 5/2015 | Berkowitz et al. |
| 9,035,623 B1 | 5/2015 | Berkowitz et al. |
| 9,063,018 B1 | 6/2015 | Ghantous et al. |
| 9,121,910 B2 | 9/2015 | Maluf et al. |
| 9,142,994 B2 | 9/2015 | Berkowitz et al. |
| 2001/0011881 A1 | 8/2001 | Emori et al. |
| 2001/0017243 A1 | 8/2001 | Tajima et al. |
| 2002/0001745 A1 | 1/2002 | Gartstein et al. |
| 2002/0070706 A1 | 6/2002 | Champlin |
| 2002/0075003 A1 | 6/2002 | Fridman et al. |
| 2002/0109504 A1 | 8/2002 | Champlin |
| 2002/0117997 A1 | 8/2002 | Feil et al. |
| 2003/0003363 A1 | 1/2003 | Daido et al. |
| 2003/0206021 A1 | 11/2003 | Laletin et al. |
| 2004/0032237 A1 | 2/2004 | Dykeman |
| 2004/0038087 A1 | 2/2004 | Shiue et al. |
| 2005/0156577 A1 | 7/2005 | Sully |
| 2005/0189948 A1 | 9/2005 | Koch |
| 2005/0194938 A1 | 9/2005 | Sanpei |
| 2005/0214646 A1 | 9/2005 | Kubota |
| 2005/0248314 A1 | 11/2005 | James |
| 2005/0264263 A1 | 12/2005 | Tsenter |
| 2006/0001406 A1 | 1/2006 | Matan |
| 2006/0093894 A1 | 5/2006 | Scott et al. |
| 2006/0145658 A1 | 7/2006 | Wang |
| 2006/0186890 A1 | 8/2006 | Iwane et al. |
| 2006/0208701 A1 | 9/2006 | Mikhaylik |
| 2006/0238168 A1 | 10/2006 | Matsuo et al. |
| 2007/0132456 A1 | 6/2007 | Salman et al. |
| 2007/0170890 A1 | 7/2007 | Fee et al. |
| 2007/0216359 A1 | 9/2007 | Arai et al. |
| 2007/0229034 A1 | 10/2007 | Tatebayashi et al. |
| 2007/0236225 A1 | 10/2007 | Tsenter et al. |
| 2007/0257681 A1 | 11/2007 | Christophersen et al. |
| 2008/0003490 A1 | 1/2008 | Christensen et al. |
| 2008/0079397 A1 | 4/2008 | Fee et al. |
| 2008/0211459 A1 | 9/2008 | Choi |
| 2009/0027006 A1 | 1/2009 | Vezzini et al. |
| 2009/0027007 A1 | 1/2009 | Iwane et al. |
| 2009/0027056 A1 | 1/2009 | Huang et al. |
| 2009/0195214 A1 | 8/2009 | Gehrke et al. |
| 2009/0212626 A1 | 8/2009 | Snyder et al. |
| 2009/0256528 A1 | 10/2009 | Greening et al. |
| 2009/0259420 A1 | 10/2009 | Greening et al. |
| 2009/0273320 A1 | 11/2009 | Ungar et al. |
| 2009/0295337 A1 | 12/2009 | Ishikawa |
| 2009/0325056 A1 | 12/2009 | Greening et al. |
| 2009/0326842 A1 | 12/2009 | Thomas-Alyea |
| 2010/0000809 A1 | 1/2010 | Nishi et al. |
| 2010/0039116 A1 | 2/2010 | Tsenter et al. |
| 2010/0060240 A1 | 3/2010 | Karoui et al. |
| 2010/0066310 A1 | 3/2010 | Biggs, Jr. |
| 2010/0072955 A1 | 3/2010 | Ishikawa |
| 2010/0085022 A1 | 4/2010 | Shimizu et al. |
| 2010/0134305 A1 | 6/2010 | Lu et al. |
| 2010/0164437 A1 | 7/2010 | McKinley et al. |
| 2010/0213901 A1 | 8/2010 | Morimoto et al. |
| 2011/0037439 A1 | 2/2011 | Bhardwaj et al. |
| 2011/0089907 A1 | 4/2011 | Bhardwaj et al. |
| 2011/0285356 A1 | 11/2011 | Maluf et al. |
| 2011/0316548 A1 | 12/2011 | Ghantous et al. |
| 2012/0025756 A1 | 2/2012 | Xu et al. |
| 2012/0032648 A1 | 2/2012 | Ghantous et al. |
| 2012/0038325 A1 | 2/2012 | Morita et al. |
| 2012/0200266 A1 | 8/2012 | Berkowitz et al. |
| 2012/0203483 A1 | 8/2012 | Ghantous et al. |
| 2012/0310565 A1 | 12/2012 | Redey |
| 2013/0154548 A1 | 6/2013 | Berkowitz et al. |
| 2014/0021959 A1 | 1/2014 | Maluf et al. |
| 2014/0079969 A1 | 3/2014 | Greening et al. |
| 2014/0084846 A1 | 3/2014 | Berkowitz et al. |
| 2014/0139192 A1 | 5/2014 | Berkowitz et al. |
| 2014/0312912 A1 | 10/2014 | Berkowitz et al. |
| 2015/0153417 A1 | 6/2015 | Maluf et al. |
| 2015/0155734 A1 | 6/2015 | Ghantous et al. |
| 2015/0219722 A1 | 8/2015 | Maluf et al. |
| 2015/0357841 A1 | 12/2015 | Berkowitz et al. |
| 2015/0377976 A1 | 12/2015 | Maluf et al. |

FOREIGN PATENT DOCUMENTS

| | | |
|---|---|---|
| WO | WO 02/093712 | 11/2002 |
| WO | WO 03/107505 | 12/2003 |
| WO | WO 2004/017485 | 2/2004 |
| WO | WO 2004/109311 | 12/2004 |
| WO | WO 2005/003800 | 1/2005 |
| WO | WO 2005/101042 | 10/2005 |
| WO | WO 2005/114808 | 12/2005 |
| WO | WO 2006/057468 | 6/2006 |
| WO | WO 2007/004098 | 1/2007 |
| WO | WO 2008/117239 | 10/2008 |
| WO | WO 2008/128429 | 10/2008 |
| WO | WO 2009/025944 | 2/2009 |
| WO | WO 2009/126734 | 10/2009 |
| WO | WO 2009/126797 | 10/2009 |
| WO | WO 2010/096180 | 8/2010 |
| WO | WO 2011/146783 | 11/2011 |
| WO | WO 2012/135148 | 10/2012 |

OTHER PUBLICATIONS

U.S. Appl. No. 61/089,246, filed Aug. 15, 2008, Greening et al.
U.S. Appl. No. 14/252,422, filed Apr. 14, 2014, Berkowitz et al.
U.S. Appl. No. 14/712,068, filed May 14, 2015, Ghantous et al.

(56) References Cited

OTHER PUBLICATIONS

U.S. Appl. No. 14/752,592, filed Jun. 26, 2015, Maluf et al.
U.S. Appl. No. 14/828,235, filed Aug. 17, 2015, Berkowitz et al.
US Office Action dated Jun. 18, 2013 issued in U.S. Appl. No. 13/111,902.
US Notice of Allowance dated Sep. 12, 2013 issued in U.S. Appl. No. 13/111,902.
US Office Action dated Sep. 30, 2014 issued in U.S. Appl. No. 14/161,755.
US Notice of Allowance dated Nov. 10, 2014 issued in U.S. Appl. No. 14/161,755.
US Notice of Allowance [Corrected Notice of Allowability] dated Jan. 22, 2015 issued in U.S. Appl. No. 14/161,755.
US Office Action dated Oct. 23, 2013 issued in U.S. Appl. No. 13/167,782.
US Notice of Allowance dated Mar. 27, 2014 issued in U.S. Appl. No. 13/167,782.
US Office Action dated Jun. 26, 2012 issued in U.S. Appl. No. 13/271,340.
US Final Office Action dated Nov. 7, 2012 issued in U.S. Appl. No. 13/271,340.
US Notice of Allowance dated Jan. 25, 2013 issued in U.S. Appl. No. 13/271,340.
US Office Action dated Mar. 28, 2012 issued in U.S. Appl. No. 13/271,910.
US Notice of Allowance dated Oct. 5, 2012 issued in U.S. Appl. No. 13/271,910.
US Office Action dated Apr. 24, 2013 issued in U.S. Appl. No. 13/767,839.
US Notice of Allowance dated May 14, 2013 issued in U.S. Appl. No. 13/767,839.
US Notice of Allowance dated Jan. 9, 2015 issued in U.S. Appl. No. 14/322,863.
US Notice of Allowance dated Oct. 23, 2014 issued in U.S. Appl. No. 13/366,352.
US Notice of Allowance dated Mar. 27, 2015 issued in U.S. Appl. No. 14/003,826.
US Office Action dated Dec. 9, 2014 issued in U.S. Appl. No. 13/626,605.
US Notice of Allowance dated May 20, 2015 issued in U.S. Appl. No. 13/626,605.
US Notice of Allowance dated Mar. 3, 2015 issued in U.S. Appl. No. 13/657,841.
US Office Action dated Jun. 19, 2013 issued in U.S. Appl. No. 13/747,914.
US Final Office Action dated Nov. 8, 2013 issued in U.S. Appl. No. 13/747,914.
US Notice of Allowance dated Jan. 21, 2015 issued in U.S. Appl. No. 13/747,914.
US Office Action dated Jul. 3, 2014 issued in U.S. Appl. No. 14/252,422.
US Final Office Action dated Dec. 30, 2014 issued in U.S. Appl. No. 14/252,422.
US Office Action dated Aug. 27, 2015 issued in U.S. Appl. No. 14/252,422.
PCT International Search Report and Written Opinion, dated Jul. 26, 2011, issued in PCT/US2011/037255.
PCT International Preliminary Report on Patentability, dated Dec. 6, 2012, issued in PCT/US2011/037255.
Chinese First Office Action, dated Aug. 1, 2014, issued in CN 201180025100.4.
Chinese Second Office Action, dated Apr. 16, 2015, issued in CN 201180025100.4.
PCT International Search Report and Written Opinion, dated Jul. 13, 2012, issued in PCT/US2012/030618.
PCT International Preliminary Report on Patentability and Written Opinion, dated Oct. 10, 2013, issued in PCT/US2012/030618.
Landau et al., (2005) Reduced Mass Transport Limitations by Application of Special Pulse Current modes, *J. of Electrochemical Soc.*, 152(4):J33-J39.
Landau et al., (2006) "Rapid Charging of Lithium-Ien Batteries using Pulsed Currents," *J. of Electrochemical Soc.*, 153(3):A533-A542.
Ning et al. (2004) Cycle Life Modeling of Lithium-ion Batteries, *J. of Electrochemical Soc.*, 151(10):A1584-A1591.
Ning et al. (2006) "A Generalized Cycle Life Model of Rechargeable Lithium-Ien Batteries," *Electrochimica Acta* 51:2012-2022.
Persson et al. (2010) "Lithium Diffusion in Graphitic Carbon," *J. Phys. Chern. Letters*, 1:1176-80.
Piao et al. (1999) "Intercalation of Lithium Ions into Graphite Electrodes Studied by AC Impedance Measurements," *J. of Electrochemical Soc.*, 146(8):2794-98.
Santhanagopalan et al., (2006) "Online estimation of the state of charge of a lithium ion cell," *Journal of Power Sources, Elsevier, B.V.* 161:1346-1355.
US Office Action dated Dec. 31, 2015 issued in U.S. Appl. No. 14/615,491.
US Notice of Allowance dated Mar. 1, 2016 in U.S. Appl. No. 14/615,491.
US Office Action dated May 17, 2016 in U.S. Appl. No. 14/615,486.

\* cited by examiner

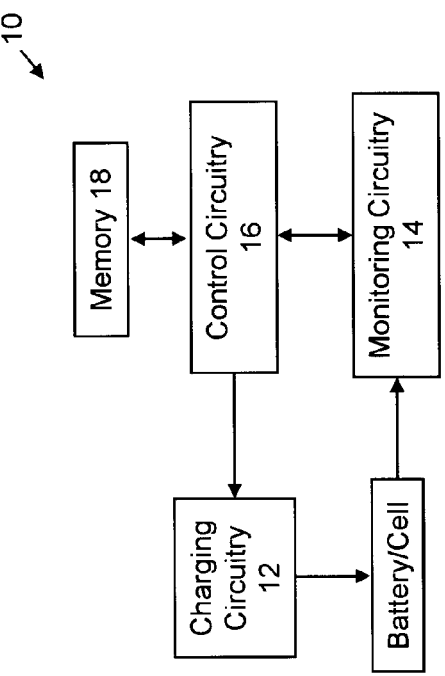
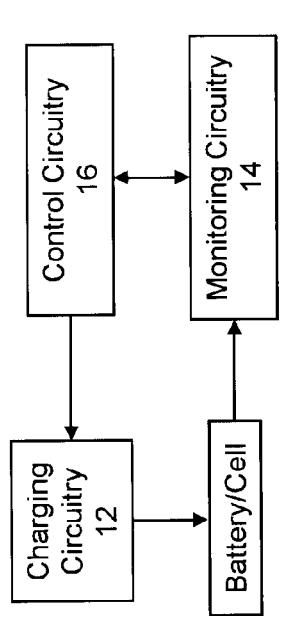
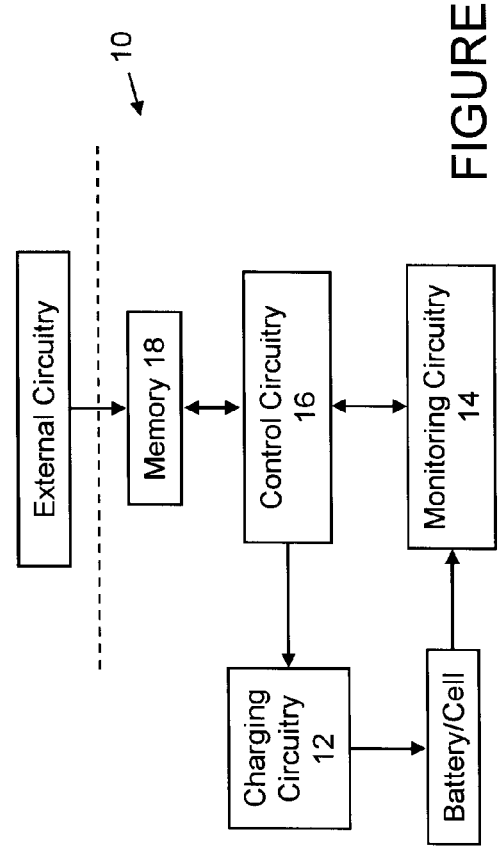
FIGURE 1A
FIGURE 1B
FIGURE 1C

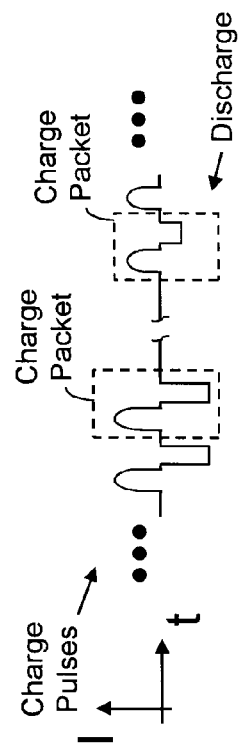
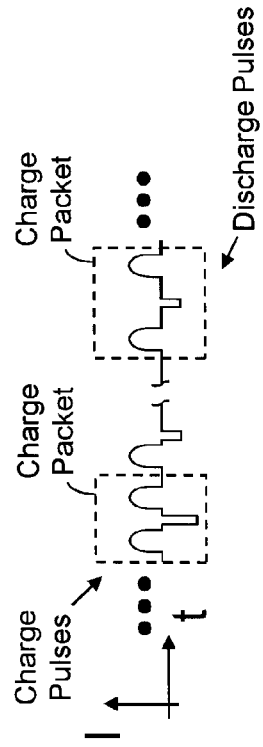
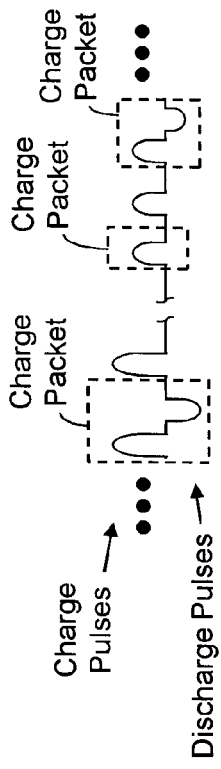
FIGURE 3A
FIGURE 3B
FIGURE 3C
FIGURE 3D
FIGURE 3E

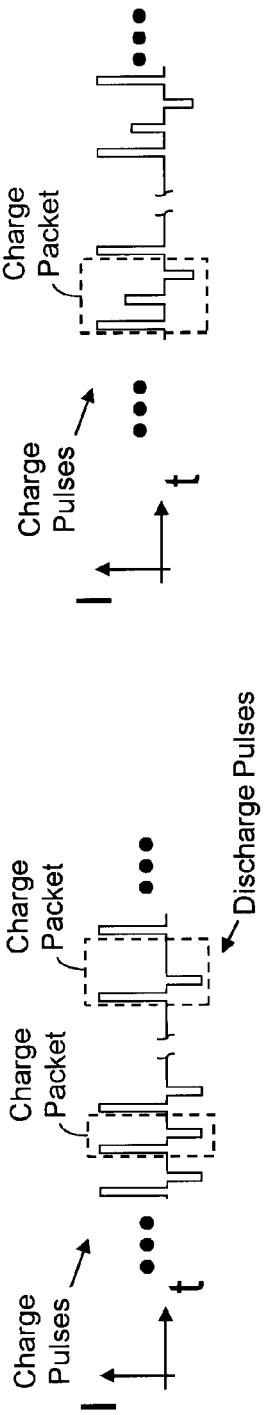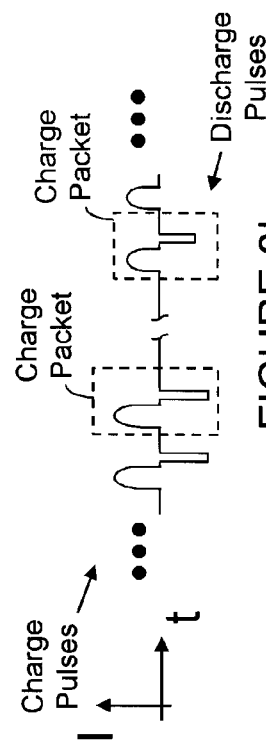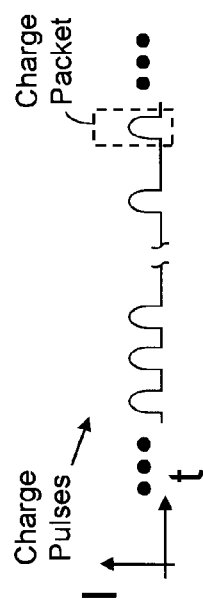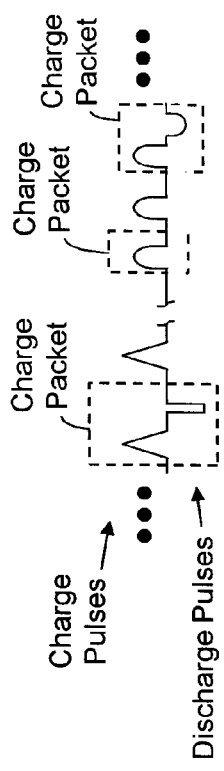

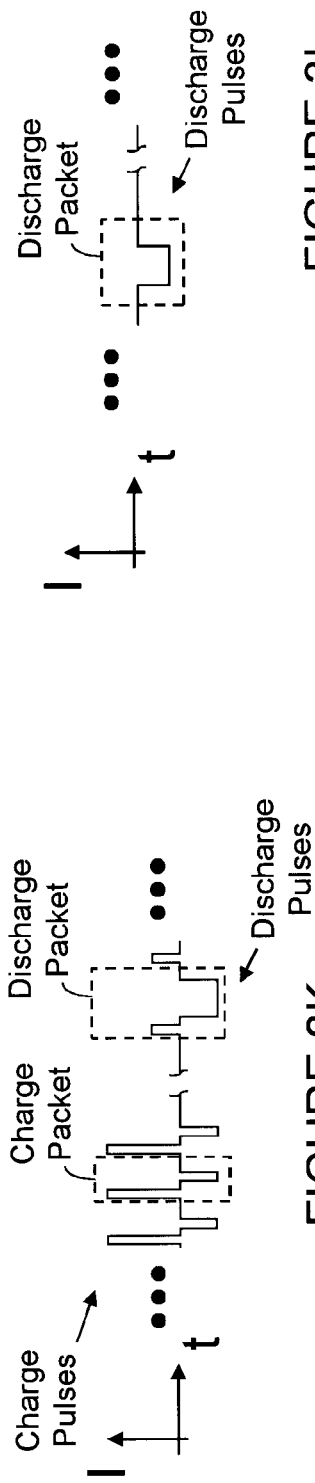
FIGURE 3K
FIGURE 3L
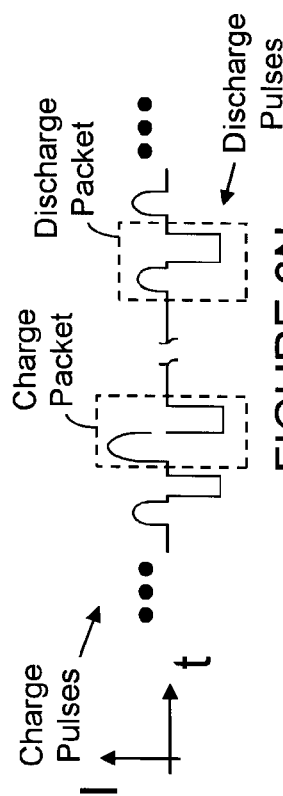
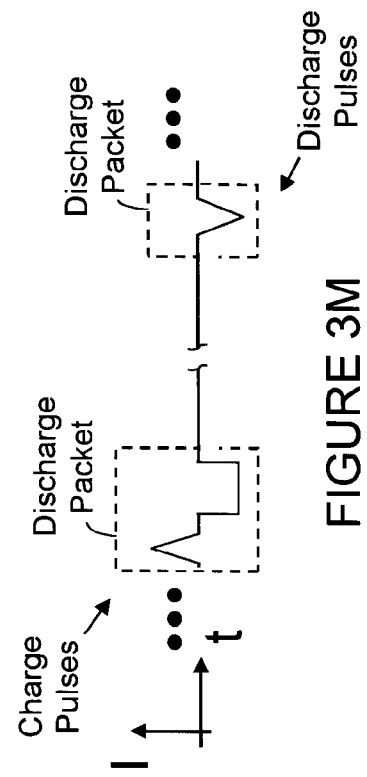
FIGURE 3M
FIGURE 3N

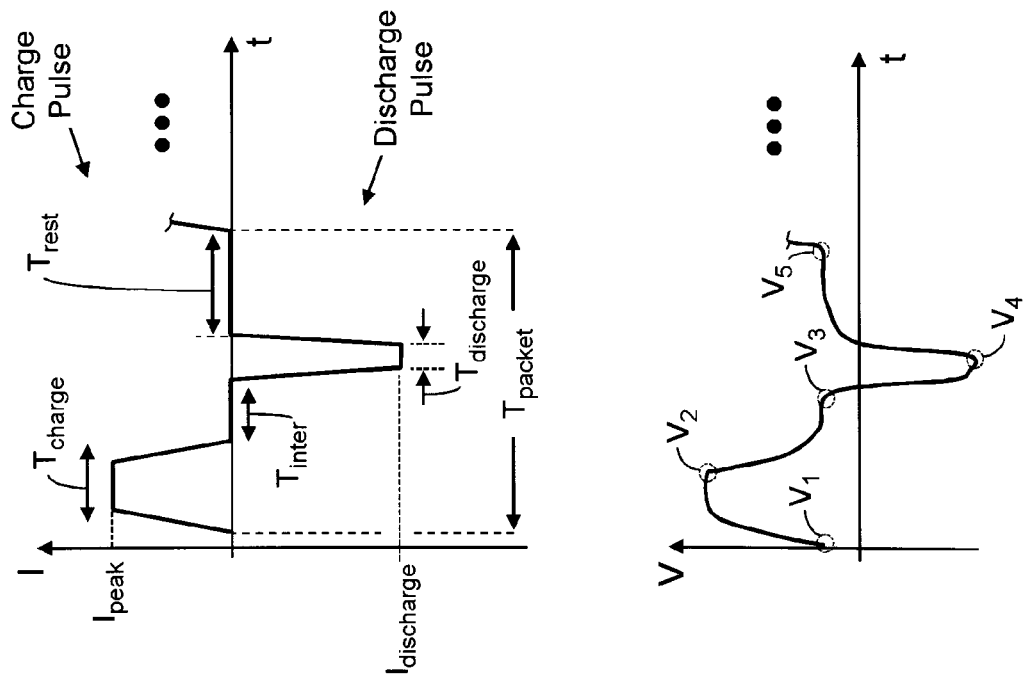
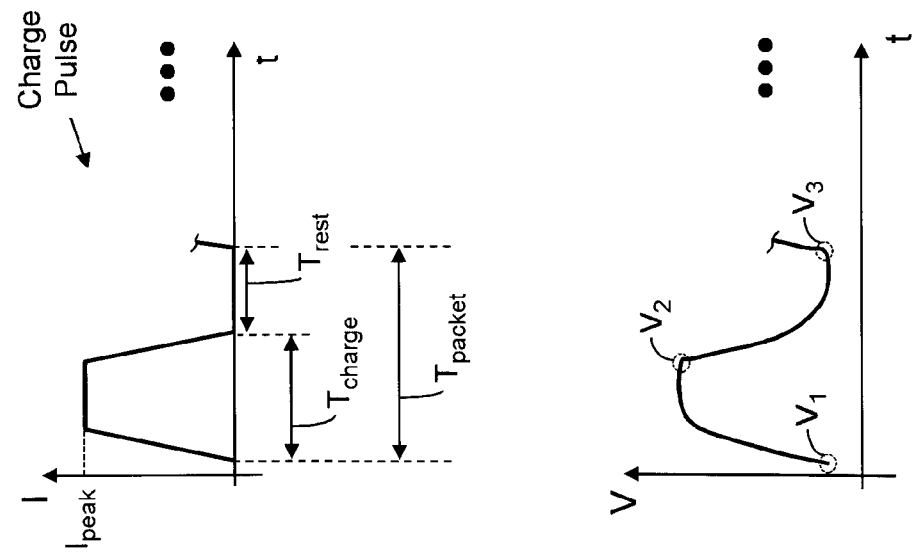
FIGURE 5B
FIGURE 5A

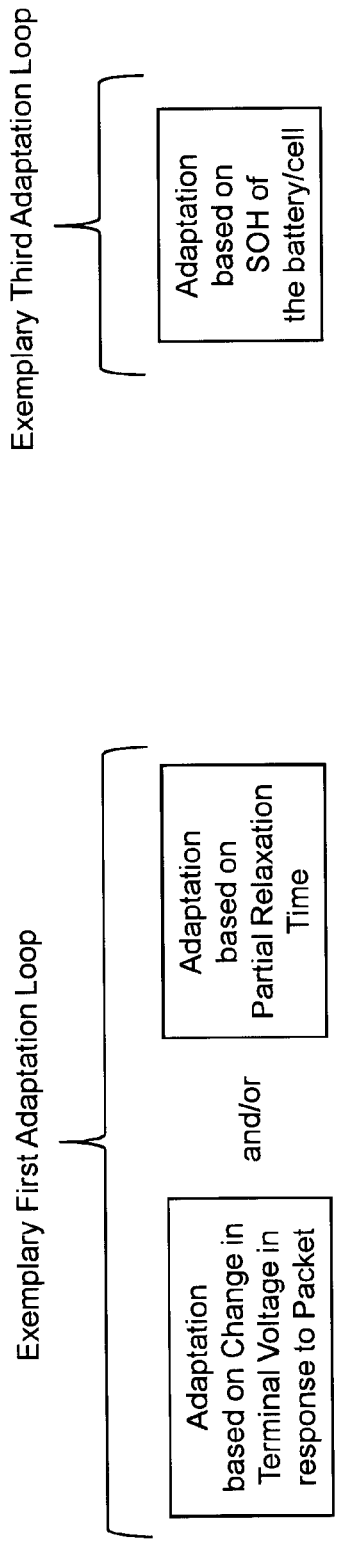
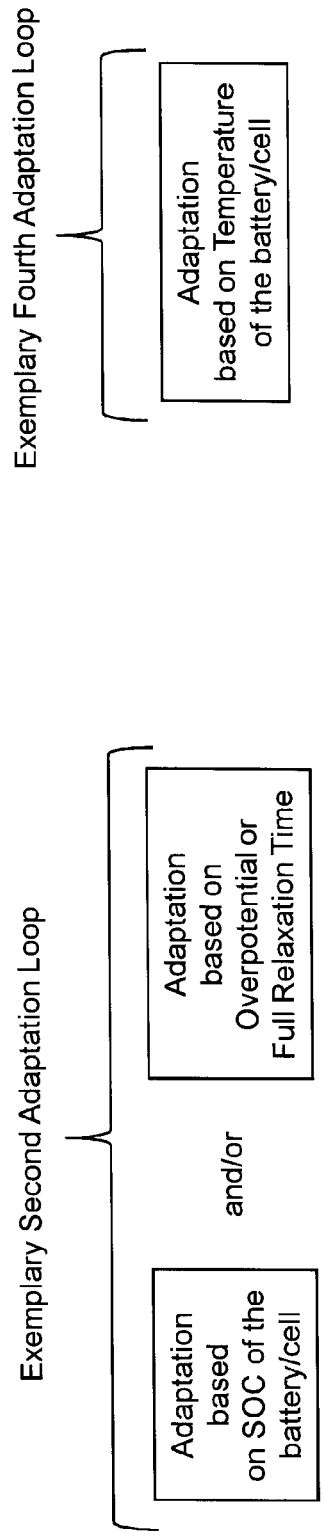
FIGURE 18C
FIGURE 18D
FIGURE 18A
FIGURE 18B

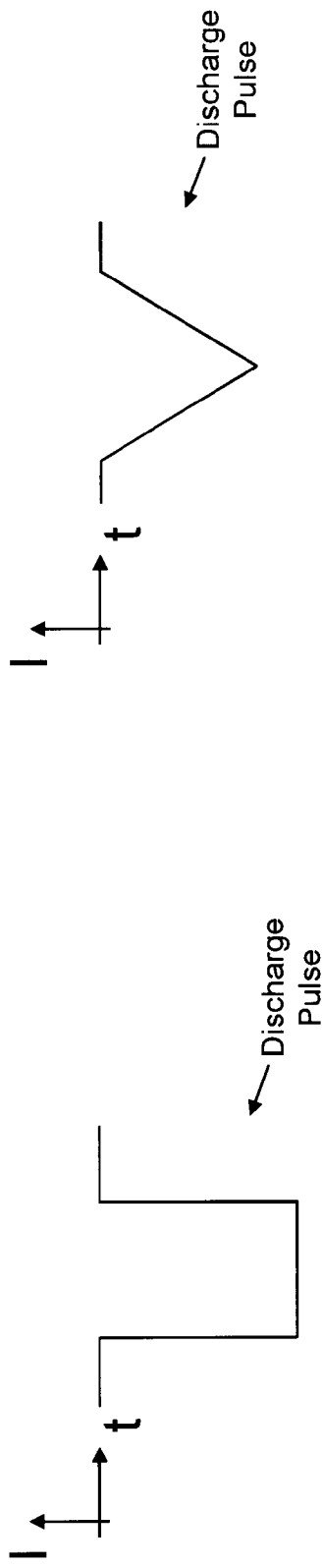
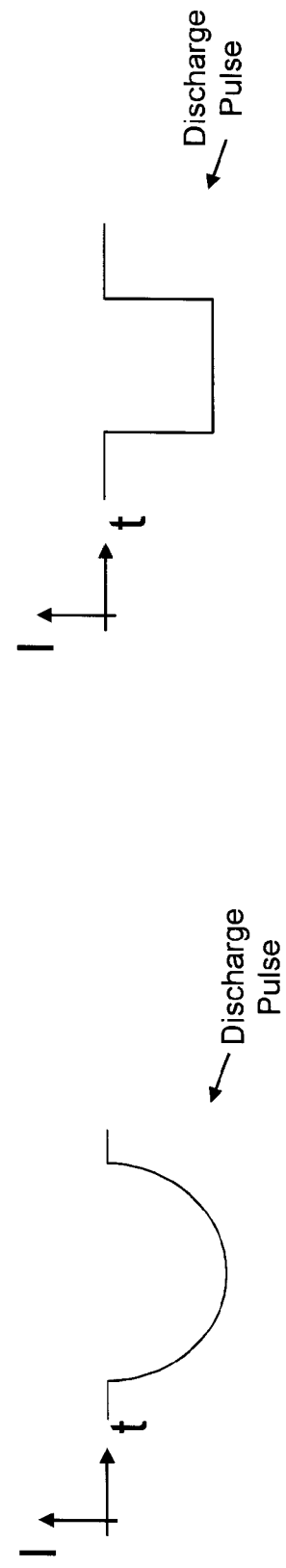
FIGURE 20A
FIGURE 20B
FIGURE 20C
FIGURE 20D

METHOD AND CIRCUITRY TO DETERMINE THE RELAXATION TIME OF A BATTERY/CELL

RELATED APPLICATIONS

This application is a continuation of U.S. application Ser. No. 14/615,491, entitled "Method and Circuitry to Adaptively Charge a Battery/Cell", filed Feb. 6, 2015, which is a continuation of U.S. application Ser. No. 14/161,755, now U.S. Pat. No. 8,975,874, entitled "Method and Circuitry to Adaptively Charge a Battery/Cell", filed Jan. 23, 2014, now U.S. Pat. No. 8,975,874, which is a continuation of U.S. application Ser. No. 13/111,902, entitled "Method and Circuitry to Adaptively Charge a Battery/Cell", filed May 19, 2011, now U.S. Pat. No. 8,638,070, which claims priority to: (1) U.S. Provisional App. Ser. No. 61/346,953, entitled "Method and Circuitry to Control the Charging of a Rechargeable Battery", filed May 21, 2010, (2) U.S. Provisional App. Ser. No. 61/358,384, entitled "Method and Circuitry to Measure the State of Charge and Impedance of a Rechargeable Battery and to Adaptively Control the Charging of Same", filed Jun. 24, 2010, (3) U.S. Provisional App. Ser. No. 61/368,158, entitled "Method and Circuitry to Adaptively Charge a Rechargeable Battery", filed Jul. 27, 2010, (4) U.S. Provisional App. Ser. No. 61/439,400, entitled "Method and Circuitry to Adaptively Charge a Battery/Cell", filed Feb. 4, 2011, and (5) U.S. Provisional App. Ser. No. 61/468,051, entitled "Method and Circuitry to Charge a Battery/Cell Using the State of Health Thereof and Measure the State of Health of a Battery/Cell", filed Mar. 27, 2011 (collectively "the Provisional Patent Applications"), each of which above-identified applications are incorporated herein by reference in their entirety.

INTRODUCTION

The present inventions relate to methods and circuitry to adaptively charge a battery/cell. In one aspect, the present inventions are directed to techniques and/or circuitry to adaptively charge a battery/cell using data which is representative of a change in terminal voltage of the battery/cell. In yet another aspect, the present inventions are directed to techniques and/or circuitry to adaptively charge a battery/cell using data which is representative of a partial relaxation time of the battery/cell. In another aspect the present inventions are directed to techniques and/or circuitry to adaptively charge a battery/cell using data which is representative of an overpotential or full relaxation time of the battery/cell. In another aspect the present inventions are directed to techniques and/or circuitry to adaptively charge a battery/cell using data which is representative of a state of charge of the battery/cell. In another aspect the present inventions are directed to techniques and/or circuitry to adaptively charge a battery/cell using data which is representative of a state of health of the battery/cell.

In one embodiment, the adaptive charging techniques and/or circuitry uses and/or employs such data, in connection with certain constraints or requirements (that will be described below) to change, adjust, control and/or vary the charging current signal(s), including the characteristics thereof (including, for example, shape of charge and/or discharge signal (if any), amplitude thereof, duration thereof, duty cycle thereof and/or rest period (if any)), applied to the terminals of the battery/cell.

In certain embodiments, two considerations in connection with implementing adaptive charging circuitry and techniques include (i) minimizing and/or reducing total charging time and (ii) maximizing and/or increasing cycle life. In this regard, for practical reasons, the battery/cell is charged within a given period of time (for example, a maximum allowed period of time). Typically, a specification value is defined or chosen depending on the application. For example, it is approximately 2 to 4 hours for batteries employed in consumer applications, and for batteries employed in transportation applications, it may be up to 8 hours. This results in a specification for a net effective average charging current over the duration of the charging period.

In addition, to maximize and/or increase cycle life of the battery/cell, it may be desirable to charge the battery/cell (i) at a lower current and/or (ii) provide rest periods between or in periods of charging (for example, between charging signals or packets) wherein no charge is applied to or injected into the battery/cell. Thus, in certain aspects, the charging circuitry of the present inventions implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

The present inventions also relate to techniques or methods of estimating, measuring, calculating, assessing and/or determining characteristics or parameters of the battery/cell including, for example, a terminal voltage (and/or changes therein) of a battery/cell, state of charge (and/or changes therein) of a battery/cell, and/or a relaxation time (and/or changes therein) of a battery/cell, a state of health (and/or changes therein) of a battery/cell. Notably, data which is representative of characteristics or parameters of the battery/cell (for example, the state of charge, relaxation time, impedance, state of health and/or terminal voltage) may be dependent on temperature. With that in mind in the discussion below, in connection with circuitry and techniques for adaptively charging a battery, it will be implicit that there may be a dependence on temperature. As such, while temperature may not be necessarily mentioned below, such data may be dependent on the temperature of the battery

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

FIGS. 1A-1C illustrate block diagram representations of exemplary adaptive charging circuitry in conjunction with a battery/cell, according to at least certain aspects of certain embodiments of the present inventions, wherein FIG. 1B includes discrete memory coupled to the control circuitry, and FIG. 1C illustrates circuitry external which accesses the memory to store one or more predetermined ranges employed by control circuitry in conjunction with adapting, adjusting and/or controlling one or more characteristics of the charge or current applied to or injected into the battery/cell so that a change in voltage at the terminals of the battery/cell in response to such charge or current is within a predetermined range and/or below a predetermined value during a charging or recharging sequence, operation or cycle;

FIGS. 3A-3N illustrate exemplary charge and/or discharge packets of the charging and discharging signals (which are exemplary illustrated in FIGS. 2A-2D), wherein such charge and discharge packets may include one or more charge pulses and one or more discharge pulses; notably, in one embodiment, each charge signal of FIGS. 2A-2D may include a plurality of packets (for example, about 100 to about 50,000 packets) and, in one embodiment, each packet may include a plurality of charge pulses, discharge pulses and rest periods; notably, the pulses may be any shape (for example, rectangular, triangle, sinusoidal or square); in one exemplary embodiment, the charge and/or discharge pulses of the packet may include a temporal duration of between about 1 ms to about 500 ms, and preferably less than 50 ms; moreover, as discussed in detail below, one, some or all of the characteristics of the charge and discharge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combination or permutations of pulse, pulse characteristics, periods, packets and signal characteristics and configurations are intended to fall within the scope of the present inventions;

FIG. 5A illustrates an exemplary charge packet having a charge pulse including a charging period ($T_{charge}$) followed by a rest period ($T_{rest}$) wherein the period of the charge packet is identified as $T_{packet}$, according to certain aspects of the present inventions; an exemplary terminal voltage response of the battery/cell to such charge packet is illustrated wherein a first voltage ($V_1$) is identified (which correlates to the beginning of the charge pulse), a second voltage ($V_2$) is identified (which correlates to the end of the charge pulse and/or the peak of the change in the terminal voltage due to the charge pulse) and a third voltage ($V_3$) is identified (which correlates to the end of the charge packet, the beginning of an immediately subsequent packet (for example, charge or discharge packet) and/or the end of the rest period of the charge packet);

FIG. 5B illustrates an exemplary charge packet having a charge pulse (which injects charge into the battery/cell) and a discharge pulse (which removes charge from the battery/cell) wherein the charge pulse includes a charging period ($T_{charge}$) and the discharge pulse includes a discharging period ($T_{discharge}$), according to certain aspects of the present inventions; notably, in this exemplary charge packet, an intermediate rest period ($T_{inter}$) is disposed between the charge and discharge pulses, and a rest period ($T_{rest}$) is disposed after the discharge pulse and before the next packet; an exemplary terminal voltage response of the battery/cell to such charge packet is illustrated wherein a first voltage ($V_1$) is identified (which correlates to the beginning of the charge pulse), a second voltage ($V_2$) is identified (which correlates to the end of the charge pulse and/or the peak of the change in the terminal voltage due to the charge pulse), a third voltage ($V_3$) is identified (which correlates to the beginning of the discharge pulse), a fourth voltage ($V_4$) is identified (which correlates to the end of the discharge pulse and/or the peak of the change in the terminal voltage due to the discharge pulse) and a fifth voltage ($V_5$) is identified (which correlates to the end of the charge packet, the beginning of an immediately subsequent packet (for example, charge or discharge packet) and/or the end of the rest period of the charge packet); notably, as discussed in detail below, one, some or all of the characteristics of the charge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combination or permutations of pulse, pulse characteristics, periods, packets and signal characteristics and configurations are intended to fall within the scope of the present inventions; moreover, discharge packets may have similar characteristics as charge packets except, however, a net charge is removed from the battery/cell; for the sake of brevity, the discussion/illustration with respect to discharge packet will not be repeated;

FIGS. 18A-18D illustrate exemplary parameters of the adaption loops including, for example, (i) a first adaption loop based on change in terminal voltage in response to one or more charge/discharge pulses (of one or more charge/discharge packets) and/or the partial relaxation time of a pulse/packet, (ii) a second adaption loop based on SOC of the battery/cell and/or full relaxation time or overpotential, (iii) a third adaption loop based on SOH (or changes therein) of the battery/cell, and (iv) a fourth adaption loop based on the temperature of the battery/cell (notably, in this embodiment, the system includes a temperature sensor to provide data which is representative of the temperature of the battery/cell);

FIGS. 20A-20D illustrate exemplary discharge pulses having different shapes and pulse widths; all combination or permutations of discharge pulse characteristics are intended to fall within the scope of the present inventions.

Figure 1D:
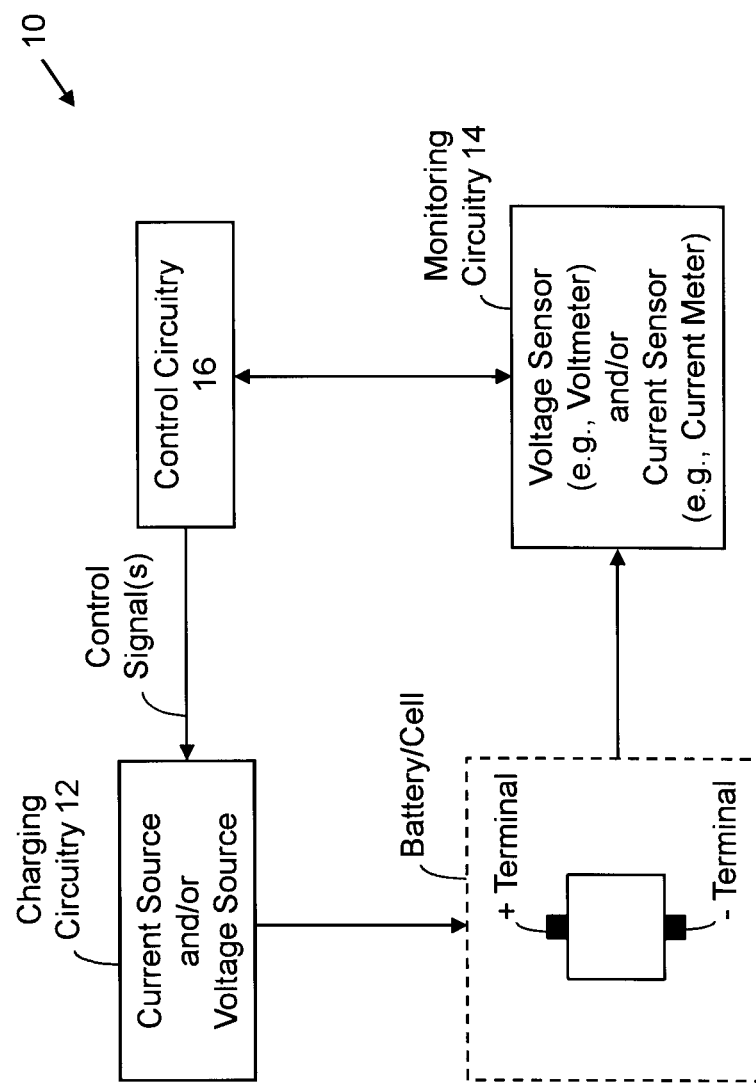
FIG. 1D illustrates, in block diagram form, exemplary adaptive charging circuitry in conjunction with a battery/cell (which may include two terminals (for example, positive and negative terminals), according to at least certain aspects of certain embodiments of the present inventions, wherein in this embodiment, the charging circuitry may include voltage source and/or current source, and the monitoring circuitry may include voltage and/or current sensors (for example, a voltmeter and/or a current meter)

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In a first aspect, the present inventions are directed to adaptive charging techniques and/or circuitry for a battery/cell wherein the charging techniques and/or circuitry adapt, adjust and/or control one or more characteristics of the charge or current applied to or injected into the battery/cell so that the change in voltage at the terminals of the battery/cell (hereinafter "terminal voltage") is within a predetermined range and/or below a predetermined value. For example, where the charging techniques and/or circuitry apply charge packets, having one or more charge pulses, to the battery/cell during a charging sequence, cycle or operation, in one embodiment, the charging techniques and/or circuitry may adapt, adjust and/or control the amplitude and/or pulse width of the charge or current pulses applied to or injected into the battery/cell by subsequent packet(s) (for example, the immediately subsequent packets) so that the change in voltage at the terminals of the battery/cell in response to such subsequent charge packet(s) is within a predetermined range and/or below a predetermined value. In this embodiment, the charging techniques and/or circuitry may adapt, adjust and/or control one or more characteristics of the charge or current applied to or injected into the battery/cell via adapting, adjusting and/or controlling the shape, amplitude and/or width of charge pulse(s) of the subsequent packet(s).

In another embodiment, the charging techniques and/or circuitry apply charge packets, having one or more charge pulses and one or more discharge pulses, to the battery/cell during a charging sequence, cycle or operation. In this embodiment, the charging techniques and/or circuitry may adapt, adjust and/or control one or more characteristics of the charge or current applied to or injected into the battery/cell (via the charge pulses) and/or one or more characteristics of the charge or current removed from the battery/cell (via the discharge pulses) so that the change in terminal voltage in response to such charge or current is within a predetermined range and/or below a predetermined value during subsequent charging (for example, the immediately subsequent packets) of a charging sequence, cycle or operation. For example, the adaptive charging techniques and/or circuitry of the present inventions may adapt, adjust and/or control shape, amplitude and/or width of charge pulse(s) and the shape, amplitude and/or width of discharge pulse(s) in a manner so that (i) a change in terminal voltage of the battery/cell due to the charge pulse(s) and (ii) a change in terminal voltage of the battery/cell due to the discharge pulse(s) are each within predetermined ranges during the charging sequence, cycle or operation. In addition thereto, or in lieu thereof, the adaptive charging techniques and/or circuitry of the present inventions may adapt, adjust and/or control shape, amplitude and/or width of charge pulse(s) and discharge pulse(s) in a manner that provides a relationship between (i) a change in terminal voltage of the battery/cell due to the charge pulse(s) of a packet and (ii) a change in terminal voltage of the battery/cell due to the discharge pulse(s) of the packet to be within a predetermined range during the charging sequence, cycle or operation. Thus, in those embodiments where the charge packet includes one or more charge and discharge pulses, the charging techniques and/or circuitry of the present inventions may adapt, adjust and/or control one or more characteristics of the charge and/or discharge to control the change in terminal voltage of the battery/cell in response to pulses so that (i) each such change is within predetermined range(s) and/or below a predetermined value(s), and/or (ii) the relationship between such changes is within a predetermined range and/or below a predetermined value.

Notably, the charging techniques and/or circuitry may adapt, adjust and/or control the characteristics of the charge or current applied to or injected into the battery/cell based on or using an averaged response of the battery/cell in connection with (i) a plurality of pulses in the packet and/or (ii) a plurality of packets. For example, where the packets include a plurality of charge pulses and/or a plurality of discharge pulses, the charging techniques and/or circuitry may employ an averaged change in voltage in connection with the plurality of charge pulses and/or a plurality of discharge pulses. In this embodiment, the charging techniques and/or circuitry of the present inventions may adapt, adjust and/or control the characteristics of the charge and discharge pulses applied to or injected into the battery/cell during subsequent packets based on or using an averaged response of the battery/cell to plurality of charge pulses and/or a plurality of discharge pulses. Thus, in one embodiment, the charging techniques and/or circuitry of the present inventions adapt, adjust and/or control the characteristics of one or more of the charge and/or discharge pulses (of subsequent packets) applied to the battery/cell based on or using the change in voltage at the terminals of the battery/cell averaged over a plurality of charge and/or discharge pulses of a preceding packet (for example, the immediately preceding) is within a predetermined range and/or below a predetermined value.

In another embodiment, the charging techniques and/or circuitry of the present inventions may adapt, adjust and/or control the amount of charge or current applied to or injected into the battery/cell by the packets so that the change in voltage at the terminals of the battery/cell averaged over a plurality of charge packet is within a predetermined range and/or below a predetermined value. Here, the charging techniques and/or circuitry may adapt, adjust and/or control the characteristics of the charge applied to or injected into the battery/cell (via, for example, adapting, adjusting and/or controlling the shape, amplitude and/or width of charge pulse(s)) when an average change in voltage at the terminals of the battery/cell in response to a plurality of charge packet is outside a predetermined range.

The charging techniques and/or circuitry of the present inventions any form of averaging. For example, the charging techniques and/or circuitry of the present inventions may average mutually exclusive groups of packets. Alternatively, the charging techniques and/or circuitry may employ a "rolling" average technique wherein the techniques and/or circuitry determine or calculate a "new" average as a change in voltage at the terminals of the battery/cell, in response to a charge packet.

The adaptive charging techniques and/or circuitry of the present inventions may intermittently, continuously and/or periodically adapt, adjust and/or control characteristics of the charge or current applied to or injected into the battery/cell in connection with maintaining the change in terminal voltage within a predetermined range. For example, in one embodiment, the adaptive charging techniques and/or circuitry intermittently, continuously and/or periodically measure or monitor the terminal voltage of the battery/cell (for example, measure or monitor the terminal voltage of the battery/cell every Nth packet (where N=1 to 10) and/or every 10-1000 ms). Based thereon or using such data, the adaptive charging techniques and/or circuitry may intermittently, continuously and/or periodically determine and/or adapt the characteristics of the charge or current injected into the battery/cell (or adapt the characteristics of the charge removed from the battery/cell in those embodiments where a discharge current is employed) so that the change in terminal voltage is within a predetermined range and/or below a predetermined value (for example, determine and/or adapt the characteristics of the charge or current injected into the battery/cell every Nth packet (where N=1 to 10) and/or every 10-1000 ms). In one embodiment, the adaptive charging techniques and/or circuitry may intermittently, continuously and/or periodically determine the terminal voltage of the battery/cell and, in response thereto or based thereon, may intermittently, continuously and/or periodically determine an amplitude and duration of subsequent charge pulses to be applied to or injected into the battery/cell (which, in one embodiment, may be charge pulses of the immediately subsequent packet(s)) so that the change in terminal voltage of the battery/cell due to such subsequent charge pulses is within a predetermined range and/or below a predetermined value.

Thus, adaptive charging techniques and/or circuitry of the present inventions may (i) measure or monitor the terminal voltage of the battery/cell on an intermittent, continuous and/or periodic basis, (ii) determine whether a change in terminal voltage (which is response to charge and discharge pulses) is within a predetermined range and/or below a predetermined value on an intermittent, continuous and/or periodic basis, and/or (iii) adapt, adjust and/or control characteristics of the charge or current signals applied to or injected into the battery/cell (for example, amplitude of the applied charge or current) so that the change in terminal voltage is within a predetermined range and/or below a predetermined value on an intermittent, continuous and/or periodic basis. For example, adaptive charging techniques and/or circuitry of the present inventions may (i) monitor, measure and/or determine the terminal voltage of the battery/cell every X packets (where X=1 to 10), (ii) determine, every Y packets (where Y=1 to 10), whether a change in terminal voltage (which is in response to charge and discharge pulses) is within a predetermined range and/or below a predetermined value, and/or (iii) adapt, adjust and/or control characteristics of the charge or current signals applied to or injected into the battery/cell, every Z packets (where Z=1 to 10), so that the change in terminal voltage is within a predetermined range and/or below a predetermined value. All permutations and combinations are intended to fall within the scope of the present inventions. Indeed, such embodiments are applicable to the charging techniques and/or circuitry which apply or inject (i) charge packets having one or more charge pulses and (ii) charge packets having one or more charge pulses and one or more discharge pulses.

Notably, the predetermined range may be fixed or may change, for example, over time or use. The predetermined range may change based on one or more conditions or states of the battery/cell. In addition thereto, or in lieu thereof, the predetermined range may change based on one or more responses of the battery/cell to or during the charging process.

In one embodiment, the predetermined range is based on empirical data, test data, simulation data, theoretical data and/or a mathematical relationship. For example, based on empirical data, the adaptive charging techniques and/or circuitry associated with a given battery/cell (for example, a certain series, manufacturing lot, chemistry and/or design) may determine, calculate and/or employ a predetermined range as well as changes therein. Again, such changes may (i) in fixed, (ii) based on one or more conditions or states of the battery/cell, and/or (iii) based on one or more responses of the battery/cell to or during the charging process.

Thus, in one embodiment, the predetermined range may change based on, for example, a condition or state of the battery/cell and/or response of the battery/cell to the charging processes. For example, the predetermined range may depend on one or more parameters of the battery/cell including, for example, the state of charge (SOC) of the battery, the state of health (SOH), overpotential or full relaxation time (relative to full or complete equilibrium of the battery/cell) and/or relaxation time (to partial-equilibrium of the battery/cell). Here, the circuitry and/or techniques of the present inventions may adjust, change and/or adapt the predetermined range employed to determine whether a change in terminal voltage (which is response to charge and/or discharge pulses) is within a predetermined range and/or below a predetermined value based on or using data which is representative of the SOC of the battery/cell, the SOH of the battery/cell, overpotential and/or relaxation time.

Notably, the SOC of a battery/cell, for example, a lithium-ion rechargeable battery/cell, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a zero reading indicates that the battery/cell is fully discharged. The SOH of a rechargeable battery/cell (for example, a rechargeable lithium-ion battery/cell, is a parameter that describes, characterizes and/or is representative of the "age" of the battery/cell, the degradation levels of the battery/cell and/or an ability of the battery/cell to hold charge, for example, relative to a given time in operation (for example, the initial time in operation). The SOH of a battery/cell provides information to estimate, calculate, measure and/or determine other battery/cell parameters, for example, the SOC and the voltage of the battery. Indeed, the terminal voltage of the battery/cell changes as the SOH changes—and, hence the voltage curves of the battery/cell tend to shift as the battery/cell ages and as the battery/cell SOH deteriorates.

In one embodiment, based on or using initialization, characterization and/or calibration data, the adaptive charging techniques and/or circuitry of the present inventions may calculate or determine an initial predetermined range or set of predetermined ranges for the particular battery/cell. For example, in one embodiment, based on or using (i) initialization, characterization and/or calibration data and (ii) empirical data, test data, simulation data, theoretical data and/or a mathematical relationship, the adaptive charging techniques and/or circuitry of the present inventions may calculate or determine one or more predetermined ranges for a particular or associated battery/cell. Indeed, in one embodiment, the adaptive charging techniques and/or circuitry of the present inventions, based on or using (i) initialization, characterization and/or calibration data and (ii) empirical data, test data, simulation data, theoretical data and/or a mathematical relationship, may calculate or determine a pattern or relationship of the change of the predetermined range over time/use (for example, (i) change based on one or more conditions or states of the battery/cell, (ii) change based on one or more responses of the battery/cell to or during the charging processes).

Determination or calculation of a predetermined range or set of predetermined ranges may also employ data which is representative of a series, manufacturing lot, chemistry and/or design of the battery/cell. In one embodiment, based on empirical data, test data, simulation data, theoretical data and/or a mathematical relationship in conjunction with data which is representative of a series, manufacturing lot, chemistry and/or design of the battery/cell, one or more predetermined ranges time/use may be determined or calculated. In addition, one or more changes to such predetermined ranges (which may be based on one or more conditions or states of the battery/cell and/or responses of the battery/cell to or during the charging processes) may be determined or calculated. In yet another embodiment, a predetermined range or set of predetermined ranges may be determined or calculated for a given battery/cell based on or using (i) the battery/cell response to an initialization, characterization and/or calibration signals or sequence, and (ii) empirical data, which may, for example, be developed based on a certain series, manufacturing lot, chemistry and/or design. Notably, data which is representative of a predetermined range or set of predetermined ranges may be stored in memory, coupled to the battery/cell, for use by the adaptive charging techniques and/or circuitry of the present inventions.

As indicated above, in one embodiment, an initial predetermined range or set of predetermined ranges for a particular battery/cell may be based on or using initialization, characterization or calibration data of the battery/cell. The initialization, characterization and/or calibration data may be representative of the response of the battery/cell to a characterization sequence. In one embodiment, the characterization sequence may apply charge signals to the battery/cell. Thereafter, the adaptive charging techniques and/or circuitry may evaluate the response to such signals by the battery/cell. Based thereon, the adaptive charging techniques and/or circuitry may calculate or determine predetermined ranges for the particular battery/cell. Such initialization, characterization or calibration data may be obtained, acquired and/or determined, for example, at manufacture, test or calibration which may include the characterization sequence to obtain "unique" data regarding a given battery/cell.

Briefly, the initialization, characterization or calibration sequences may seek to establish values for certain of the predetermined limits and ranges discussed herein. In one embodiment, the initialization, characterization or calibration sequences measure the change in terminal voltage in response to charge and/or discharge packets (having charge and/or discharge pulses) for new cells/batteries over the full range of SOC. In a second embodiment, these values are used to cycle cells/batteries, and correlation data or tables are generated to correlate these change in terminal voltage with the capacity fade of the cells/batteries, and consequently with cycle life. Different values may be used on different cells to create more complete correlation relationships between changes in terminal voltage values or ranges and capacity fade. Additionally, the change in terminal voltage values or ranges may be correlated using physical models to the transport of lithium-ions, such as solving Fick's law and current transport law within the battery/cell.

Notably, the predetermined range or ranges may be calculated or determined by the adaptive circuitry and/or processes of the present inventions or by other circuitry and processes (for example, circuitry which is "off-device", "off-chip" or separate from the circuitry of the present inventions). The predetermined range or ranges may be stored in memory (for example, in a database or look-up table) during manufacture, test or calibration, and accessible to the adaptive circuitry and/or processes of the present inventions during operation.

As noted above, the predetermined ranges may change relative to initial predetermined ranges in a predetermined manner (for example, in a fixed relationship over time/use—which may be based on or using empirical data, test data, simulation data, theoretical data and/or a mathematical relationship). In addition thereto, or in lieu thereof, such predetermined ranges may depend on considerations such as the state or status of one or more parameters of the battery/cell including, for example, the SOC, the SOH and/or temperature of the battery/cell. Notably, where one of such parameters is temperature, the system may include a temperature sensor (thermally coupled to the battery/cell) to provide data which is representative of the temperature of the battery/cell.

For example, in one embodiment, the predetermined ranges depend on the SOC of the battery/cell. In this regard, the adaptive charging circuitry and techniques may apply or inject a higher current or charge into the battery/cell when the SOC of the battery/cell is low and a lower current or charge when the SOC of the battery/cell is high. Here, when an electrical current charges a lithium-ion cell, lithium ions move from the cathode across the electrolyte and diffuse into the grains of the anode. Thus, at a low SOC, the diffusion rate of lithium ions into the anode can be faster than the diffusion rate at a high SOC. The difference in diffusion rate can vary substantially. Additionally, it may be beneficial to use a higher charging current when the impedance (in particular, the real part thereof, which is representative of the resistance that the battery/cell exhibits to an applied electrical current) is low and a lower charging current when the impedance is high. Therefore, in one embodiment, the adaptive charging algorithm or technique tailors, changes and/or adjusts the charging current to control, manage and/or reduce the change in voltage in response to such charging current.

Notably, as the charging techniques and/or circuitry adapts, adjusts and/or controls one or more characteristics of the charge or current applied to or injected into the battery/cell so that the change in terminal voltage in response to subsequent charging is within a predetermined range and/or below a predetermined value may impact the net effective charge rate. That is, the net effective charge rate may be adjusted and/or controlled by way of adjusting and/or controlling one or more characteristics of the charge or charging signal during a given charging period including, for example, the amplitude of the current charge or charging signal, the shape of the charge or charging signal (for example, triangular, rectangular, sawtooth and/or square waves), the duration or width of the current charge or charging signal, the frequency of the charge or charging signal and/or the duty cycle of the charge or charging signal. However, the charging techniques and/or circuitry may calculate, determine and/or estimate a peak amplitude and/or duration of the current pulse(s) (for a given pulse shape—for example, rectangular, triangle, sinusoidal or square current pulses) and responsively control the charging to minimize and/or reduce the temporal duration of the overall charge sequence, cycle or operation. Indeed, the charging techniques and/or circuitry may apply or inject less than a maximum charge (without the responsive terminal voltage of the battery/cell attaining predetermined range) into the battery/cell during one or more portions of the charging sequence, cycle or operation. Under this circumstance, the temporal duration of the overall charging sequence, cycle or operation may likely increase.

The predetermined range or ranges may be stored in permanent, semi-permanent or temporary memory. In this regard, the memory may store data, equations, relationships, database and/or look-up table in a permanent, semi-permanent or temporary (for example, until re-programmed) memory of any kind or type (for example, EEPROM, Flash, DRAM and/or SRAM). Moreover, the memory may be discrete or resident on (i.e., integrated in) other circuitry of the present inventions (for example, control circuitry). In one embodiment, the memory may be one-time programmable, and/or the data, equations, relationships, database and/or look-up table of the predetermined range(s) may be stored in a one-time programmable memory (for example, programmed during test or at manufacture). In another embodiment, the memory is more than one-time programmable and, as such, the predetermined range(s) may be updated, written, re-written and/or modified after initial storage (for example, after test and/or manufacture) via external or internal circuitry.

It should be noted that, in certain embodiments, two considerations in connection with implementing the adaptive charging circuitry and techniques of the present inventions are to:

i. Minimize and/or reduce total charging time: For practical reasons, the battery/cell is charged within a given period of time (for example, a maximum allowed period of time). Typically, a specification value is defined or chosen depending on the application. For example, it is approximately 2 to 4 hours for batteries employed in consumer applications, and for batteries employed in transportation applications, it may be up to 8 hours. This results in a specification for a net effective charging current; and ii. Maximize and/or increase cycle life: To maximize and/or increase cycle life of the battery/cell, it may be desirable to charge the battery/cell (i) at a low current and/or (ii) provide rest periods between or in periods of charging (for example, between charging signals or packets) wherein no charge is applied to or injected into the battery/cell.

Thus, in certain aspects, the charging circuitry of the present inventions implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

Figure 2A:
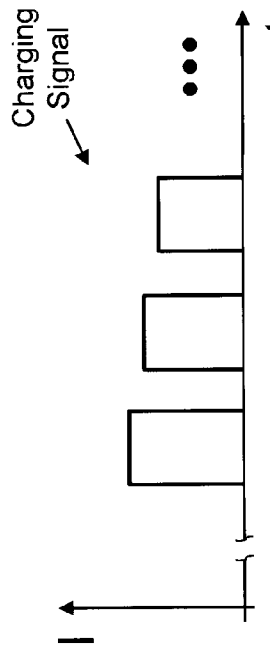
FIGS. 2A-2D illustrate exemplary waveforms illustrating a plurality of exemplary charging signals and discharging signals of an exemplary charging technique, wherein such charging signals may generally decrease according to a predetermined rate and/or pattern (for example, asymptotically, linearly or quadratically) as the terminal voltage of the battery/cell increases during a charging or recharging sequence, operation or cycle (see, FIGS. 2B and 2D); notably, a charging or recharging sequence, operation or cycle may include charging signals (which, in total, inject or apply charge into the battery/cell) and discharging signals (which, in total, remove charge from the battery/cell)
Figure 2B:
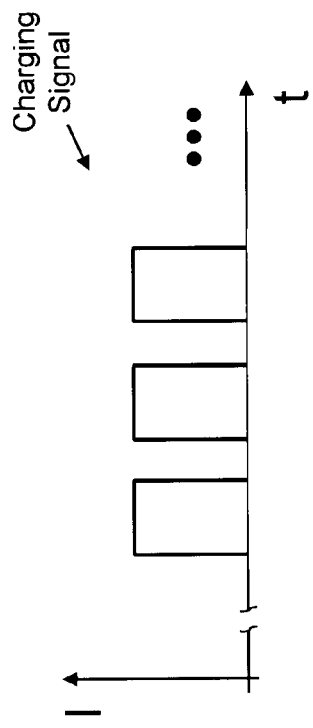
Figure 2C:
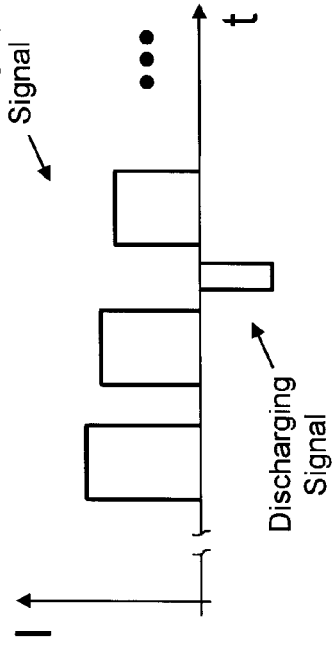
Figure 2D:
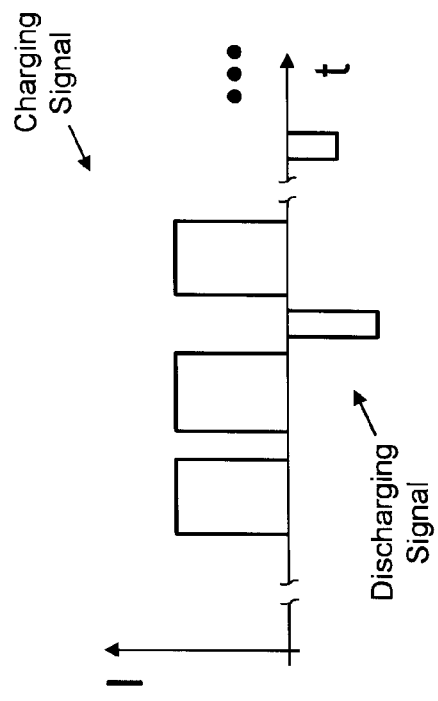

With reference to FIG. 1A, in one exemplary embodiment, the adaptive charging circuitry 10 for a battery/cell includes charging circuitry 12, monitoring circuitry 14 and control circuitry 16 which implements one or more of the adaptive charging techniques described herein. Briefly, in one embodiment, charging circuitry 12 responsively applies one or more current or charging signal to the battery/cell. (See, for example, FIGS. 2A and 2B). The charging circuitry 12 may also apply one or more charging signals (which provide a net input of charge or current into the battery/cell) and one or more discharging signals (which provide a net removal of charge or current from the battery/cell). (See, for example, FIGS. 2C and 2D).

The adaptive charging circuitry and techniques of the present inventions may employ any charging circuitry 12, whether described herein, now known or later developed, to charge the battery/cell; all such charging circuitry 12 are intended to fall within the scope of the present inventions. For example, charging circuitry 12 of the present inventions may generate charging and discharging signals, packets and pulses (as described herein). Notably, charging circuitry 12 is generally responsive to control signals from control circuitry 16.

Although discussed in more detail below, with reference to FIGS. 3A-3J, the charging and discharging signals may include a plurality of charge packets wherein each charge packet includes one or more charge pulses and, in certain embodiments, one or more discharge pulses. The charging and discharging signals may also include one or more discharge packets wherein each discharge charge packet includes one or more discharge pulses. (See, FIGS. 3K-3N). Indeed, the charging and discharging signals may also include charge packets and one or more discharge packets wherein each charge packet and discharge packet includes one or more charge pulses and/or one or more discharge pulses. (See, FIGS. 3K and 3N).

With continued reference to FIG. 1A, monitoring circuitry 14 measures, monitors, senses, detects and/or samples, on an intermittent, continuous and/or periodic basis, condition or characteristics of the battery/cell including, for example, the terminal voltage, open circuit voltage (OCV) and/or temperature of the battery/cell. Notably, the adaptive charging circuitry and techniques of the present inventions may employ any monitoring circuitry 14 and/or measuring or monitoring techniques, whether described herein, now known or later developed, to acquire such data; all such monitoring circuitry 14 and measuring or monitoring techniques are intended to fall within the scope of the present inventions. The monitoring circuitry 14 provides data which is representative of the condition or characteristics of the battery/cell to control circuitry 16. Moreover, the monitoring circuitry may include one or more temperature sensors (not illustrated) which is/are thermally coupled to the battery/cell to generate, measure and/or provide data which is representative of the temperature of the battery/cell.

The control circuitry 16, using data from monitoring circuitry 14, calculates, determines and/or assesses the state or condition of the battery/cell in connection with the charging or recharging process. For example, control circuitry 16 calculates, determines and/or estimates a change in terminal voltage of the battery/cell in response to charge or current applied to or injected into the battery/cell. The control circuitry 16 may also calculate, determine and/or estimate one, some or all of the SOC of the battery/cell, SOH of the battery/cell, partial relaxation time of the battery/cell and/or overpotential or full relaxation time of the battery/cell.

The control circuitry 16 also calculates, determines and/or implements a charging sequence or profile based on or using one or more of the adaptive charging techniques and algorithms described herein. In this regard, control circuitry 16 adapts, adjusts and/or controls one or more characteristics of the charge or current applied to or injected into the battery/cell (via controlling the operation of charging circuitry 12) so that the change in terminal voltage of the battery/cell (in response to charge or current applied to or injected into the battery/cell during a charging or recharging sequence/operation) is within a predetermined range and/or below a predetermined value. In one embodiment, where charging circuitry 12 applies charge packets (having one or more charge pulses) to the battery/cell, control circuitry 16 (implementing, for example, one or more of the inventive adaptive charging techniques described herein) adapts, adjusts and/or controls the characteristics of the charge packets applied to or injected into the battery/cell (via controlling charging circuitry 12) so that the change in terminal voltage of the battery/cell in response to each charge packet is within a predetermined range and/or below a predetermined value. For example, control circuitry 16 may instruct charging circuitry 12 to change the characteristics of the charge or current applied to or injected into the battery/cell via controlling the shape, amplitude and/or width of charge pulse(s). In this way, control circuitry 16 may, in one embodiment, adapt, adjust and/or control the charge or current applied to or injected into the battery/cell (via controlling charging circuitry 12) so that the change in terminal voltage of the battery/cell in response to the charge or current is within a predetermined range and/or below a predetermined value.

In another embodiment, charging circuitry 12 applies charge packets, having one or more charge pulses and one or more discharge pulses, to the battery/cell during a charging or recharging sequence, operation or cycle. In this embodiment, control circuitry 16 may adapt, adjust and/or control (i) the characteristics of charge pulses applied and/or (ii) the characteristics of the discharge pulse so that the change in terminal voltage is within a predetermined range and/or below a predetermined value. Here again, control circuitry 16 (via control of charging circuitry 12) may adapt, adjust and/or control shape, amplitude and/or width of charge pulse(s) and the shape, amplitude and/or width of discharge pulse(s) in a manner so that (i) a change in terminal voltage of the battery/cell due to the charge pulse(s) and (ii) a change in terminal voltage of the battery/cell due to the discharge pulse(s) are each within predetermined ranges during the charging sequence. In addition thereto, or in lieu thereof, control circuitry 16 (via control of charging circuitry 12) may adapt, adjust and/or control shape, amplitude and/or width of charge pulse(s) and discharge pulse(s) in a manner that provides a relationship between (i) a change in terminal voltage of the battery/cell due to the charge pulse(s) and (ii) a change in terminal voltage of the battery/cell due to the discharge pulse(s) to be within a predetermined range. Thus, in these embodiments, control circuitry 16 (implementing, for example, one or more of the inventive adaptive charging techniques described herein) adapts, adjusts and/or controls one or more characteristics of the charge and/or discharge pulses so that changes in terminal voltage of the battery/cell in response to charge pulses and/or discharge pulses (i) is within predetermined range(s) and/or below a predetermined value(s) and/or (ii) the relationship between such changes is within a predetermined range and/or below a predetermined value.

Notably, control circuitry 16 may include one or more processors, one or more state machines, one or more gate arrays, programmable gate arrays and/or field programmable gate arrays, and/or a combination thereof. Indeed, control circuitry and monitoring circuitry may share circuitry with each other as well as with other elements; such circuitry may be distributed among a plurality of integrated circuits which may also perform one or more other operations, which may be separate and distinct from that described herein. Moreover, control circuitry 16 may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by control circuitry 16 using any programming language whether now known or later developed, including, for example, assembly, FORTRAN, C, C++, and BASIC, whether compiled or uncompiled code; all of which are intended to fall within the scope of the present inventions.

In operation, charging circuitry 12 applies a charge or current to the battery/cell. (See, for example, the exemplary charge waveforms of FIGS. 2A-2D). The monitoring circuitry 14 measures or detects voltages at the terminals of the battery/cell to determine a change in terminal voltage caused by or as a result of the applied charge. In this regard, in one embodiment, monitoring circuitry 14 measures the terminal voltage before applying the charge or current to the battery/cell (for example, immediately before applying such charge or current) and at the conclusion thereof (for example, immediately after terminating the application of such charge or current. Control circuitry 16, using the terminal voltages measured by monitoring circuitry 14, calculates a change in the terminal voltage in response to such charge or current and determines whether the change in terminal voltage is within a predetermined range and/or below a predetermined value.

Where the change in terminal voltage is within a predetermined range and/or below a predetermined value, control circuitry 16, in one embodiment, instructs charging circuitry 12 to apply the same or similar charge packet to the battery/cell during subsequent charging. Where, however, the change in terminal voltage is outside the predetermined range (i.e., is less than or is greater than the predetermined range), control circuitry 16 adapts, adjusts and/or controls one or more characteristics of the charge or current applied to or injected into the battery/cell (via charging circuitry 12) so that a change in voltage at the terminals of the battery/cell in response to subsequent charging (for example, the immediately subsequent charge packet) is within the predetermined range and/or below a predetermined value. Here, control circuitry 16 calculates or determines a change to one or more characteristics of the charging so that charge or current applied to or injected into the battery/cell via subsequent charging is within a predetermined range and/or below a predetermined value. Notably, the predetermined range may indeed change, for example, according to a predetermined rate or pattern, and/or according to the measured, determined and/or estimated SOC and/or SOH of the battery/cell.

Figure 4A:
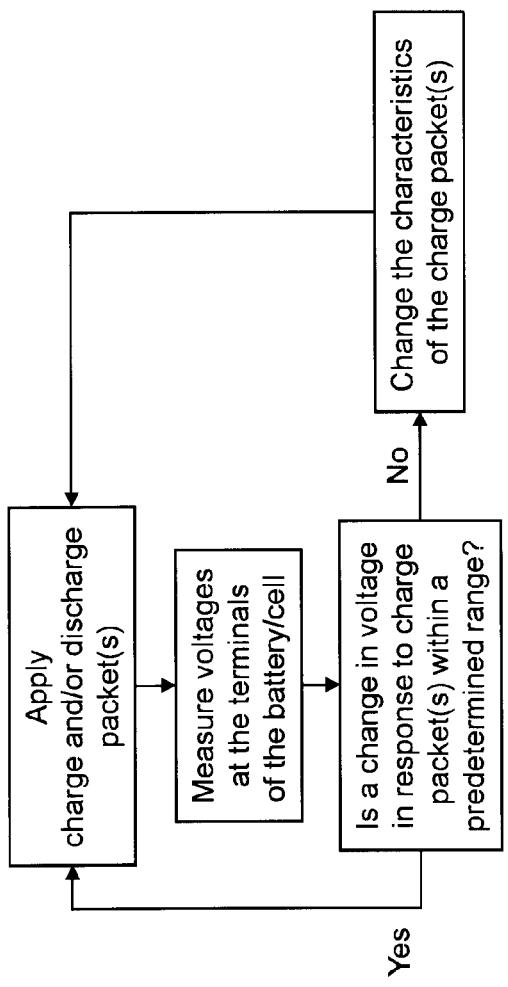
FIG. 4A is a flowchart of an exemplary process of determining, adapting and/or controlling the characteristics of a charging current based on or using a change in voltage at the terminals of the battery/cell in response to a charge packet (which may include one or more charge pulses and one or more discharge pulses), according to certain aspects of the present inventions; wherein the charging techniques and/or circuitry adapt, adjust and/or control one or more characteristics of the charge or current applied to or injected into the battery/cell so that the change in voltage at the terminals of the battery/cell in response to one or more subsequent charge packets is within a predetermined range and/or below a predetermined value during a charging or recharging sequence, operation or cycle.
Figure 4B:
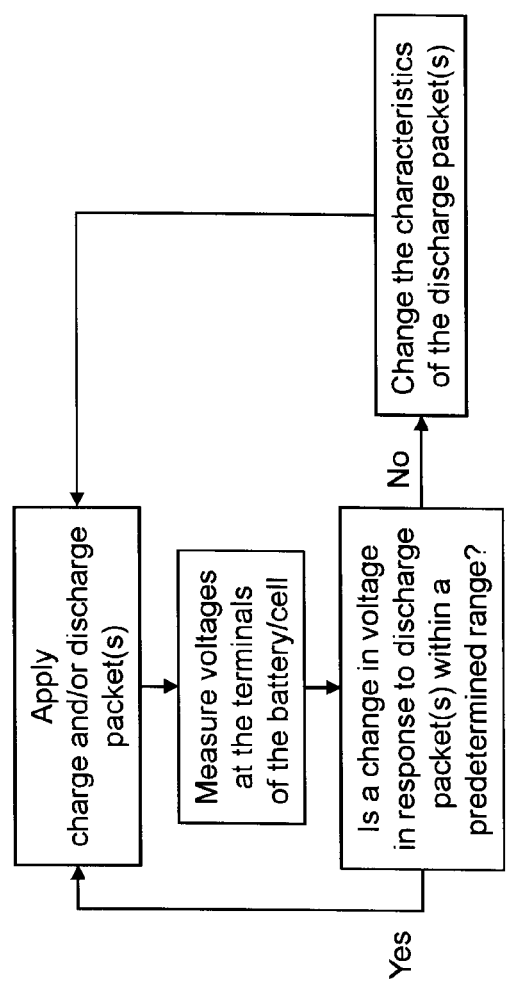
FIG. 4B is a flowchart of an exemplary process of adaptively determining the characteristics of the discharging current based on or using a change in voltage at the terminals of the battery/cell in response to a discharge packet (which may include one or more discharge pulses and one or more charge pulses), according to certain aspects of the present inventions; wherein the discharging techniques and/or circuitry adapt, adjust and/or control one or more characteristics of the charge or current removed from the battery/cell so that the change in voltage at the terminals of the battery/cell in response to one or more subsequent discharge packets is within a predetermined range and/or below a predetermined value during a charging sequence, operation or cycle.

In particular, with reference to FIGS. 1A, 4A and 5A, in one embodiment, monitoring circuitry 14 measures, samples and/or determines the terminal voltage response to the charge pulse and provides data which is representative of a first voltage ($V_1$), which correlates to a voltage at a beginning of the charge pulse, and a second voltage ($V_2$), which correlates to a voltage at an end of the charge pulse and/or the peak of the change in the terminal voltage due to the charge pulse, to control circuitry 16. Based on or using such data, control circuitry 16 calculates, determines and/or estimates whether the change in terminal voltage, due to the charge pulse, is within a predetermined range and/or below a predetermined value. Where control circuitry 16 calculates, determines and/or estimates the change in terminal voltage is within a predetermined range and/or below a predetermined value, control circuitry 16 does not change and/or maintains the characteristics of subsequent charge packets due thereto (although control circuitry 16 may indeed change such characteristics as a result of other considerations, such as, for example, considerations measurements of—relaxation time to partial equilibrium and/or SOC and/or SOH).

Where, however, control circuitry 16 determines the change in terminal voltage is outside the predetermined range, control circuitry 16 may change one or more characteristics of the charge packet including the shape, amplitude and/or width of charge pulse(s) in order to adapt, adjust and/or control the charge or current applied to or injected into the battery/cell (via charging circuitry 12) so that a change in voltage at the terminals of the battery/cell in response to a subsequent charge or current is within a predetermined range and/or below a predetermined value. For example, where the change in terminal voltage in response to one or more charge packets is less than a predetermined range, control circuitry 16 may increase the amplitude and/or width of the charge pulse(s) to thereby inject more current or charge into the battery/cell in a subsequent packet (for example, the immediately subsequent packet). Alternatively, control circuitry 16 may increase the amplitude and decrease the width of the charge pulse(s) to thereby inject the same amount of current or charge into the battery/cell in a subsequent packet (for example, the immediately subsequent packet) but at a higher amplitude relative to the previous packet/pulse. (See, for example, FIG. 6A).

Where, the change in terminal voltage in response to one or more charge packets is greater than the predetermined range, control circuitry 16 may decrease the amplitude and/or width of the charge pulse(s) to thereby inject less current or charge into the battery/cell in the subsequent packet (for example, the immediately subsequent packet). Alternatively, control circuitry 16 may decrease the amplitude and increase the width of the charge pulse(s) to thereby inject the same amount of current or charge into the battery/cell in a subsequent packet (for example, the immediately subsequent packet) but at a lower amplitude relative to the previous pulse. (See, for example, FIG. 6A).

Figures 6A, 6B:
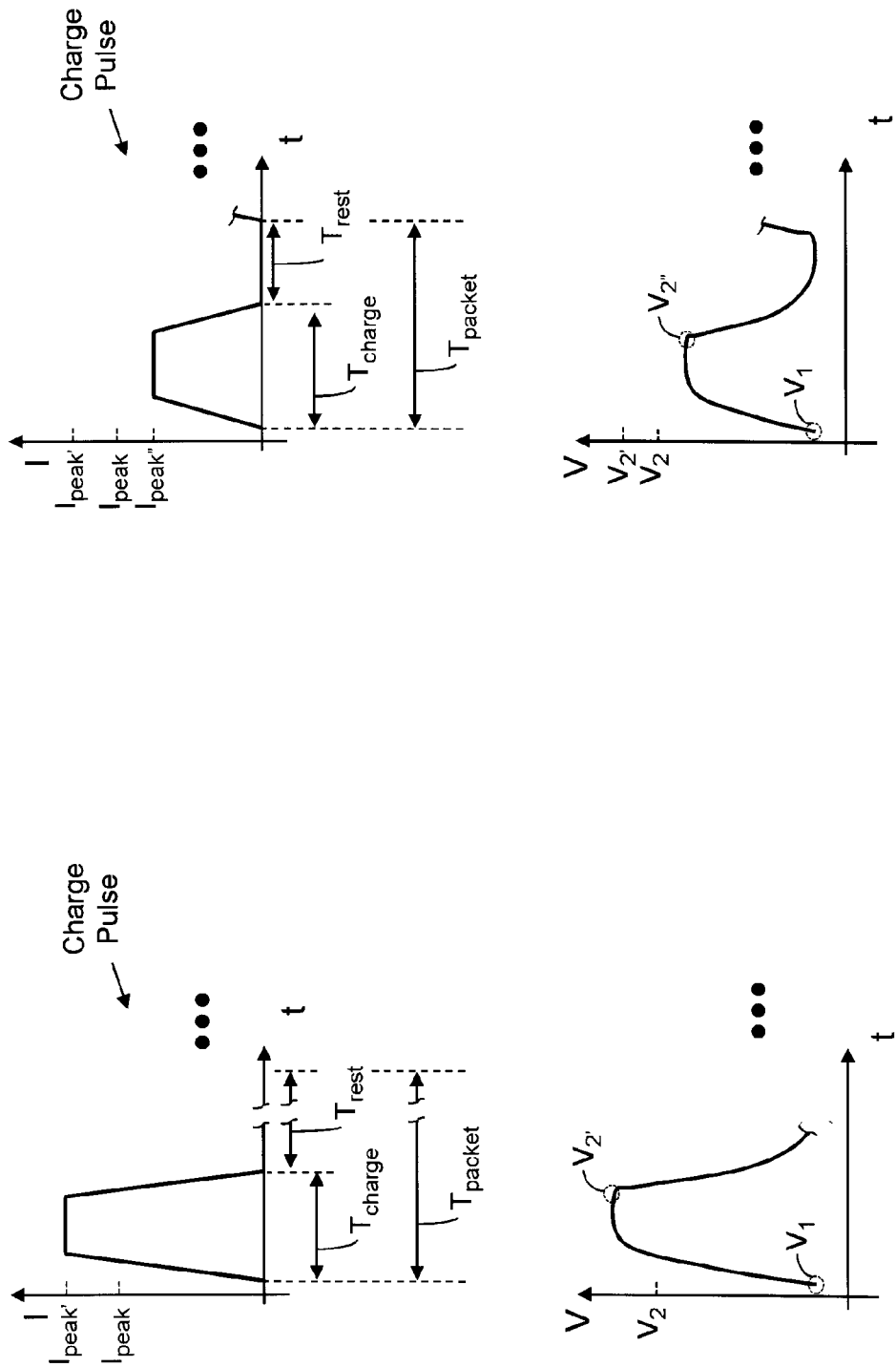
FIG. 6A illustrates an exemplary charge packet having a charge pulse wherein the amplitude of the charge pulse is greater than the amplitude of the charge pulse of FIG. 5A wherein the charging circuitry, in response to instructions from the control circuitry, adjust the amplitude of the charge pulse to increase the responsive terminal voltage so that the change in terminal voltage of the battery/cell is within a predetermined range and/or below a predetermined value during a charging or recharging sequence, operation or cycle; an exemplary terminal voltage response of the battery/cell to such a charge pulse is illustrated wherein a first voltage ($V_1$) is identified (which correlates to the beginning of the charge pulse) and a second voltage ($V_2$) is identified (which correlates to the end of the charge pulse and/or the peak of the change in the terminal voltage due to the charge pulse) wherein the amplitude of the responsive terminal voltage is greater than the amplitude of the terminal voltage of the battery/cell which is responsive to the charge pulse of FIG. 5A.
FIG. 6B illustrates an exemplary charge packet having a charge pulse wherein the amplitude of the charge pulse is less than the amplitude of the charge pulse of FIG. 5A wherein the charging circuitry, in response to instructions from the control circuitry, adjust the amplitude of the charge pulse to decrease the responsive terminal voltage so that the change in terminal voltage of the battery/cell is within a predetermined range and/or below a predetermined value during a charging or recharging sequence, operation or cycle; an exemplary terminal voltage response of the battery/cell to such a charge pulse is illustrated wherein a first voltage ($V_1$) is identified (which correlates to the beginning of the charge pulse) and a second voltage ($V_2$) is identified (which correlates to the end of the charge pulse and/or the peak of the change in the terminal voltage due to the charge pulse) wherein the amplitude of the responsive terminal voltage is less than the amplitude of the terminal voltage of the battery/cell which is responsive to the charge pulse of FIG. 5A.

Notably, with reference to FIGS. 6A and 6B, in one embodiment, control circuitry 16 may adapt, adjust and/or control the amplitude and/or duration of the charge pulse as well as the duration of the rest period ($T_{rest}$). For example, in one embodiment, control circuitry 16, via charging circuitry 12, adjusts the amplitude and duration of the charge pulse and the duration of the rest period ($T_{rest}$) to maintain a constant period of the charge packet ($T_{packet}$). Alternatively, control circuitry 16 may adapt, adjust and/or control the duration of the rest period ($T_{rest}$) to accommodate other considerations and parameters in relation to the response of the battery/cell to charging (for example, overpotential or full relaxation time (relative to full or complete equilibrium of the battery/cell) and/or relaxation time (to partial-equilibrium of the battery/cell)).

In those embodiments where the charge packet includes one or more charge pulses and at least one discharge pulse, monitoring circuitry 14 may measure, sample and/or determine the terminal voltage of the battery/cell in response to the charge and discharge pulses. For example, with reference to FIG. 5B, monitoring circuitry 14 may measure, sample and/or determine the terminal voltages responsive to the charge and discharge pulses including (1) a first voltage ($V_1$), which correlates to the voltage at a beginning of the charge pulse, (2) a second voltage ($V_2$), which correlates to a voltage at an end of the charge pulse and/or the peak of the change in the terminal voltage due to the charge pulse, (3) a third voltage ($V_3$), which correlates to the voltage at a beginning of the discharge pulse, and (4) a fourth voltage ($V_4$), which correlates to a voltage at an end of the discharge pulse and/or the peak of the change in the terminal voltage due to the discharge pulse. The control circuitry 16, using the terminal voltages which are responsive to the charge and/or discharge pulses may calculate one or more changes in the terminal voltages of the battery/cell.

In one embodiment, control circuitry 16 employs the same techniques to adapt, adjust and/or control the charge as described above in connection with charge packets having no discharge pulses. That is, control circuitry 16 adjusts the characteristics of the charge pulse(s) to control, adjust and/or provide a terminal voltage, in response to one or more subsequent charge packets, which is within a predetermined range and/or below a predetermined value.

In another embodiment, control circuitry 16 calculates, determines and/or estimates whether (i) a change in terminal voltage, due to the charge pulse(s) and (ii) a change in terminal voltage of the battery/cell due to the discharge pulse(s) are within the same predetermined range or are each within respective predetermined ranges associated with each of the pulse(s). Where the change in terminal voltage, due to the charge pulse(s) and the change in terminal voltage of the battery/cell due to the discharge pulse(s) are outside the same predetermined range or associated predetermined ranges, control circuitry 16 may adapt, adjust and/or control one or more characteristics of the charge pulse(s) and/or discharge pulse(s) (for example, the shape, amplitude and/or width of charge pulse(s) and/or discharge pulse(s)), via controlling charging circuitry 12, so that the change in response to subsequent packet is within one or more predetermined ranges and/or below one or more predetermined values. The control circuitry 16 may change the characteristics of the pulse(s) while maintaining an amount of current injected into the battery/cell and/or an amount of charge or current removed from the battery/cell constant or substantially constant relative to immediately subsequent packets. Alternatively, control circuitry 16 may change the characteristics of the pulse(s) and change an amount of charge or current applied to or injected into the battery/cell and/or an amount of charge or current removed from the battery/cell so that the change in voltage in response to subsequent packet(s) is within one or more predetermined ranges and/or below one or more predetermined values.

Thus, control circuitry 16 may adapt, adjust and/or control shape, amplitude and/or width of charge pulse(s) and the shape, amplitude and/or width of discharge pulse(s) (via controlling charging circuitry 12) in a manner so that (i) a change in terminal voltage of the battery/cell due to the charge pulse(s) and/or (ii) a change in terminal voltage of the battery/cell due to the discharge pulse(s) are each within predetermined ranges during subsequent charging. In addition thereto, or in lieu thereof, control circuitry 16 of the present inventions may adapt, adjust and/or control shape, amplitude and/or width of charge pulse(s) and discharge pulse(s) in a manner that provides a relationship between (i) a change in terminal voltage of the battery/cell due to the charge pulse(s) and (ii) a change in terminal voltage of the battery/cell due to the discharge pulse(s) to be within a predetermined range during subsequent charging. As such, in those embodiments where the charge packet includes one or more charge and discharge pulses, control circuitry 16 of the present inventions may adapt, adjust and/or control one or more characteristics of the charge and/or discharge pulses of a packet to control the change in terminal voltage of the battery/cell in response to charge pulse and/or discharge pulse so that (i) each such change is within predetermined range(s) and/or below predetermined value(s) and/or (ii) the relationship between such changes is within a predetermined range and/or below a predetermined value.

With continued reference to FIG. 5B, control circuitry 16 may, in addition to controlling the amplitude and width of the charge and/or discharge pulses, may control the duration of one or both of the rest periods ($T_{inter}$ and $T_{rest}$). In one embodiment, control circuitry 16, via charging circuitry 12, adjusts the amplitude and width of the charge and/or discharge pulses and duration of one or both of the rest periods ($T_{inter}$ and $T_{rest}$) to maintain a constant period of the charge packet ($T_{packet}$). Alternatively, control circuitry 16 may adapt, adjust and/or control the amplitude and/or duration of the charge and/or discharge pulses in relation to the change in terminal voltage of the battery/cell as well as adapt, adjust and/or control the duration of one or both of the rest periods ($T_{inter}$ and $T_{rest}$) to, for example, accommodate other considerations and parameters in relation to the response of the battery/cell to charging (for example, overpotential or full relaxation time (relative to full or complete equilibrium of the battery/cell) and/or relaxation time (to partial-equilibrium of the battery/cell)).

As mentioned above, control circuitry 16 may adapt, adjust and/or control the characteristics of subsequent charge or current applied to or injected into the battery/cell based on or using an averaged response of the battery/cell in connection with a plurality of pulses in the packet and/or a plurality of packets. For example, control circuitry 16 may adapt, adjust and/or control the shape, amplitude and/or width of charge pulse(s) generated by charging circuitry 12 and applied to the battery/cell by charge packets so that the change in voltage at the terminals of the battery/cell averaged over a plurality of charge packet is within a predetermined range and/or below a predetermined value. Similarly, the charging techniques and/or circuitry of the present inventions may adapt, adjust and/or control the charge or current applied to or injected into the battery/cell by a plurality of charge pulses of a packet so that the change in voltage at the terminals of the battery/cell averaged over a plurality of charge pulses of the packet is within a predetermined range and/or below a predetermined value.

The control circuitry 16 may employ any form of averaging now known or later developed; all of which are intended to fall within the scope of the present inventions. For example, control circuitry 16 may employ discrete or mutually exclusive groups of packets or "rolling" averages wherein the charging techniques and/or circuitry determine or calculate a "new" average as a change in voltage at the terminals of the battery/cell, in response to a charge packet. Again, all forms of averaging and averaging techniques are intended to fall within the scope of the present inventions.

Notably, the discussion with respect to the charge packets is applicable to control of the pulses of a discharge packet. In this regard, control circuitry 16 may adapt, adjust and/or control one or more characteristics of the discharge packets so that the change in voltage at the terminals of the battery/cell in response to a subsequent discharge packet and/or charge packet is within a predetermined range and/or below a predetermined value. As mentioned above, the discharge packets include one or more discharge pulses (see, for example, FIGS. 3K-3N) as well as one or more charge pulses in addition to the discharge pulse(s) (see, for example, 3K, 3M and 3N).

In operation, similar to the charge packets, monitoring circuitry 14 measures, samples and/or determines the terminal voltage of the battery/cell in response to the discharge pulse and provides data which is representative thereof to control circuitry 16, which determines the change in voltage at the terminals of the battery/cell in response to the discharge pulse. (See, for example, FIG. 5B). The control circuitry 16 calculates or determines whether the change in voltage at the terminals of the battery/cell is within the predetermined range and/or below a predetermined value. Where the change in voltage is outside the range, control circuitry 16 may adapt, adjust and/or control one or more characteristics of the charge or current removed from the battery/cell by discharge packets so that the change in terminal voltage in response to subsequent discharge packets (and/or subsequent charge packets) is within a predetermined range and/or below a predetermined value. (See, for example, FIG. 5B). Notably, control circuitry 16 may adapt, adjust and/or control the discharge packet (via control of charging circuitry 12) in the same manner as that described above in connection with the charge packet.

Notably, the predetermined range may be fixed or may change or be adjusted, for example, over time or use and/or based on one or more conditions or states of the battery/cell and/or responses of the battery/cell to or during charging. In one embodiment, the predetermined range is based on empirical data, test data, simulation data, theoretical data and/or a mathematical relationship. For example, based on empirical data, control circuitry 16 associated with the battery/cell may determine, calculate and/or employ predetermined ranges based on one or more conditions or states of the battery/cell (for example, the SOC and/or SOH of the battery/cell) and/or responses of the battery/cell to or during charging. Such predetermined ranges fixed (for example, conform to a fixed or predetermined pattern) or may be variable.

In one embodiment, the changes in the predetermined range may be based on one or more conditions or states of the battery/cell and/or responses of the battery/cell to or during the charging process. For example, the predetermined range may change and/or adapt based on or according to one or more parameters of the battery/cell including, for example, the SOC, the SOH, overpotential or full relaxation time (relative to full or complete equilibrium of the battery/cell) and/or relaxation time (to partial-equilibrium of the battery/cell). Indeed, in one embodiment, where the battery/cell is a typical rechargeable lithium-ion (Li+) battery/cell employing a conventional chemistry, design and materials, a predetermined range may be dependent on the SOC of the battery/cell—for example, the predetermined range may be (i) 250 mV±5% when the battery/cell includes a SOC of between 0-10%, (ii) 235 mV±5% when the battery/cell includes a SOC of between 10-20%, (iii) 215 mV±5% when the battery/cell includes a SOC of between 20-30%, (iv) 190 mV±5% when the battery/ cell includes a SOC of between 30-50%, (v) 160 mV±5% when the battery/cell includes a SOC of between 50-60%, (vi) 130 mV±5% when the battery/cell includes a SOC of between 60-70%, (vii) 120 mV±5% when the battery/cell includes a SOC of between 70-80%, (viii) 110 mV±5% when the battery/cell includes a SOC of between 80-90%, (ix) 100 mV±5% when the battery/cell includes a SOC of between 90-100%.

Indeed, in one exemplary embodiment, the net effective charging current at 0-20% SOC may be 1-1.5 C, and at 80-100% SOC, it may be reduced to 0.1-0.4 C. Notably, the taper of the change in net effective charging current over time may be linear or non-linear (for example, square root of time). (See, for example, FIG. 7). It is also possible to make the net effective charging current initially low for an SOC less than 10%, then make it reach a maximum around 5-20% SOC, then gradually make it decline to a lower value near 90-100% SOC. All of these are various embodiments of the taper function of the net effective charging current with the purpose of optimizing the charging current and charging time while taking into account the underlying physical mechanisms in the battery, for example, mass transport of lithium ions, reaction kinetics and/or their associated time constants, and/or the strains in the anode during the intercalation of the lithium ions.

Thus, in one embodiment, control circuitry 16 may calculate, determine and/or employ one or more predetermined ranges based on the status or state of the battery/cell (for example, based on or using data which is representative of the SOC of the battery/cell, the SOH of the battery/cell, overpotential and/or relaxation time). That is, the predetermined range employed by control circuitry 16 and upon which the change in terminal voltage is evaluated, may be dependent on status or state of the battery/cell, for example, the SOC of the battery/cell and the SOH of the battery/cell.

In one embodiment, based on or using initialization, characterization and/or calibration data, control circuitry 16 or external circuitry may calculate or determine an initial set of predetermined ranges for the particular battery/cell. For example, in one embodiment, based on or using (i) initialization, characterization and/or calibration data and (ii) empirical data, test data, simulation data, theoretical data and/or a mathematical relationship, control circuitry 16 or external circuitry may calculate or determine a set of predetermined ranges for a particular or associated battery/cell. Such predetermined ranges may be based on one or more states of the battery/cell (for example, SOC of the battery). The control circuitry may adaptively adjust the predetermined ranges over the life or use of the battery/cell—for example, based on the changing conditions of the battery/cell (for example, a measured SOH of the battery/cell).

Notably, a set of predetermined ranges may be calculated or determined by control circuitry 16 or by circuitry other than control circuitry 16 (for example, circuitry which is "off-device" or "off-chip" relative to control circuitry 16). The predetermined ranges may be stored in memory (for example, in a database or look-up table) during manufacture, test or calibration, and accessible to the adaptive circuitry and/or processes of the present inventions during operation.

In one embodiment, a set of predetermined ranges (based on, for example, SOC of the battery) may be calculated or determined and stored in memory (for example, during manufacture, test or calibration). Thereafter, the control circuitry may adjust or adapt the set of predetermined ranges based on the condition of the battery/cell—for example, the SOH of the battery/cell. Alternatively, the memory may store multiple sets of predetermined ranges (for example, in a look-up table or matrix) and control circuitry 16 employs a given predetermined range based on one or more conditions of the battery/cell—including SOC and SOH of the battery/cell. Thus, in this embodiment, the predetermined ranges employed by control circuitry 16 depends on the SOH of the battery/cell, which designates or "identifies" a set of predetermined ranges, and the SOC of the battery/cell which designates or "identifies" the particular predetermined range within the set of predetermined ranges. In these embodiments, the control circuitry adapts the control of the charging process based on or in response to a degrading SOH of the battery/cell. The set of predetermined ranges or the particular predetermined range may also be depend on other considerations such as the state or status of other parameters of the battery/cell including, for example, the overpotential, relaxation time and/or temperature of the battery/cell (for example, in one embodiment, the predetermined ranges may increase with an increase in temperature of the battery/cell).

The predetermined ranges may be stored in any memory now known or later developed; all of which are intended to fall within the scope of the present inventions. For example, the memory may be a permanent, semi-permanent or temporary memory (for example, until re-programmed). In one embodiment, the memory may be one-time programmable, and/or the data, equations, relationships, database and/or look-up table of the predetermined range(s) may be stored in a one-time programmable memory (for example, programmed during test or at manufacture). In another embodiment, the memory is more than one-time programmable and, as such, the predetermined range(s) may be updated, written, re-written and/or modified after initial storage (for example, after test and/or manufacture) via external or internal circuitry.

With reference to FIGS. 1A-1C, memory 18 may be integrated or embedded in other circuitry (for example, control circuitry 16) and/or discrete. The memory 18 may be of any kind or type (for example, EEPROM, Flash, DRAM and/or SRAM). The memory 18 may store data which is representative of the predetermined ranges, equations, and relationships. Such data may be contained in a database and/or look-up table.

As noted above, in certain embodiments, two considerations in connection with implementing the adaptive charging circuitry and techniques of the present inventions include (i) minimizing and/or reducing total charging time and (ii) maximizing and/or increasing cycle life. Under certain circumstances, it is desirable to charge the battery/cell at the slowest possible charge rate in order to extend its cycle life. For practical reasons, however, the user may desire to charge the battery/cell within a given period of time (for example, a maximum allowed period of time). Typically, a specification value is defined, selected and/or chosen depending on the application of the battery/cell. For example, it is approximately 2 to 4 hours for conventional batteries employed in consumer applications, and for conventional batteries employed in transportation applications, it may be up to 8 hours. This results in a specification for a net effective charging current. Moreover, to maximize and/or increase cycle life of the battery/cell, it may be desirable to charge the battery/cell (i) at a low current and/or (ii) provide relaxation or rest periods between charging periods. Thus, in certain aspects, the charging circuitry of the present inventions implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

In another aspect, the present inventions are directed to adaptive charging techniques and/or circuitry employing data which is/are representative of the relaxation time of the battery/cell to adapt, adjust and/or control one or more characteristics of the charging process. In one embodiment, the adaptive charging techniques and/or circuitry adapt, adjust and/or control one or more characteristics of the charge process to the relaxation time of the battery/cell. In another embodiment, the adaptive charging techniques and/or circuitry may adapt, adjust and/or control a relaxation time of the battery/cell to, for example, maintain or provide a relaxation time that is within a predetermined range and/or less than a value or limit during at least portions of the charging sequence, cycle or operation.

For example, where the charging techniques and/or circuitry apply charge packets, having one or more charge pulses, to the battery/cell during a charging sequence, cycle or operation, in one embodiment, charging techniques and/or circuitry may adapt, adjust and/or control one or more characteristics of the charge packet to correlate a rest period of the charge packet to a relaxation time of the battery/cell. In addition thereto, or in lieu thereof, the charging techniques and/or circuitry may adapt, adjust and/or control one or more characteristics of the charge packet to adapt, adjust and/or control a relaxation time of the battery/cell, for example, to be within a predetermined range and/or less than a value or limit during the charging sequence, cycle or operation. In these embodiments, the charging techniques and/or circuitry may adapt, adjust and/or control one or more characteristics of the charge packet via adapting, adjusting and/or controlling the shape, amplitude, temporal width of charge pulse(s) of the subsequent packet(s), and/or the temporal width of one or more rest periods of the subsequent packet(s).

In another embodiment, the charging techniques and/or circuitry apply charge packets, having one or more charge pulses and one or more discharge pulses, to the battery/cell during a charging sequence, cycle or operation. Similar to the embodiments above, in this embodiment, the charging techniques and/or circuitry may adapt, adjust and/or control one or more characteristics of the charge pulse(s) and/or one or more characteristics of the discharge pulse(s) to adapt, adjust and/or control one or more characteristics of the charge process in accordance with or to correlate to the relaxation time of the battery/cell. The adaptive charging techniques and/or circuitry may, in addition thereto, or in lieu thereof, adapt, adjust and/or control a relaxation time of the battery/cell to, for example, maintain or provide a relaxation time within a predetermined range and/or less than a value or limit during the charging sequence, cycle or operation. The charging techniques and/or circuitry may implement these embodiments by adapting, adjusting and/or controlling one or more characteristics of the charge or current applied to, removed from the battery/cell and/or the rest periods—via adapting, adjusting and/or controlling the shape, amplitude, temporal width of charge pulse(s) and/or discharge pulse(s) of the subsequent packet(s), and/or the temporal width of one or more rest periods of the subsequent packet(s).

The adaptive charging techniques and/or circuitry of the present inventions may intermittently, continuously and/or periodically monitor, measure, determine and/or estimate the relaxation time of the battery/cell (for example, monitor, measure, determine and/or estimate the relaxation time of the battery/cell every Nth packet (where N=1 to 10) and/or every 10-1000 ms). In addition thereto, the adaptive charging techniques and/or circuitry of the present inventions may also intermittently, continuously and/or periodically use data which is representative of the relaxation time of the battery/cell to adapt, adjust and/or control one or more characteristics of the charging process (for example, adapt, adjust and/or control one or more characteristics of the charging process every Nth packet (where N=1 to 10) and/or every 10-1000 ms). For example, in one embodiment, the adaptive charging techniques and/or circuitry intermittently, continuously and/or periodically monitor, measure, determine, estimate the relaxation time of the battery/cell (which may change in accordance with certain characteristics of the battery/cell—for example, SOC and SOH of the battery). Based on or using data which is representative of the relaxation time, the adaptive charging techniques and/or circuitry may intermittently, continuously and/or periodically determine and/or adapt the characteristics of the charge or current injected into the battery/cell (or adapt the characteristics of the charge removed from the battery/cell in those embodiments where a discharge current is employed). In one embodiment, the adaptive charging techniques and/or circuitry may intermittently, continuously and/or periodically determine the relaxation time of the battery/cell and, in response thereto or based thereon, may intermittently, continuously and/or periodically determine an (i) amplitude and duration of subsequent charge pulses to be applied to or injected into the battery/cell (which, in one embodiment, may be charge pulses of the immediately subsequent packet(s)) and/or (ii) a duration of a rest period. In this way, the duration of the rest period may correlate to the relaxation time and/or the relaxation time is within a predetermined range and/or less than a value or limit during subsequent charging.

Thus, adaptive charging techniques and/or circuitry of the present inventions may (i) monitor, measure, determine and/or estimate the relaxation time of the battery/cell on an intermittent, continuous and/or periodic basis, (ii) determine whether the relaxation time is within a predetermined range and/or less than a value or limit on an intermittent, continuous and/or periodic basis, and/or (iii) adapt, adjust and/or control characteristics of the charge or current signals, on an intermittent, continuous and/or periodic basis, in accordance with or to correlate to the relaxation time of the battery/cell and/or maintain or provide a relaxation time within a predetermined range and/or less than a value or limit during the charging. For example, adaptive charging techniques and/or circuitry of the present inventions may (i) monitor, measure, determine and/or estimate the relaxation time of the battery/cell every X packets (where X=1 to 10), (ii) determine whether the relaxation time is within a predetermined range and/or less than a value or limit every Y packets (where Y=1 to 10), and/or (iii) adapt, adjust and/or control characteristics of the charge or current signals, every Z packets (where Z=1 to 10). All permutations and combinations are intended to fall within the scope of the present inventions. Indeed, such embodiments are applicable to the charging techniques and/or circuitry which apply or inject (i) charge packets having one or more charge pulses and (ii) charge packets having one or more charge pulses and one or more discharge pulses.

In another embodiment, the adaptive control circuitry and/or techniques estimate, calculate, measure and/or determine the relaxation time (and/or changes therein) based on one or more events and/or charging response characteristics (for example, the relaxation time of the battery/cell is "inconsistent" with other data, characteristics or parameters of the battery/cell (for example, the SOC, the SOH, overpotential or full relaxation time and/or the voltage at the terminals of the battery/cell during charging). For example, in response to detecting one or more events (due to, for example, an "inconsistency" between the battery/cell charge response characteristics or parameters which suggests, for example, the relaxation time may not be accurately measured, estimated and/or determined), the adaptive control circuitry and/or techniques estimates, calculates, measures and/or determines the relaxation time (and/or changes therein) of a battery/cell and adapts, adjusts and/or controls the characteristics of the charge and/or discharge signals based on or using relaxation time (and/or changes therein) of the battery/cell.

Notably, the predetermined ranges or values may be calculated or determined by the adaptive circuitry and/or processes of the present inventions or by other circuitry and processes (for example, circuitry which is "off-device" or "off-chip"). The predetermined range or values may be stored in memory (for example, in a database or look-up table) during manufacture, test or calibration, and accessible to the adaptive circuitry and/or processes of the present inventions during operation.

Figure 8:
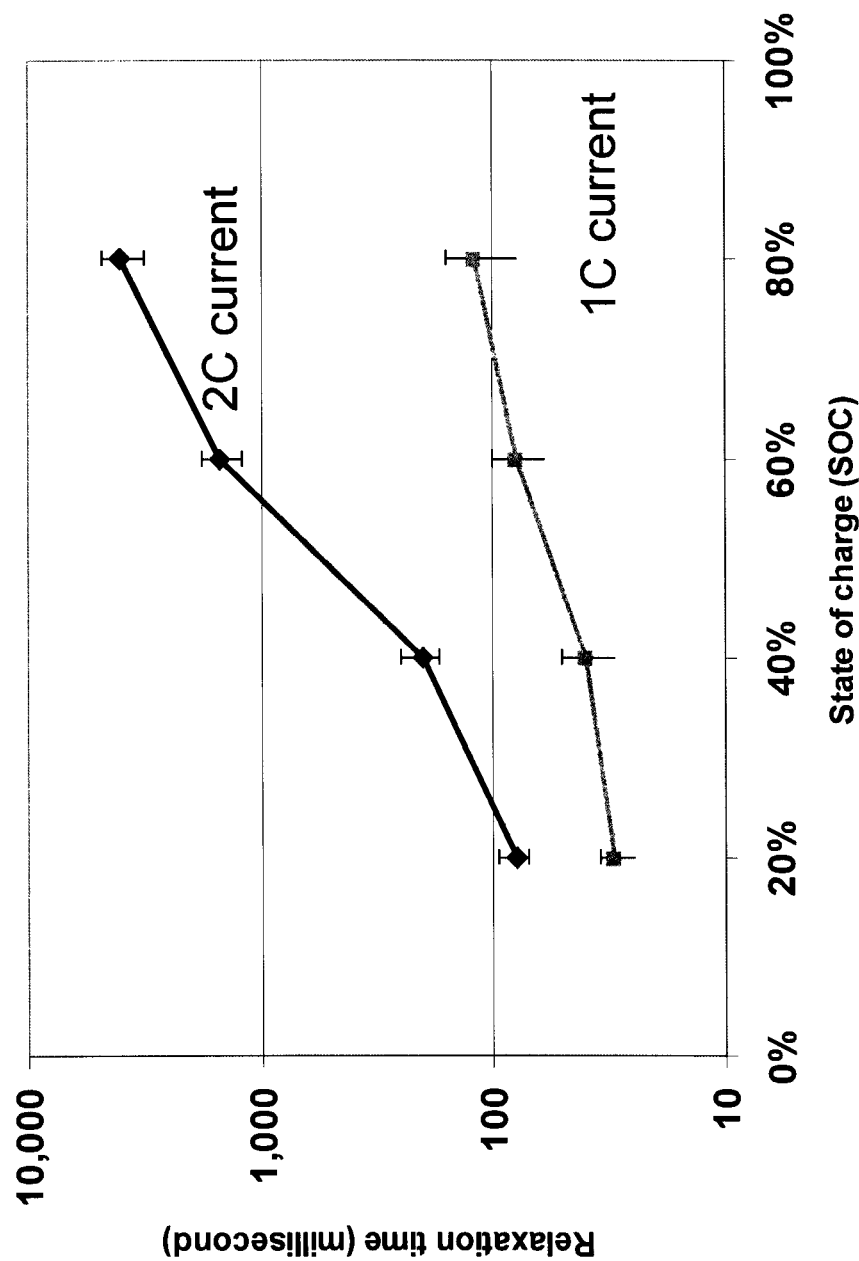
FIG. 8 is an exemplary illustration of the relaxation time as function of state of charge of a battery/cell (rated at 2.5 A.h); notably, the data was acquired using a square-like charging pulse having duration of 20 ms.

The predetermined ranges or values may depend on considerations such as the state or status of one or more parameters of the battery/cell including, for example, the SOC, the SOH and/or temperature of the battery/cell. In one embodiment, due to the dependence of the relaxation time on SOC, SOH and peak charging current, the adaptive charging circuitry and/or technique may charge the battery/cell at a higher current when the SOC of the battery/cell is low and at lower current when the SOC of the battery/cell is high. For example, under certain circumstances, at 80% SOC, the relaxation time difference between a peak current of 2 C and 1 C is in excess of a factor of 20 (see, FIG. 8). When a current charges a lithium-ion battery/cell, lithium ions move from the cathode across the electrolyte and diffuse into the grains of the anode. At low SOC of the battery/cell, the diffusion rate of lithium ions into the anode may be faster than the diffusion rate at high SOC. The difference in diffusion rate may vary substantially. Notably, the impact of temperature of the battery/cell on relaxation time may be incorporated into the set of predetermined ranges or values of the adaption process—and, as such, in one embodiment, where the control circuitry adapts such predetermined ranges or values based on or in accordance with temperature of the battery/cell, temperature sensors (thermally coupled to the battery/cell) may or may not be employed.

Additionally, it may be beneficial to use a higher charging current when the impedance of the battery/cell is low and a lower charging current when the impedance of the battery/cell is high. Therefore, in one embodiment, the adaptive charging circuitry and techniques control, change and/or adjust the peak charging current to control, manage and/or reduce the relaxation time of the battery/cell in response thereto. In this way, the adaptive charging algorithm or technique implements a charging technique based on or in accordance with at least one of the considerations listed above, namely: (i) minimizing and/or reducing total charging time and (ii) maximizing and/or increasing cycle life.

Notably, as indicated above, the adaptive charging algorithm or technique may provide a net effective charging current for a lithium ion battery/cell (employing a conventional chemistry, design and materials) at 0-20% SOC of, for example, 1-1.5 C, and at 80-100% SOC, a net effective charging current of 0.1-0.4 C. The taper of the change in net effective charging current over time may be linear or non-linear (for example, square root of time). (See, for example, FIG. 7). All of these are various embodiments of the taper function of the net effective charging current with the purpose of optimizing the charging current and charging time while taking into account the underlying physical mechanisms in the battery/cell are intended to fall within the scope of the present inventions, for example, the diffusion-limited relaxation time, and/or the strains in the anode during the intercalation of the lithium ions.

Figure 7:
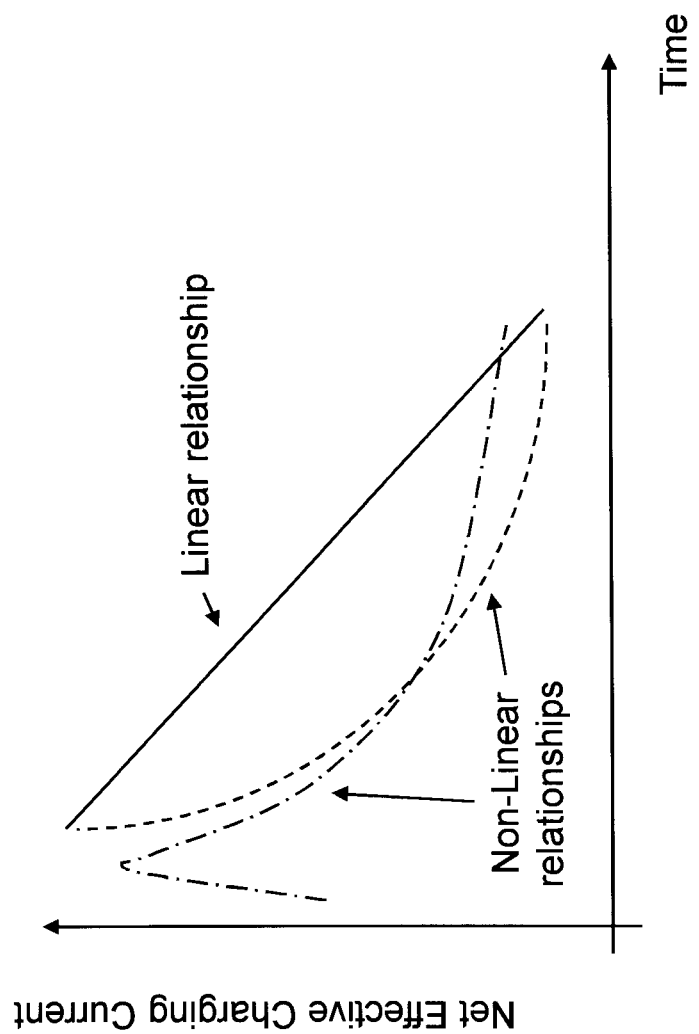
FIG. 7 illustrates of three exemplary changes in net effective charging current of a battery/cell over time (which, in one embodiment, is a function of the state of charge of the battery/cell), according to certain aspects of the present inventions.

With continued reference to FIG. 7, the taper shape, values and function, in certain embodiments, are driven or influenced by a desire to maintain the overpotential or full relaxation time below a predetermine limit and/or within predetermined values. The overpotential or full relaxation time may be controlled by changing the characteristics of the current applied during the recharging operation (for example, the characteristics of the charge signals, discharge signals, charge packets and discharge packets). As is discussed herein, the overpotential or full relaxation time limits/values are a function of or varies in accordance with SOC and SOH and, as such, in one embodiment, the charging current is a function of and varies in accordance with SOC and SOH.

The predetermined ranges or values may be stored in permanent, semi-permanent or temporary memory. In this regard, the memory may store data, equations, relationships, database and/or look-up table in a permanent, semi-permanent or temporary (for example, until re-programmed) memory of any kind or type (for example, EEPROM, Flash, DRAM and/or SRAM). Moreover, the memory may be discrete or resident on (i.e., integrated in) other circuitry of the present inventions (for example, control circuitry). In one embodiment, the memory may be one-time programmable, and/or the data, equations, relationships, database and/or look-up table of the predetermined range(s) may be stored in a one-time programmable memory (for example, programmed during test or at manufacture). In another embodiment, the memory is more than one-time programmable and, as such, the predetermined ranges or values may be updated, written, re-written and/or modified after initial storage (for example, after test and/or manufacture) via external or internal circuitry.

As mentioned above, in certain embodiments, the adaptive charging circuitry and/or technique may "balance" two considerations in connection with implementing the present inventions including: (i) minimizing and/or reducing total charging time and (ii) maximizing and/or increasing cycle life. Thus, the charging circuitry of the present inventions may implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

Notably, the relaxation time of a battery/cell may be characterized as a decay of the terminal voltage, in response to the termination or removal of a current signal, from a peak terminal voltage to a pseudo-equilibrium voltage level which is relatively constant and preferably within 10% of peak deviation and, more preferably, within 5% of peak deviation. This relaxation time may be a characteristic of the lithium-ion battery/cell that, for current lithium-ion battery/cell technology and chemistries, may vary from, for example, 20 ms to, for example, several minutes. Notably, the terminal voltage of the battery/cell may continue to decay to a full or complete relaxation wherein the voltage of the battery/cell is even more constant (wherein loss of charge is due to, for example, leakage current) and further decay therefrom depends significantly on diffusion.

Figure 9A:
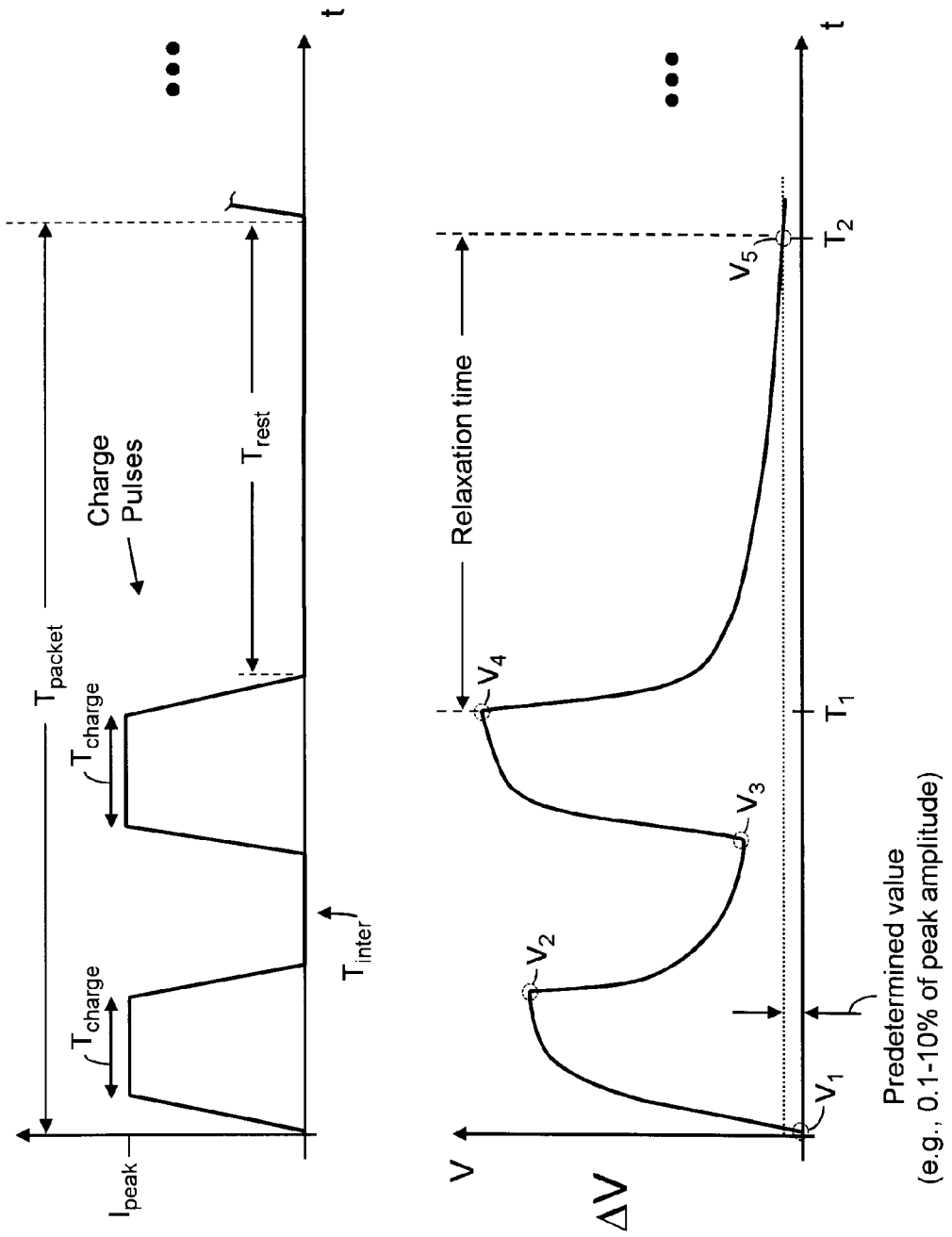
FIG. 9A illustrates an exemplary charge packet having two charge pulses (each including a charging period ($T_{charge}$)) followed by a rest period ($T_{rest}$) wherein the period of the charge packet is identified as $T_{packet}$, according to certain aspects of the present inventions; an exemplary terminal voltage response of the battery/cell to such charge packet is illustrated wherein a first voltage ($V_1$) is identified (which correlates to the beginning of the first charge pulse and, in this embodiment, the beginning of the packet), a second voltage ($V_2$) is identified (which correlates to the end of the first charge pulse and/or the peak of the change in the terminal voltage due to the first charge pulse), a third voltage ($V_3$) is identified (which correlates to the beginning of the second charge pulse), a fourth voltage ($V_4$) is identified (which correlates to the end of the second charge pulse and/or the peak of the change in the terminal voltage due to the second charge pulse) and a fifth voltage ($V_5$) is identified (which correlates to when the terminal voltage of the battery/cell decays to a predetermined value (for example, preferably less than 10% of peak deviation relative to the terminal voltage of the battery/cell when the charge/discharge packet is applied (here, $V_1$) and, more preferably, less than 5% of such peak deviation); wherein the partial relaxation time of the battery/cell due to the exemplary charge packet is the amount of time between (i) the termination/end of the second charge pulse and/or the peak of the change in the terminal voltage due to the second charge pulse and (ii) when the terminal voltage of the battery/cell decays to a predetermined value (for example, preferably less than 10% of peak deviation and, more preferably, less than 5% of peak deviation)

With reference to FIGS. 1A and 9A, in one embodiment, in operation, monitoring circuitry 14 measures or determines the terminal voltage of the battery/cell immediately prior to application of a charging current pulse (identified as ($V_1$) in FIG. 9A). Upon termination of the second current pulse (in this exemplary embodiment), monitoring circuitry 14 measures or determines when the terminal voltage of the battery/cell is at a predetermined value (for example, preferably less than 10% of peak deviation and, more preferably, less than 5% of peak deviation)—(see $V_5$ in FIG. 9A). In this exemplary embodiment, control circuitry 16 calculates, estimates and/or determines the partial relaxation time (for example, continuously, intermittently and/or periodically) based on the amount of time between (i) immediately after termination or application of the second charge pulse and (ii) when the terminal voltage is at a predetermined value. That is, in this embodiment, the partial relaxation time may be characterized as difference between the time corresponding to immediately after termination of the second current pulse ($T_1$) and the time when the terminal voltage is at a predetermined value ($T_2$). Thus, the partial relaxation time of the battery/cell may be characterized as the decay time to the predetermined value (for example, preferably less than 10% of peak deviation and, more preferably, less than 5% of peak deviation).

Figure 10A:
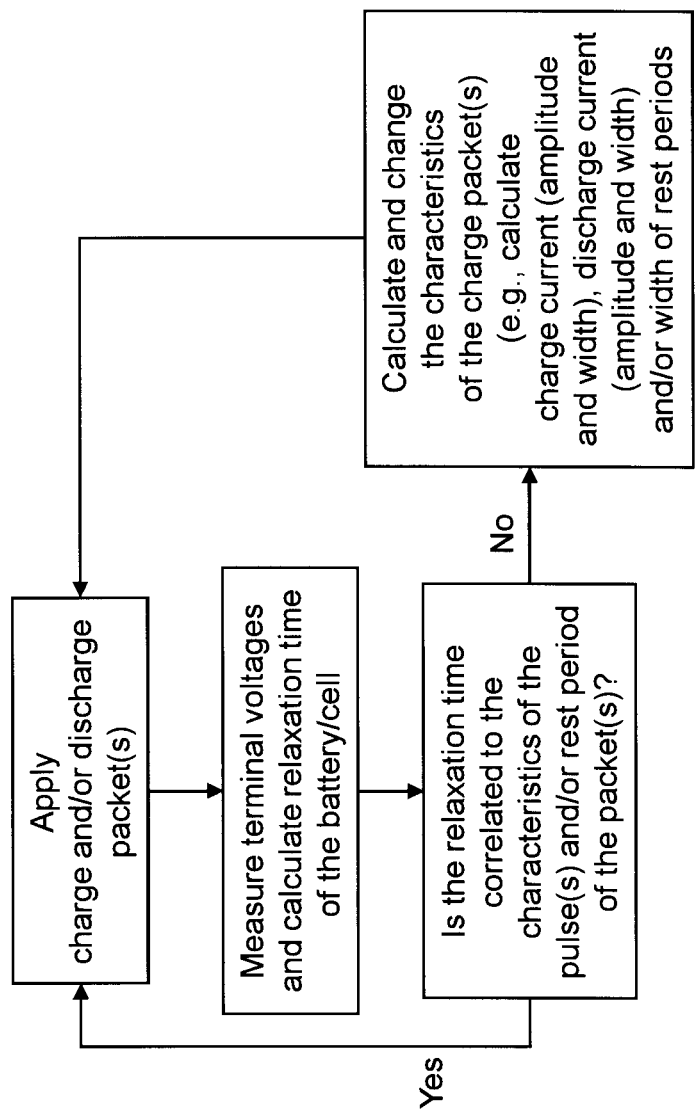
FIGS. 10A-10F are flowcharts of an exemplary processes of determining, adapting and/or controlling the characteristics of a charging current based on, using and/or in accordance with relaxation time of the battery/cell in response to a charge packet (which may include one or more charge pulses and/or one or more discharge pulses) and/or discharge packet (which may include one or more charge pulses and/or one or more discharge pulses), according to certain aspects of the present inventions; wherein the charging techniques and/or circuitry adapt, adjust and/or control one or more characteristics of the charge and/or discharge pulses of one or more charge or discharge packets based on, using and/or in accordance with partial relaxation time of the battery/cell; notably, charging techniques and/or circuitry may employ data which is representative of the partial or full relaxation time to determine, calculate and/or estimate the state of charge of the battery/cell (see, for example, FIGS. 10E and 10F)

With reference to FIG. 10A, in those instances where one or more characteristics of the charge pulse are not correlated to or with the relaxation time of the battery/cell, control circuitry 16 may adjust characteristics of subsequent charge current packet. For example, in one embodiment, control circuitry 16 may adjust the characteristics of subsequent rest period (for example, rest period ($T_{rest}$) of the charge packet—see FIG. 9A) so that a start of successive packets correlates to the relaxation time of the battery/cell (for example, a rest period between successive pulses between successive packets includes a duration that is about equal to or greater than the relaxation time of the battery/cell). In another embodiment, control circuitry 16 may adapt, adjust and/or control one or more characteristics of the charge or discharge pulse(s) of the packet (for example, the shape, peak amplitude, the pulse duration) to correlate to the relaxation time of the battery/cell. In this way, control circuitry 16 adjusts the duration of the rest period and/or the amplitude and/or duration of the charge/discharge pulses of subsequent packets to correlate to a measured relaxation time.

Figure 10B:
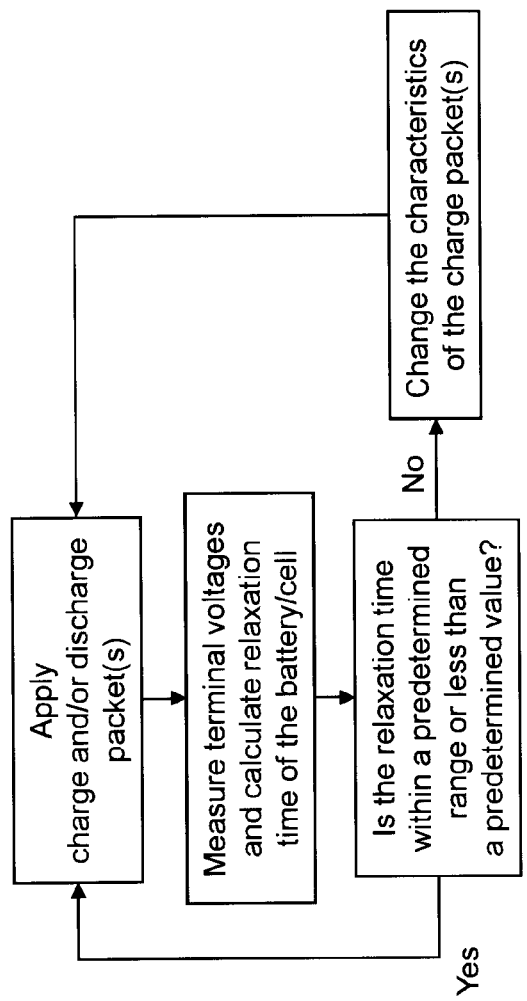

In another embodiment, in addition to the embodiment above, or in lieu thereof, control circuitry 16 (via charging circuitry 12) may adapt, adjust and/or control the relaxation time of the battery/cell to, for example, maintain or provide a relaxation time that is within a predetermined range and/or less than a value or limit during the charging operation. (See, FIG. 10B). In this embodiment, control circuitry 16 may adapt, adjust and/or control one or more characteristics of the charge pulse(s) subsequent packets to manage, maintain, control and/or adjust the relaxation time of the battery/cell to be within a predetermined range and/or less than a value or limit in response to a subsequent charge packet. For example, with reference to FIG. 9A, control circuitry 16 may adjust the pulse shape, pulse amplitude and/or pulse width of one or more of the charge pulses (of a subsequent charge packet), via control of charging circuitry 12, to manage, maintain, control and/or adjust the relaxation time of the battery/cell. In another embodiment, control circuitry 16 may adjust the width of the rest period ($T_{inter}$) between the pulses (of a subsequent charge packet) to manage, maintain, control and/or adjust the relaxation time of the battery/cell.

As indicated above, the relaxation time of the battery/cell may depend on the SOC of the battery/cell, the SOH of the battery/cell, peak charging current and the temperature of the battery/cell. For example, when the SOC of the battery/cell is low and SOH of the battery/cell is relatively healthy, the relaxation time of the battery/cell is shorter relative to when the SOC of the battery/cell is high and SOH of the battery/cell is relatively poor. As such, in one embodiment, the predetermined range and/or value or limit of the relaxation time depends on or correlates to considerations such as the state or status of one or more parameters of the battery/cell including, for example, the SOC, the SOH and/or temperature of the battery/cell. Due to the dependence of the relaxation time on SOC, SOH and peak charging current, control circuitry 16, in one embodiment, may adjust the charging techniques according to the SOC and SOH of the battery/cell, for example, charge the battery/cell at: (i) a higher current and/or shorter relaxation time when the SOC of the battery/cell is low and/or the SOH of the battery/cell is high, and (ii) a lower current and/or longer relaxation time when the SOC of the battery/cell is high and/or the SOH of the battery is low.

The predetermined ranges or values/limits of the relaxation time may be calculated or determined by control circuitry 16 or by other circuitry and processes (for example, circuitry which is "off-device" or "off-chip"). The predetermined range or values/limits may be stored in memory (for example, in a database or look-up table) during manufacture, test or calibration, and accessible to control circuitry 16 during operation. The database or look-up table may correlate the relaxation time to, among other things, the SOC, the SOH and/or temperature of the battery/cell.

With reference to FIGS. 1A, 9B, 10A and 10B, in another exemplary embodiment, the charge packet includes one or more charge and discharge pulses and control circuitry 16 calculates, estimates and/or determines the relaxation time (for example, continuously, intermittently and/or periodically) in a similar manner. Here, monitoring circuitry 14 measures or determines terminal voltage ($V_1$) of the battery/cell immediately prior to application of a charge pulse. Upon termination of the discharge pulse (in this exemplary embodiment), monitoring circuitry 14 measures or determines when the terminal voltage of the battery/cell is at a partial predetermined value—see $V_5$ in FIG. 9B. In this exemplary embodiment, control circuitry 16 calculates, estimates and/or determines the partial relaxation time based on the amount of time between the immediately after application of the discharge pulse and when the terminal voltage is at a predetermined value (for example, preferably less than 10% of peak deviation and, more preferably, less than 5% of peak deviation). Here, the partial relaxation time may be characterized as the temporal difference between the time corresponding to immediately after terminating the discharge pulse ($T_1$) and the time when the terminal voltage is at a predetermined value ($T_2$). Again, the partial relaxation time of the battery/cell may be characterized as the decay time to the predetermined value.

Thus, control circuitry 16 may calculate, estimate and/or determine the relaxation time (for example, continuously, intermittently and/or periodically). In response thereto, control circuitry 16 may adjust characteristics of subsequent charge current packet in accordance with or using data which is representative of the relaxation time. For example, with reference to FIG. 10A, in those instances where one or more characteristics of the charge packet are not correlated to or with the relaxation time of the battery/cell, control circuitry 16 may adjust characteristics of subsequent charge packet. In one embodiment, control circuitry 16 may adjust the characteristics of subsequent rest period (for example, rest period ($T_{rest}$) of the charge packet—see FIG. 9B) so that a start of successive packets correlates to the relaxation time of the battery/cell (for example, a rest period between successive pulses between successive packets includes a duration that is about equal to or greater than the relaxation time of the battery/cell). In another embodiment, control circuitry 16 may adapt, adjust and/or control one or more characteristics of the charge pulse and/or discharge pulse of the packet to correlate to a relaxation time of the battery/cell. For example, in one embodiment, control circuitry 16 may adjust the amplitude and duration of the discharge pulses so that the relaxation time is within a predetermined range and/or less than a predetermined value.

In addition to the embodiment above, or in lieu thereof, control circuitry 16 (via charging circuitry 12), may adapt, adjust and/or control the relaxation time of the battery/cell to, for example, maintain or provide a relaxation time that is within a predetermined range and/or less than a value or limit during one or more portions (or all) of the charging operation. (See, FIG. 10B). In this embodiment, control circuitry 16 may adapt, adjust and/or control one or more characteristics of the charge pulse(s) subsequent packets to manage, maintain, control and/or adjust the relaxation time to be within a predetermined range and/or less than a value or limit in response to a subsequent charge packet. For example, with reference to FIG. 9B, control circuitry 16 may adjust the pulse amplitude and/or pulse width of the charge pulse and/or discharge pulse (of a subsequent charge packet), via control of charging circuitry 12, to manage, maintain, control and/or adjust the relaxation time of the battery/cell. In addition thereto, or in lieu thereof, in another embodiment, control circuitry 16 may adjust the width of the rest period ($T_{inter}$) between the charge and discharge pulses (of a subsequent charge packet) to manage, maintain, control and/or adjust the relaxation time of the battery/cell. In this way, control circuitry 16 may manage or control the relaxation time of the battery/cell and thereby manage or control the time of the overall charging operation.

In addition thereto, in one embodiment, control circuitry 16 may adjust the characteristics of the charge pulse and/or discharge pulse (for example, amplitude and/or duration of such pulse(s)) to control or adjust the relaxation time as well as the rate, shape and/or characteristics of the decay of the terminal voltage of the battery/cell. (See, for example, FIG. 9B). Here, control circuitry 16 may adapt, adjust and/or control one or more characteristics of the charge pulse and/or discharge pulse of the packet (via control of charging circuitry 12) to adjust or control "overshoot" or "undershoot" of the decay of the terminal voltage to partial equilibrium relative to the predetermined value (for example, preferably less than 10% of peak deviation and, more preferably, less than 5% of peak deviation).

Figure 10C:
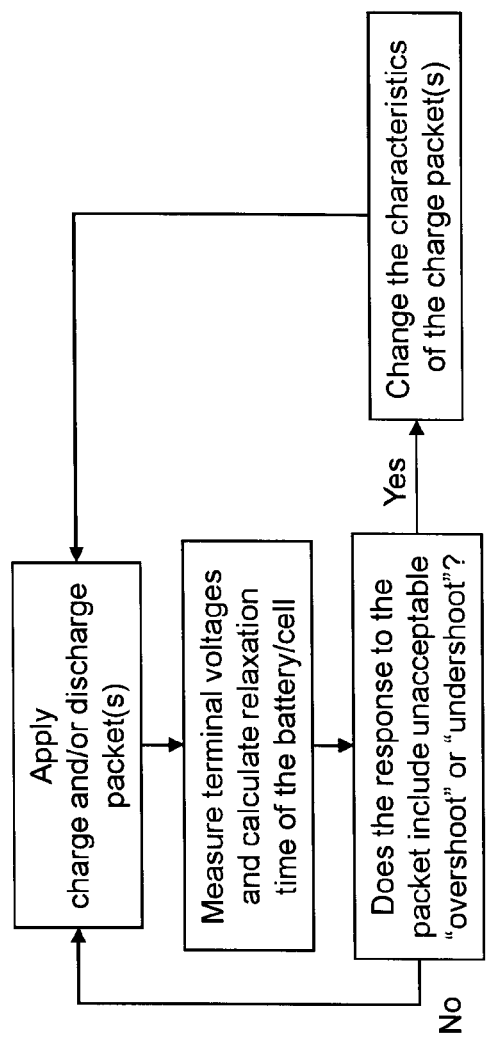
Figure 11:
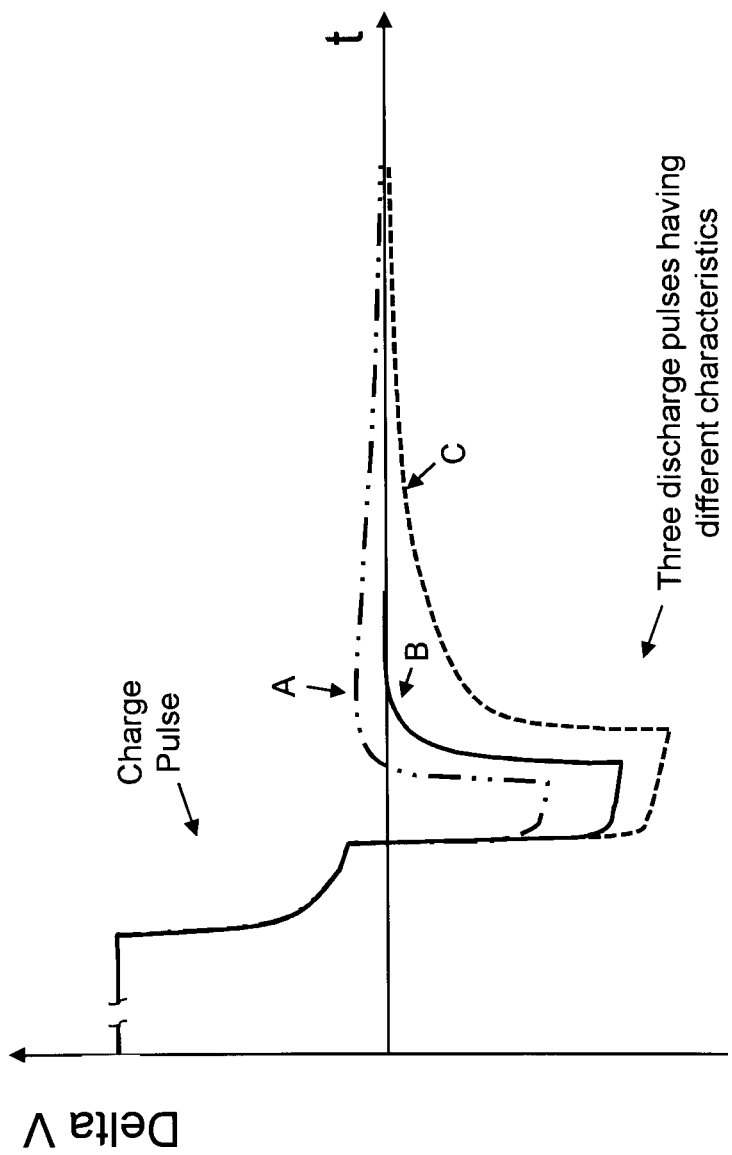
FIG. 11 is an illustration depicting three responses to a charge packet having a charge pulse (which injects charge into the battery/cell) and a discharge pulse (which removes charge from the battery/cell) wherein a first response (A) includes a significant "overshoot" whereby the discharge pulse removed too little charge from the battery/cell, a second response (B) that include no significant "overshoot" or "undershoot" wherein the discharge pulse removes a suitable amount of charge which provides the fastest partial relaxation time of the three responses, and a third response (C) includes a significant "undershoot" whereby the discharge pulse removed is too much charge from the battery/cell.

For example, with reference to FIG. 11, control circuitry 16 may adapt, adjust and/or control the amplitude and pulse width of the discharge pulse to reduce or minimize the "overshoot" or "undershoot" of the decay of the terminal voltage of the battery/cell. In this regard, where the charge process provides an "overshoot" of the decay of the terminal voltage of the battery/cell relative to partial equilibrium (see discharge pulse A), control circuitry 16 may instruct charging circuitry 12 to adjust the characteristics of the discharge pulse and increase the amount of charge removed by the discharge pulse (for example, via increasing the amplitude and/or pulse width of the discharge pulse). Where, however, the charge process provides an "undershoot" of the decay of the terminal voltage of the battery/cell relative to partial equilibrium (see discharge pulse C), control circuitry 16 may instruct charging circuitry 12 to decrease the amount of charge removed by the discharge pulse (for example, via decreasing the amplitude and/or pulse width of the discharge pulse). As such, control circuitry 16 may adjust the characteristics of the discharge pulse of a subsequent charge packet (for example, the amplitude, pulse width and/or pulse shape) to control or adjust rate, shape and/or characteristics of the decay of the terminal voltage of the battery/cell. (See, for example, FIG. 10C). In this way, the relaxation time of the battery/cell, and the rate, shape and/or characteristics of the decay of the terminal voltage of the battery/cell, correlates to the characteristics of subsequent charge packets and/or the is within a predetermined range and/or less than a predetermined value.

In addition thereto, or in lieu thereof, in one embodiment, control circuitry 16 may adjust the characteristics of the packet (for example, amplitude and/or duration of the charge pulses and/or discharge pulses and/or the duration of the rest period) to control or adjust (i) the relaxation time of the battery/cell and (ii) the rate, shape and/or characteristics of the decay of the terminal voltage of the battery/cell. (See, for example, FIGS. 9B, 10D and 11). Importantly, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

Notably, in one embodiment, control circuitry 16 (implementing an adaptive charging algorithm) may evaluate relaxation time of the battery/cell in response to different peak charging and discharging currents (and/or pulse widths) to determine an optimal, suitable, predetermined and/or desired amount of time and rate, shape and/or characteristics of the decay of the terminal voltage of the battery/cell. For example, control circuitry 16, via instructions to charging circuitry 12, applies charge and/or discharge packets (having different attributes—for example, different amplitudes and/or pulse widths of a trailing discharge pulse). The monitoring circuitry 14 measures or monitors the response to such packets and control circuitry 16 evaluates the relaxation time of the battery/cell, and/or the rate, shape and/or characteristics of the decay of the terminal voltage of the battery/cell. In response, control circuitry 16 may instruct charging circuitry 12 to generate and apply charge and/or discharge packets having the appropriate characteristics. In addition thereto, or in lieu thereof, charging circuitry 12 may also select the characteristics of the packets from a look-up table that associates or correlates the peak charging or discharging current with the SOC and SOH of the battery/cell.

There are many techniques to control or adjust the partial relaxation time—including, for example, controlling or adjusting the characteristics of the charge/discharge pulse packet as mentioned above (for example, the duration of the rest period(s) and/or the amplitude, shape and/or width of the pulses). Not all such techniques also minimize or reduce the charge time of the charging process while simultaneously utilizing the maximum charge capacity of the cell/battery (in other words, using 100% depth of discharge of the cell/battery). Indeed, not all of these techniques minimize or reduce the charge time of the charging process increase or maximize cycle life of the battery/cell. This notwithstanding, the present inventions are directed to all such techniques whether or not the techniques control or adjust relaxation time to (i) increase or maximize cycle life of the battery and (ii) reduce or minimize the time of the charging or recharging process.

As noted above, control circuitry 16 may continuously, intermittently and/or periodically adapt, adjust and/or control one or more characteristics of the charge and/or discharge packet to adapt, adjust and/or control a relaxation time of the battery/cell, for example, to be less than a value or limit during charging. Here, control circuitry 16 may continuously (for example, on a packet-by-packet basis), intermittently (which may be on an event basis—for example, the relaxation time of the battery/cell is "inconsistent" with other data, characteristics or parameters of the battery/cell (for example, the SOC, the SOH, overpotential or full relaxation time and/or the voltage at the terminals of the battery/cell during charging)) and/or periodically (on a number of packets basis and/or on a number of seconds or minutes basis) adapt, adjust and/or control one or more characteristics of the packet via adapting, adjusting and/or controlling the shape, amplitude, temporal width of the pulse(s) of the subsequent packet(s), and/or the temporal width of one or more rest periods of the subsequent packet(s).

In addition thereto, or in lieu thereof, monitoring circuitry 14 and control circuitry 16 may continuously, intermittently and/or periodically measure and calculate a relaxation time of the battery/cell during charging. Here, monitoring circuitry 14 measures and/or monitors the terminal voltage of the battery/cell (according to the various embodiments herein) and, based thereon, control circuitry 16 calculates and/or determines the relaxation time of the battery/cell.

Figure 10D:
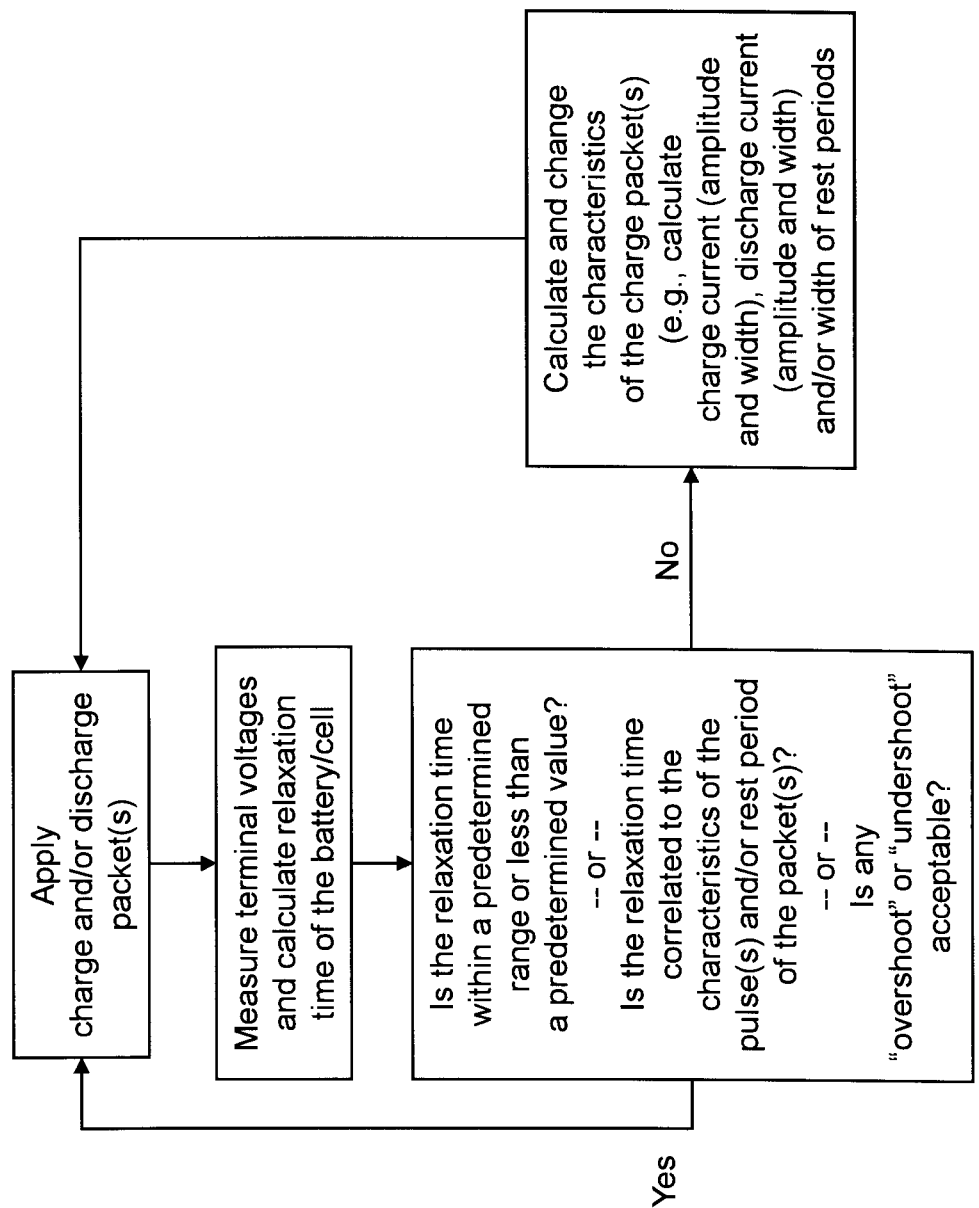
Figure 10E:
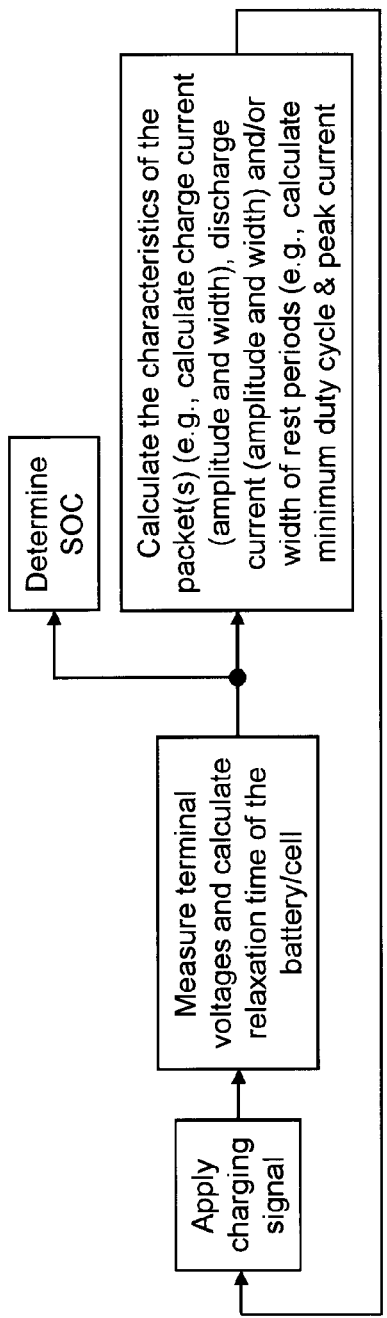
Figure 10F:
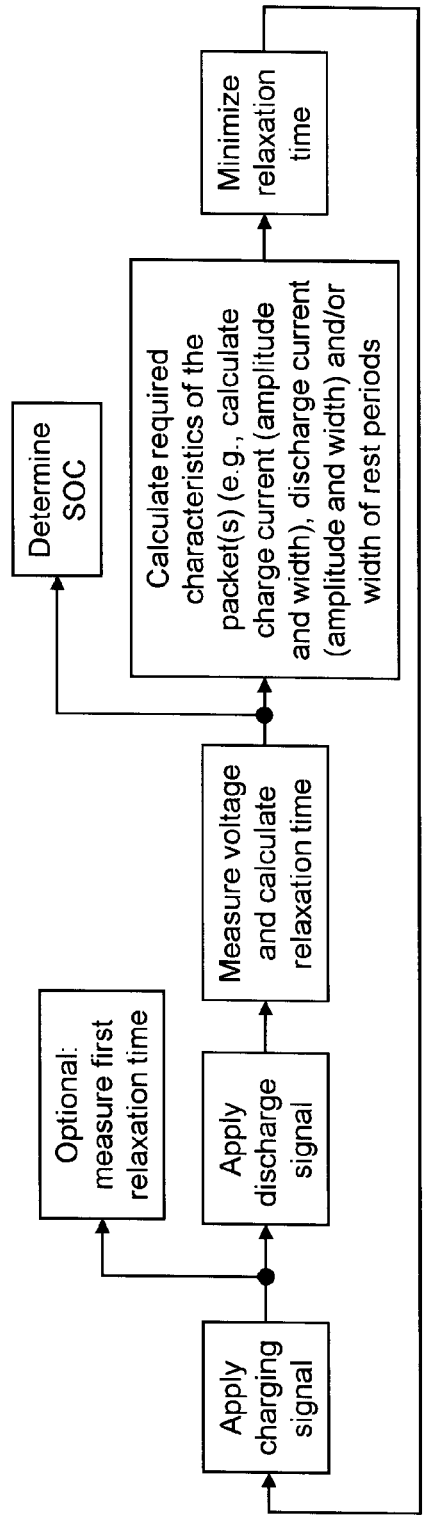

Notably, control circuitry 16 may also calculate and/or determine the SOC and SOH of the battery/cell based on or using data which is representative of the relaxation time of the battery/cell and/or terminal voltage (and/or change in terminal voltage in response to charging). (See, the U.S. Provisional Patent Applications). For example, in the context of the SOC, as the battery/cell is charged, its SOC increases. The control circuitry 16 detects, determines, calculates and/or measures the SOC of the battery/cell, and, in response, control circuitry 16 (via implementation of the adaptive charging algorithm) may adaptively increase the rest period of the packet to match or correlate the rest period to the increasing relaxation time of the battery/cell. (See, for example, FIGS. 10E and 10F). In addition thereto, or in lieu thereof, control circuitry 16 may adaptively adjust (via controlling charging circuitry 12) other characteristics of the packet (for example, the amplitude of the charge and/or discharge pulse, the duration or width of the pulses and/or shape of the pulses) to change, adjust, control and/or vary the relaxation time of the response of the battery/cell to match or correlate the rest period to the increasing relaxation time. For example, in one embodiment, control circuitry 16 may adaptively increase the rest period to match the increasing relaxation time, and may adaptively decrease the peak current of the charge and/or discharge pulse.

Figure 12:
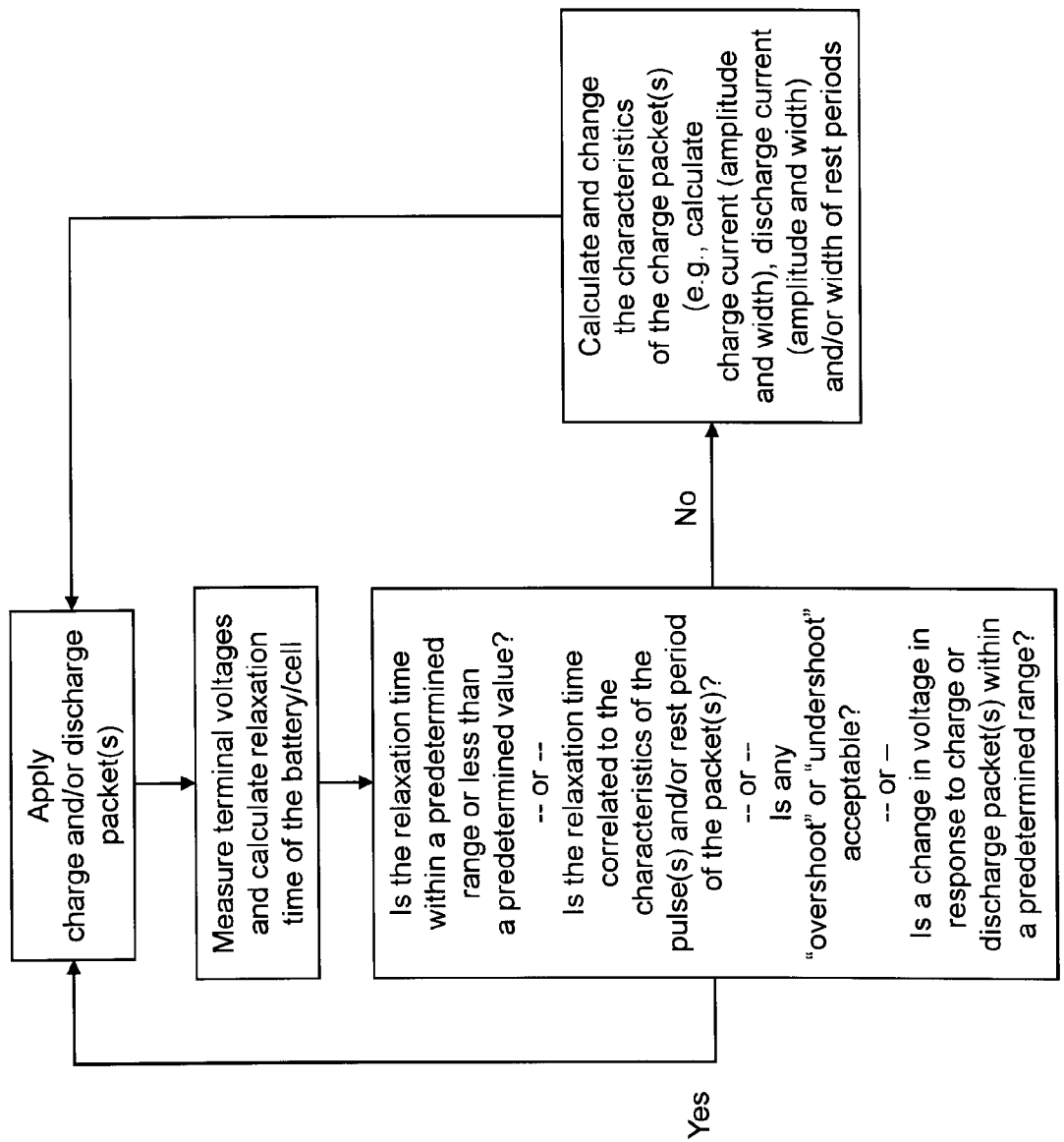
FIG. 12 is a flowchart of an exemplary process of determining, adapting and/or controlling the characteristics of a charging current based on, using and/or in accordance with (i) a change in voltage at the terminals of the battery/cell in response to a charge or discharge packet (which may include one or more charge pulses and/or one or more discharge pulses) and (ii) partial relaxation time of the battery/cell in response to a charge or discharge packet, according to certain aspects of the present inventions; wherein the charging techniques and/or circuitry adapt, adjust and/or control one or more characteristics of the charge and/or discharge pulses of one or more charge or discharge packets based on, using and/or in accordance with a change in voltage at the terminals of the battery/cell in response to one or more packets and the partial relaxation time of the battery/cell in response to such one or more packets.

Here, by decreasing the peak current of the charge signal, control circuitry 16 may decrease the relaxation time of the battery/cell. Alternatively, control circuitry 16 (via implementation of the adaptive charging technique) may adaptively adjust the duty cycle of the charge signal to increase the relaxation time of the battery/cell. The resulting net effective charging current tends to have a peak when the SOC of the battery/cell is low (close to zero) and may gradually decrease until it reaches its lowest value when the SOC of the battery/cell is high (for example, above 80%). (See, for example, FIG. 7). Notably, as mentioned above, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For example, in another aspect of the present inventions, the control circuitry may adapt, adjust and/or control one or more characteristics of the charging process in accordance with or using (i) the change in terminal voltage of the battery/cell is within a predetermined range and (ii) the relaxation time of the battery/cell. (See, FIG. 12). In this embodiment, the control circuitry calculates an adjustment in one or more characteristics of a subsequent charge packet (for example, the amplitude and/or duration of a discharge pulse, and/or the duration of a rest period) in accordance with or using (i) the change in terminal voltage of the battery/cell in response to a preceding packet (as described in any of the embodiments set forth herein) and (ii) the relaxation time of the battery/cell (as described in any of the embodiments set forth herein).

For example, where the relaxation time is not correlated to one or more characteristics of the charging process (for example, the relaxation time is too long relative to the rest period) the control circuitry calculates an adjustment in one or more characteristics of a subsequent charge packet (for example, the amplitude and/or duration of a discharge pulse, and/or the duration of a rest period). The control circuitry implements the adjustment, via control of the charging circuitry, provided such adjustment does not adversely impact change in terminal voltage of the battery/cell (i.e., the change in terminal voltage of the battery/cell is or remains within a predetermined range). In this way, the control circuitry, upon detecting (i) a change in terminal voltage of the battery/cell in response to a charge/discharge packet that is outside a predetermined range and/or (ii) the relaxation time of the battery/cell is outside a predetermined range and/or less than a value or limit during the charging (for example), the charging circuitry calculates and implements changes to one or more characteristics of the charging process so that the change in voltage and the relaxation time constraints are satisfied.

As intimated above, the control circuitry may employ the data which is representative of the terminal voltage of the battery/cell and/or relaxation time of the battery/cell to obtain, measure, monitor, calculate, estimate the SOC of the battery/cell. In one embodiment, the control circuitry calculates, estimates, measures and/or determines the relaxation time of the battery to one or more charge or discharge pulse and, based thereon, calculates, estimates and/or determines the SOC of the battery/cell. Here, the data which is representative of the relaxation time may correlate to the amount of charge added to the battery/cell in response to the application of one or more charging pulses, SOC of the battery/cell, and the temperature of the battery/cell. Using data corresponding to or representative of the relaxation time for a given charge pulse or pulses, and temperature of the battery, circuitry (whether on-device or off-device) may derive, determine, calculate, generate and/or obtain the correlation of the relaxation time to the SOC of the battery/cell. In one embodiment, a functional relationship or look-up table may be determined, calculated, generated and/or obtained which correlates a measured relaxation time to the SOC of the battery/cell. The correlation of the relaxation time to the SOC of the battery/cell (for example, the aforementioned relationship or look-up table) may be employed by the control circuitry (and techniques implemented thereby) to, for example, adapt the charge profile of the battery/cell based on or using the SOC of the battery/cell to, for example, alleviate, minimize and/or reduce the adverse impact of the charging operation on the SOH of the battery/cell and increase, improve and/or maximize cycle life of the battery/cell.

In addition thereto, or in lieu thereof, the control circuitry may calculate, estimate and/or determine the SOC of the battery/cell using data which is representative of the change in terminal voltage of the battery/cell to one or more charge pulse. Using data corresponding to or representative of the characteristics (for example, peak amplitude) of the voltage change (for example, increase) to one or more charge pulse, the control circuitry may derive, determine, calculate, generate and/or obtain the correlation of a peak amplitude of the voltage change to the SOC of the battery/cell. In one embodiment, a functional relationship or look-up table may be determined, calculated, generated and/or obtained which correlates a peak amplitude of the voltage change to the SOC of the battery/cell. The correlation of the peak amplitude of the voltage change to the SOC of the battery/cell (for example, the aforementioned relationship or look-up table may be employed to adapt the charge operation of the battery/cell based on or using the SOC of the battery—for example, using the techniques described herein.

In one exemplary embodiment, circuitry and techniques of this aspect of the present inventions apply a charging current pulse with a finite current and finite duration to the battery/cell. For example, the amplitude of the current pulse may be 0.5 C to 2 C, and the duration can vary from 10 ms to 500 ms. Indeed, such a charge pulse may be generated via a current source with temporal control over its output (e.g., a switch). The charge pulse may be rectangular or of another shape. The current is measured over its duration, and the charge is computed by integrating the current over that time duration. Notably C-rate is a measure of the current rate through a battery/cell; that is, a 1 C is a current equivalent to dividing the charge capacity of the battery/cell by 1 hr. For example, 1 C is equivalent to 2.5 A for a 2.5 A.h. battery/cell; 0.5 C is equal to 1.25 A.

The terminal voltage of the battery/cell may be measured by monitoring circuitry (for example, using a sampling period that is substantially shorter than the range of anticipated relaxation times of the battery/cell—for example, the sampling period may be between 0.1 ms to 1000 ms and preferably between 1 to 100 ms). In one embodiment, the relaxation time is measured by the difference between this relaxing voltage and the terminal voltage of the battery/cell immediately prior to the application of the charging pulse (which is assumed to be when the cell is in partial equilibrium).

The relaxation time of the battery may be measured using any circuitry or technique now known or later developed, all of which are intended to fall within the scope of the present inventions. For example, in one embodiment, the relaxation time may be measured when the relaxing voltage difference drops below a predetermined threshold, for example 1 mV. This threshold value may be higher and can vary from 0.1 mV to 20 mV. In another possible approach, the slope of the voltage with time can be computed, and compared to a threshold to estimate a relaxation time. In yet another approach, the relaxation time may be estimated or determined by observing the difference of voltage drop by a known ratio, such as 1/e. In yet another embodiment, the relaxation time is the amount of time for the battery to achieve equilibrium. All such approaches, and extensions of such approaches, serve to define a time extent characterized by the decaying voltage curve which is relaxation time.

The determination of the relaxation time as well as partial equilibrium may be absolute (a predetermined amount of voltage) or relative (for example, within a predetermined percentage or range). Moreover, the relaxation time of the battery/cell may be based on one measurement—for example, one charge pulse may be applied to the cell's terminal, and the relaxation time measured. The relaxation time may be based on a plurality of measurements—for example, the measurement may be repeated several times (for example, sequentially) and thereafter the measurements averaged. As such, the relaxation time may be based on an average of a plurality of measurements. Any form of averaging now known or later developed; all of which are intended to fall within the scope of the present inventions. For example, the control circuitry may employ discrete or mutually exclusive groups of packets or "rolling" averages. Again, all forms of averaging and averaging techniques are intended to fall within the scope of the present inventions.

Notably, the measurement of the relaxation time may be performed intermittently (for example, in response to a change in operating conditions (for example, temperature), periodically or continuously. For example, the measurement of the relaxation time may be performed at regular time intervals to correspondingly determine the SOC of the battery/cell. These intervals may vary from one second to one or more minutes. Additionally, the SOC of the battery/cell may be determined at any time—for example, during normal operation (in situ) or during charging operation. Indeed, since the duration of the measurement is relatively short (ranging from tens of milliseconds to a few seconds), the system may determine, calculate, estimate and/or obtain the relaxation time of the battery (which may be correlated to the SOC of the battery) during normal operation without disrupting the normal operation of the cell. For example, where the battery/cell is incorporated into a laptop computer, the main processor may choose to insert these measurements at moments it deems the laptop to be in idle or near idle.

As noted above, in another embodiment, measurements of the relaxation time may be performed while the battery/cell is either being charged or being discharged. In a charging configuration, the charging may be interrupted for a few seconds to allow the battery/cell to relax to an equilibrium voltage, then the charging pulse is applied, and the relaxation time is subsequently measured. A similar approach is applied if the battery/cell is discharging.

Figure 13A:
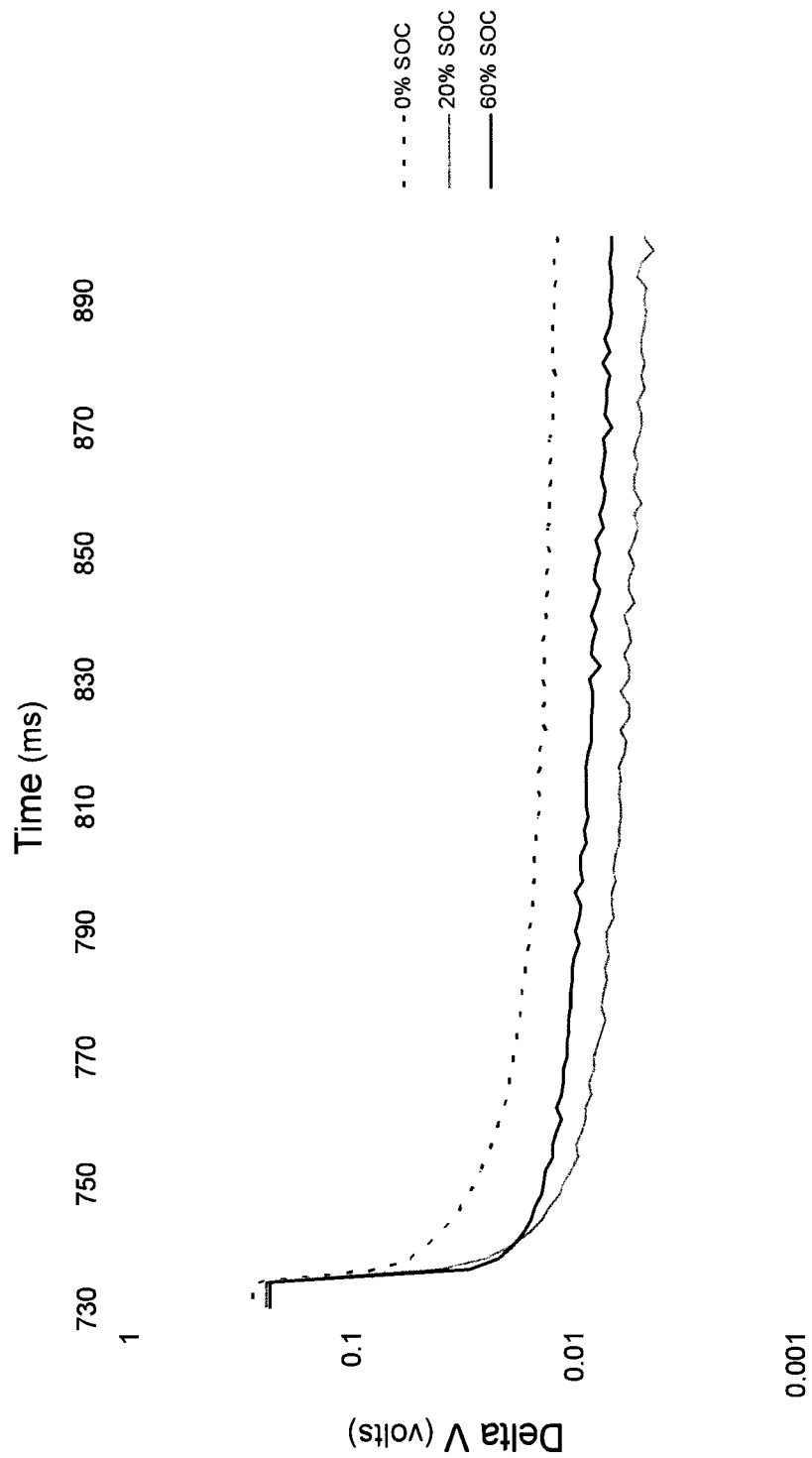
FIG. 13A illustrates the partial relaxation of the terminal voltage of the battery/cell following the application of a charging current pulse based on or at three different states of charge values of an exemplary battery/cell (a commercial lithium oxide cobalt cell rated at 2.5 A.h); notably, the relaxation curves are distinctly different; a 4.20 A-current pulse is 734 ms in duration; the voltage difference is measured relative to a "resting" open circuit voltage immediately preceding application of the current pulse to the battery/cell.
Figure 13B:
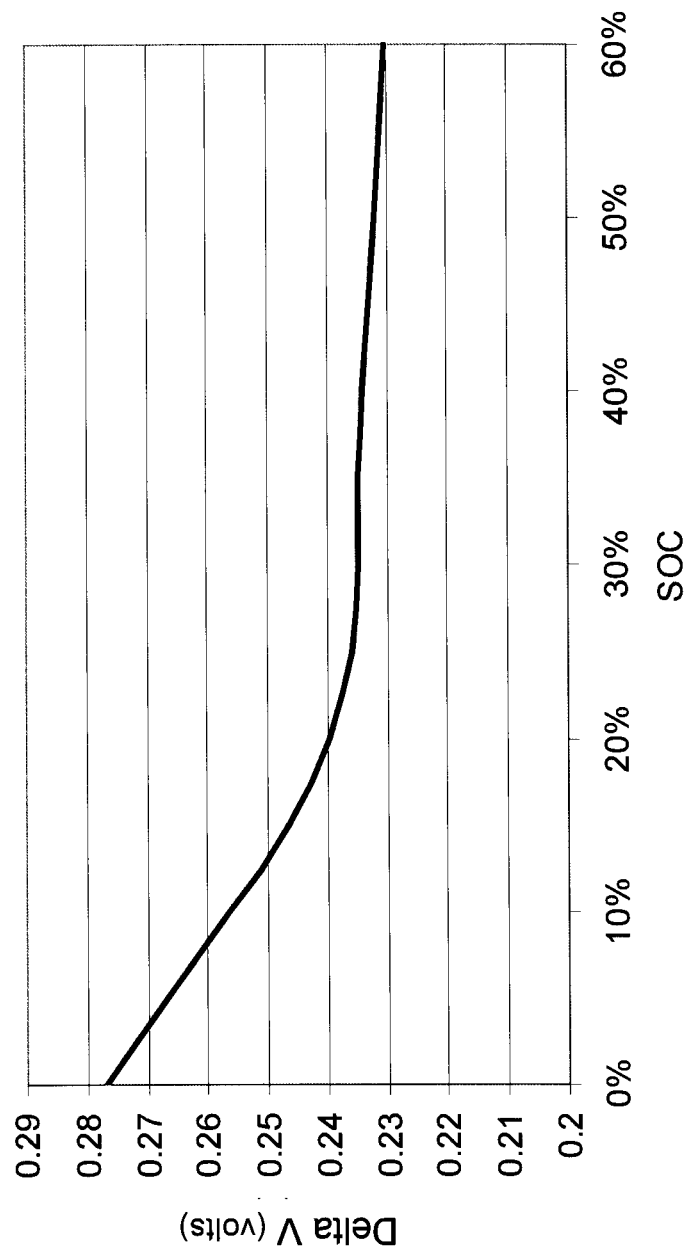
FIG. 13B illustrates the peak increase in voltage of the battery/cell described in FIG. 13A, following the application of a 2.5-A, 734 ms pulse, as a function of the state of charge of the battery/cell.

In addition to determining the SOC of the battery/cell based on or using relaxation time measurements, or in lieu thereof, the monitoring circuitry may also measure data which is representative of the characteristics (for example, peak amplitude) of the voltage increase to one or more charge pulse and, based thereon, the control circuitry may determine the SOC of the battery/cell. For example, the peak voltage rise which is responsive to the application of a current pulse of finite duration may be employed as an additional or alternate measure of SOC. The peak voltage of the battery/cell in response to a charge pulse may be dependent on the SOC of the battery/cell (See, FIGS. 13A and 13B).

Notably, all of the exemplary embodiments discussed herein in connection with relaxation time are entirely applicable to determining the SOC based on or using data which is representative of the characteristics (for example, peak amplitude) of the voltage change (for example, increase) to one or more charge pulse. For example, the measurement of the characteristics (for example, peak amplitude) of the voltage increase to one or more charge pulse may be performed intermittently (for example, in response to a change in operating conditions (for example, temperature), periodically or continuously. Moreover, the peak amplitude measurement may be based on one or more measurement—for example, one charge pulse may be applied to the cell's terminal, and the peak amplitude measured. The measurement may be repeated several times sequentially and thereafter the measurements averaged. Thus, for the sake of brevity, such exemplary embodiments in the context of determining the SOC based on or using data which is representative of the characteristics (for example, peak amplitude) of the voltage change (for example, increase) to one or more charge pulse will not be repeated.

Further, using data of the characteristics of the voltage change (for example, increase in peak amplitude) to one or more charge pulse, the circuitry and techniques of this aspect of the inventions may derive, determine, calculate, generate and/or obtain a correlation of the voltage change to the SOC of the battery. In one embodiment, a functional relationship or look-up table may be determined, calculated, generated and/or obtained which correlates a measured peak amplitude to the SOC of the battery/cell. The correlation of the voltage change to the SOC of the battery/cell (for example, the aforementioned relationship or look-up table) may be employed by circuitry and/or techniques of the present inventions to adapt the charging profile of the battery/cell based on or using the SOC of the battery/cell to, for example, alleviate, minimize and/or reduce the adverse impact of the charging operation on the state of the health of the battery and increase, improve and/or maximize cycle life of the battery/cells.

Notably, all of these embodiments may be thought of as various implementations of pinging or interrogating the battery/cell with a short current pulse of known current and duration, and monitoring the cell's signature voltage (akin listening to its echo). The voltage signature has a peak voltage signature and a decay time constant, both characteristically dependent on SOC, and hence can be used independently or jointly to measure SOC of the battery/cell.

Moreover, the current pulse of the charge and/or discharge packets may also be employed ping or interrogate the battery with a short current pulse of known current and duration, and monitoring the terminal voltage of the battery/cell). Again, the voltage signature has a peak voltage signature and a decay time constant, both characteristically dependent on SOC, and hence may be used independently or jointly to measure, determine and/or estimate SOC.

As mentioned herein, the relaxation time and/or the change in terminal voltage of the battery/cell may depend on the SOH of the battery/cell. The present inventions may employ any technique and/or circuitry, whether now known or later developed, to estimate, calculate, measure and/or determine the SOH (and/or changes therein) of a battery/cell—including the techniques and/or circuitry described herein. (See, FIGS. 1A-1C). In one embodiment, the circuitry and techniques may estimate, calculate, measure and/or determine the SOH of the battery/cell using or based on a relaxation time or relaxation time constant. Briefly, in operation, such circuitry and techniques apply a charging and/or discharging signal(s) (for example, of short duration) to the battery/cell. The circuitry and techniques measure, assess and/or sample the voltage at the terminals of the battery/cell to estimate, calculate, measure and/or determine the relaxation time. Using or based on the relaxation time (which may be is a direct measure of the carrier (ion) transport dynamics between the two electrodes of the battery), the circuitry and techniques estimate, calculate, measure and/or determine the SOH of the battery/cell.

Figure 9B:
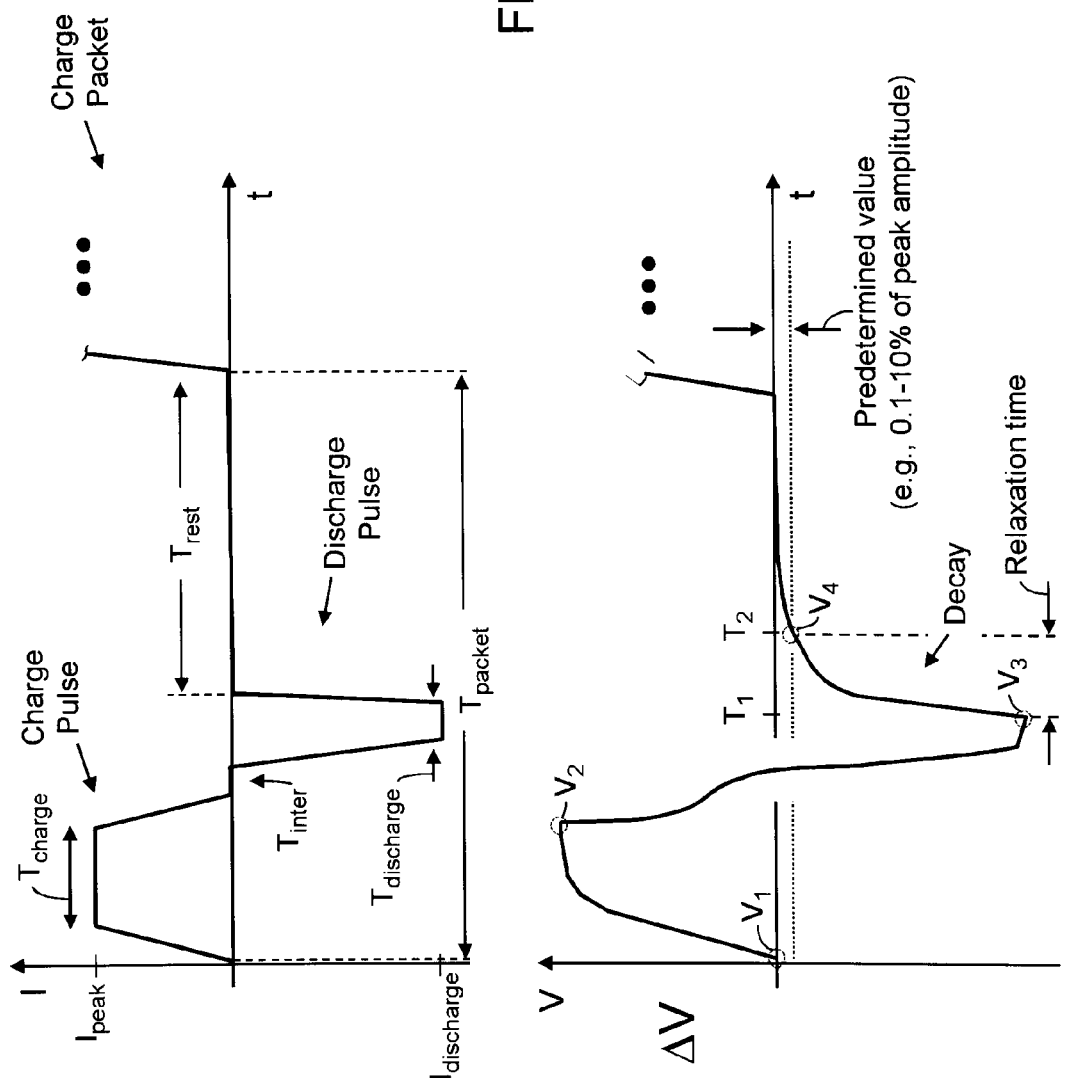
FIG. 9B illustrates an exemplary charge packet having a charge pulse (which injects charge into the battery/cell) and a discharge pulse (which removes charge from the battery/cell) wherein the charge pulse includes a charging period ($T_{charge}$) and the discharge pulse includes a discharging period ($T_{discharge}$), according to certain aspects of the present inventions; notably, in this exemplary charge packet, an intermediate rest period ($T_{inter}$) is disposed between the charge and discharge pulses, and a rest period ($T_{rest}$) is disposed after the discharge pulse and before the next packet; an exemplary terminal voltage response of the battery/cell to such charge packet is illustrated wherein a first voltage ($V_1$) is identified (which correlates to the beginning of the charge pulse and, in this embodiment, the beginning of the packet), a second voltage ($V_2$) is identified (which correlates to the end of the charge pulse and/or the peak of the change in the terminal voltage due to the charge pulse), a third voltage ($V_3$) is identified (which correlates to the end of the discharge pulse and/or the peak of the change in the terminal voltage due to the discharge pulse) and a fourth voltage ($V_4$) is identified (which correlates to when the terminal voltage of the battery/cell decays to a predetermined value (for example, preferably less than 10% of peak deviation relative to the terminal voltage of the battery/cell when the charge/discharge packet is applied (here, $V_1$) and, more preferably, less than 5% of peak deviation); wherein the relaxation time of the battery/cell due to the exemplary charge packet is the amount of time between (i) the termination/end of the discharge pulse and/or the peak of the change in the terminal voltage due to the discharge pulse (see, $V_3$ and $T_1$) and (ii) when the terminal voltage of the battery/cell decays to a predetermined value (for example, preferably less than 10% of peak deviation and, more preferably, less than 5% of peak deviation) (see, $V_4$ and $T_2$); notably, as discussed in detail herein, one, some or all of the characteristics of the charge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combination or permutations of pulse, pulse characteristics, periods, packets and signal characteristics and configurations are intended to fall within the scope of the present inventions; moreover, discharge packets may have similar characteristics as charge packets except, however, a net charge is removed from the battery/cell; for the sake of brevity, the discussion/illustration with respect to discharge packet will not be repeated.
Figure 9C:
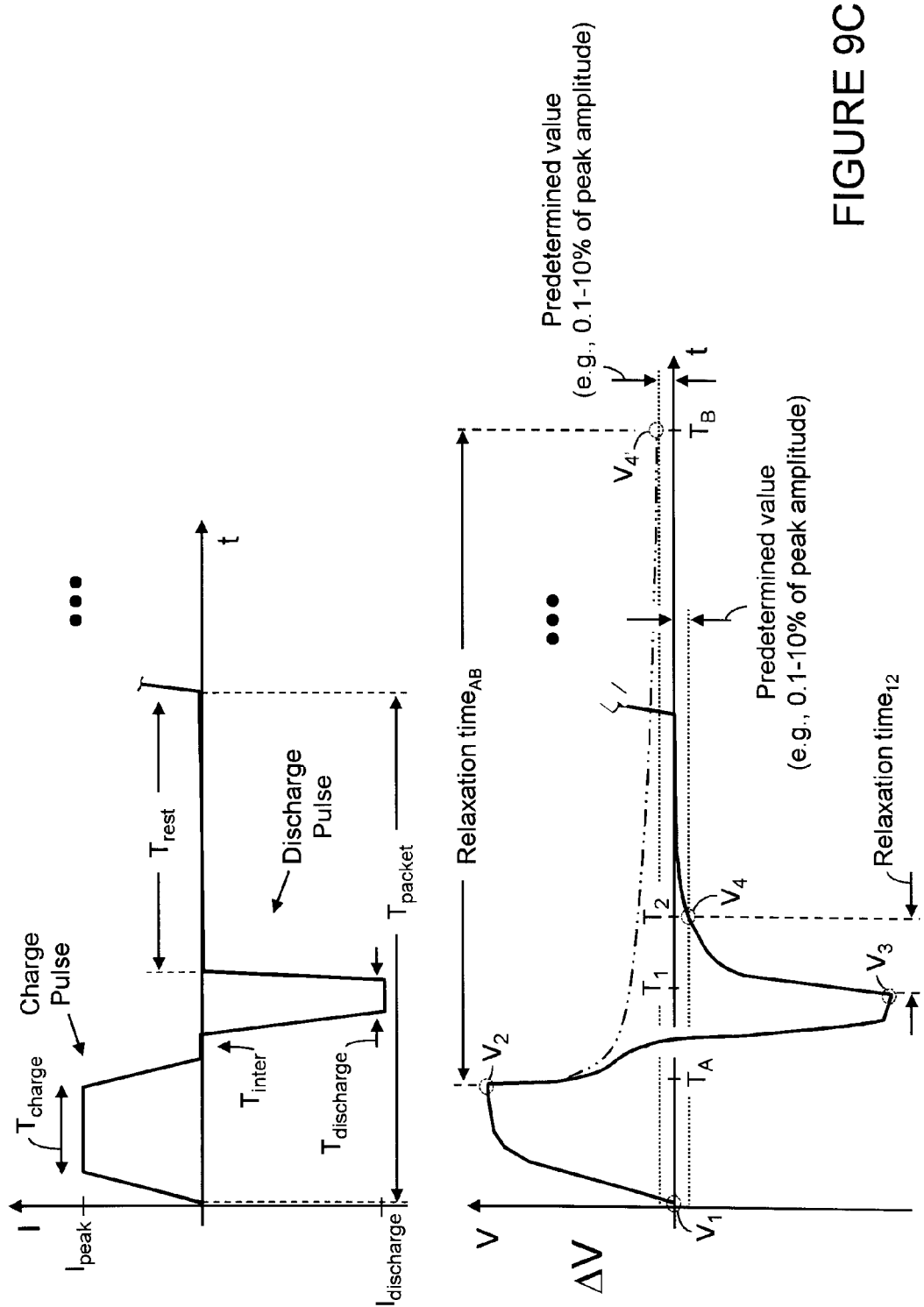
FIG. 9C illustrates an exemplary charge packet like that of FIG. 9B wherein the packet includes a charge pulse (which injects charge into the battery/cell) and a discharge pulse (which removes charge from the battery/cell) wherein the charge pulse includes a charging period ($T_{charge}$) and the discharge pulse includes a discharging period ($T_{discharge}$), according to certain aspects of the present inventions; in this illustration, a partial relaxation time corresponding to the charge pulse of the packet is also depicted (see, Relaxation time$_{AB}$) wherein the relaxation time associated with the charge pulse is equal to the difference between $T_A$ (which coincides with $V_2$) and $T_B$ (which coincides with $V_{4'}$); notably, the relaxation time of the battery/cell in response to the charge packet having a charge pulse and discharge pulse may be shorter than the relaxation time of the battery/cell in response to the charge packet not having a discharge pulse (compare $\Delta T_{BA}$ and $\Delta T_{21}$) and, as such, under certain circumstances, the total charging time of a charging sequence employing packets having charge and discharge pulses may be shorter than the charging time of a charging sequence employing packets having no discharge pulses to shorten or reduce the relaxation time.

In one embodiment, the circuitry and techniques estimate, calculate, measure and/or determine the SOH by injecting or applying an electrical charge signal into the battery/cell. An electrical current signal is applied to the cell's terminals for a known duration of time, for example, ranging from a few milliseconds to several seconds. The signal is then interrupted and the voltage across the battery's terminals is measured. The voltage decays to a partial-equilibrium value which may be 0.1-10% of the peak voltage deviation reached during the charge signal—and preferably, 0.1-5% of the peak voltage deviation reached during the charge signal. The time required to reach this partial-equilibrium value is a relaxation time that depends on the SOH of the battery/cell (FIGS. 9A-9C). This relaxation time is relatively short when the battery/cell is "new" and increases as the battery/cell ages and the transport dynamics of the ions within the battery degrade.

Notably, peak voltage deviation, in this context, is relative to the terminal voltage of the battery/cell when the current of the charge/discharge packet is first or initially applied. (See, $V_1$, for example, in FIGS. 5A, 5B and 9A-9C).

In another embodiment, the circuitry and techniques estimate, calculate, measure and/or determine the SOH of a battery/cell by initially injecting or applying the charging signal described above for a short duration (for example, for a period of between 1 ms and 50 ms), and then applying a discharging signal of a duration (for example, for a period of between 5 ms and 100 ms). The voltage across the battery's terminals gradually returns to its partial-equilibrium (for example, 0.1-10% of the peak voltage deviation reached during the discharge signal—and preferably, 0.1-5% of the peak voltage deviation reached during the discharge signal). In this particular embodiment, we are interested in or focus on the second relaxation period as shown in FIGS. 9B and 9C.

Figure 14A:
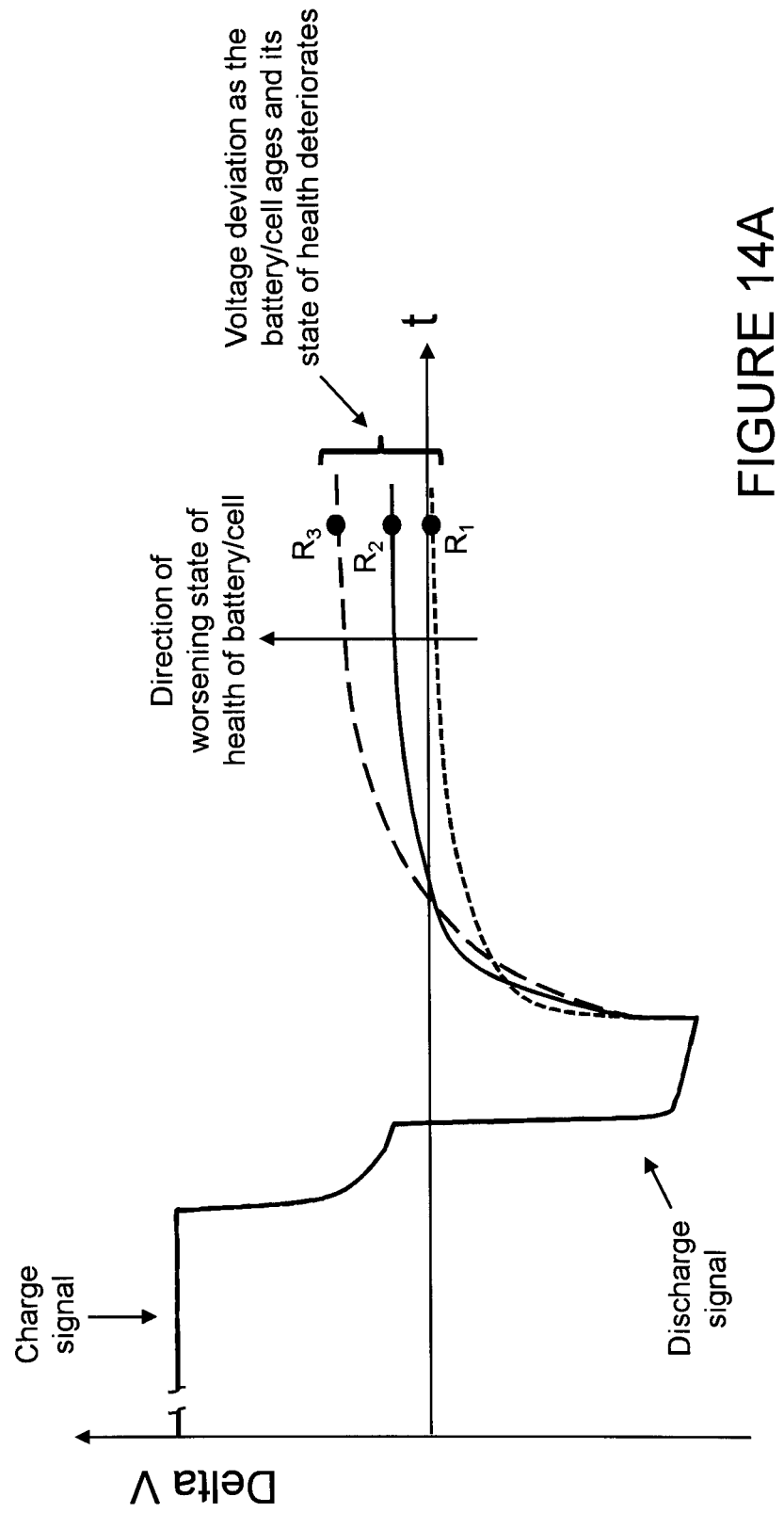
FIG. 14A illustrates an exemplary trend of the change in partial relaxation time as the state of health of the battery/cell degrades.
Figure 14B:
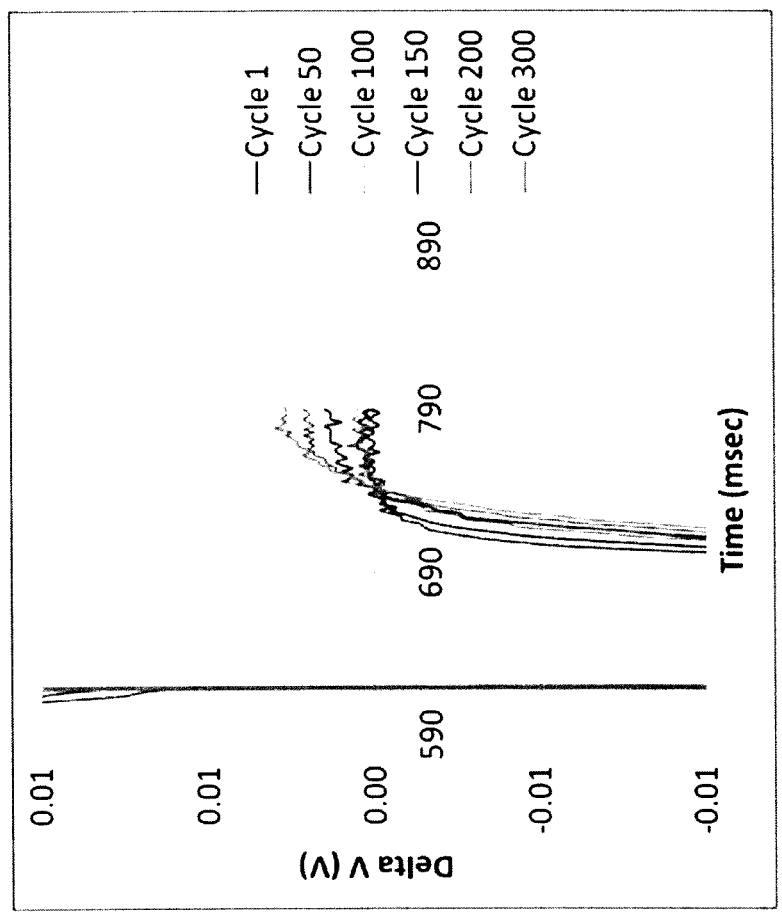
FIG. 14B illustrates actual measurements of the partial relaxation time as the state of health of the battery/cell degrades with increasing number of charge/discharge cycle numbers (notably, each cycle is a full charge followed by a complete discharge)

Notably, as the battery/cell ages, for example, as it is repeatedly charged and discharged during use or operation, the SOH of the battery/cell deteriorates and its capacity to store charge decreases or fades. The relaxation time also changes and that change is a representative of the SOH of the battery/cell (FIG. 14A). The relaxation time needed to reach the partial-equilibrium value lengthens considerably. Alternatively, the voltage deviation for a particular point in time increases as the SOH of the battery/cell degrades. For example, as shown in FIG. 14A, points R1, R2 and R3 all occur at the same time value, with R1 corresponding to a new battery. As the SOH of the battery degrades or worsens, the voltage deviation increases as represented by points R2 and R3. FIG. 14B shows measurement of such voltage deviation after an increasing number of charge-discharge cycles that are known to degrade the SOH of the battery/cell.

Figure 15A:
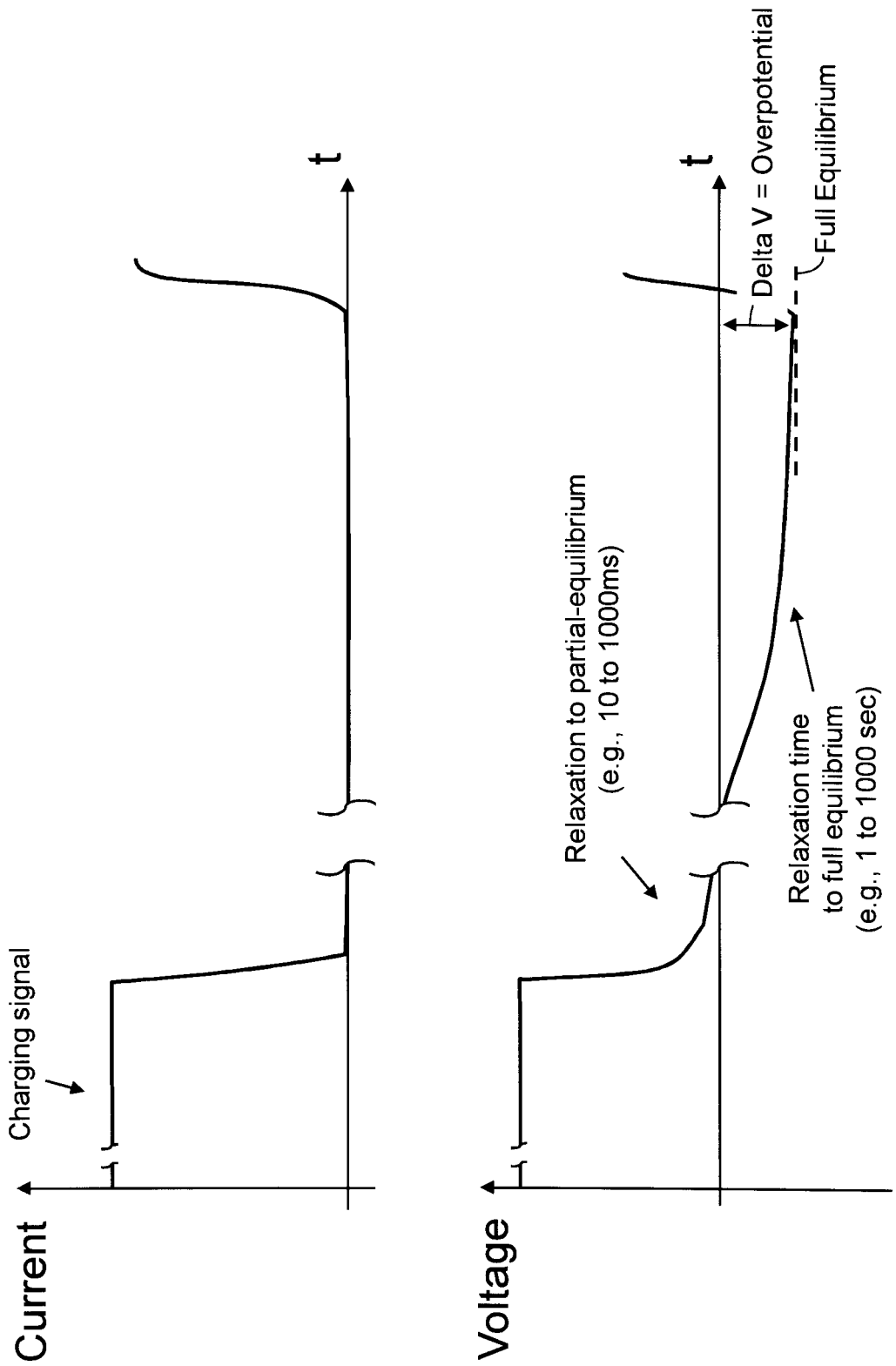
FIG. 15A illustrates an exemplary embodiment of the overpotential of the battery/cell wherein at the end of the "full" or "complete" relaxation time of the battery/cell, the overpotential of the battery/cell may be determined; notably, the overpotential may be characterized as the voltage difference between the terminal voltage of the battery/cell at the initiation of the charge signal and the terminal voltage of the battery/cell when the battery/cell is at full equilibrium (which may be characterized as when the terminal voltage of the battery/cell is substantially or relatively constant or unchanging under no charging current—which, for a conventional lithium ion battery/cell, is typically after a temporal duration of, for example, 1 to 1,000 seconds)
Figure 15B:
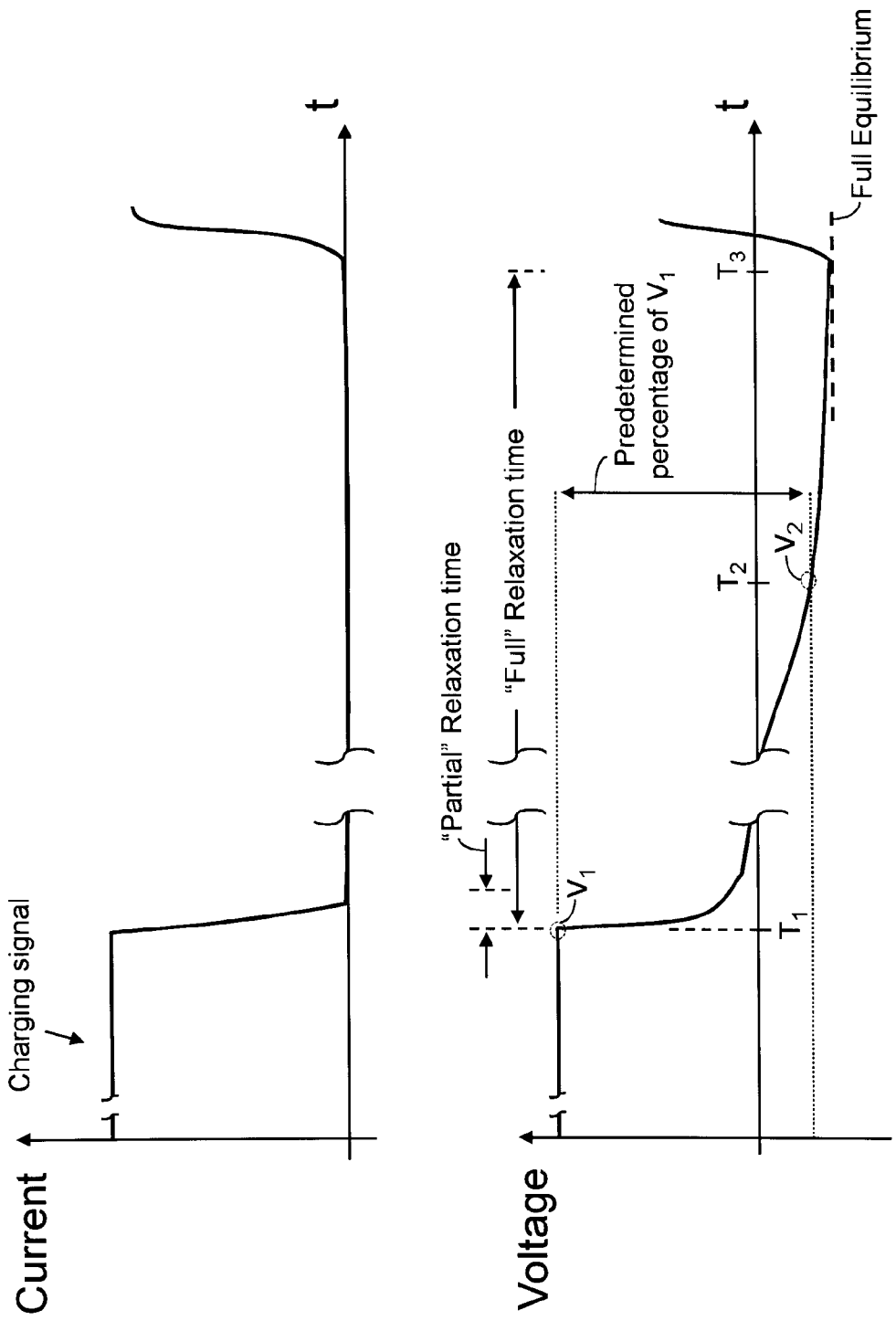
FIG. 15B illustrates an exemplary charge signal (which may include a plurality of charge packets and/or discharge packets—each packet having one or more charge pulses and/or one or more discharge pulses and an exemplary terminal voltage response of the battery/cell to such charge signal wherein a first voltage ($V_1$) is identified (which correlates to the voltage of the battery/cell at the end/termination of the charge signal) at time $T_1$ and a second voltage ($V_2$) at time $T_2$ is identified (which correlates to a predetermined percentage of voltage $V_1$) wherein the control circuitry may determine the overpotential or "full" relaxation time of the battery/cell based on or using the form, shape and/or rate of decay of the terminal voltage; the predetermined percentage is preferably greater than 50% and, more preferably, between 60% and 95%)
Figure 15C:
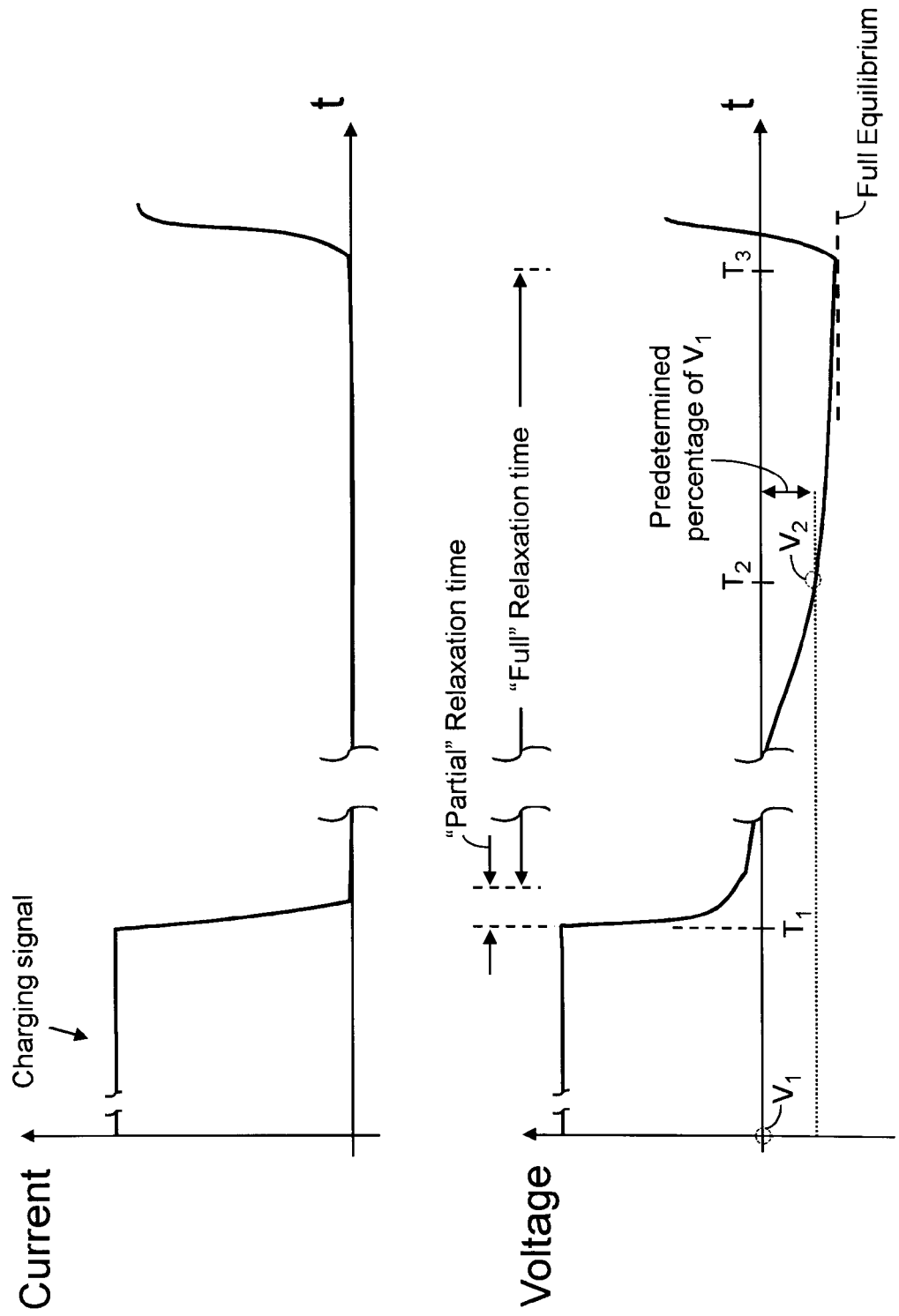
FIG. 15C illustrates an exemplary charge signal (which may include a plurality of charge packets and/or discharge packets—each packet having one or more charge pulses and/or one or more discharge pulses and an exemplary terminal voltage response of the battery/cell to such charge signal wherein a first voltage ($V_1$) is identified (which correlates or is related to the voltage of the battery/cell at the beginning/initiation of the charge signal) at time $T_1$ and a second voltage ($V_2$) at time $T_2$ is identified (which correlates to a predetermined percentage of voltage $V_1$) wherein the control circuitry may determine the overpotential or "full" relaxation time of the battery/cell based on or using the form, shape and/or rate of decay of the terminal voltage; the predetermined percentage is preferably greater than 50% and, more preferably, between 60% and 95%)

In yet another embodiment, the circuitry and techniques estimate, calculate, measure and/or determine the SOH assessing, determining and/or measuring the deviation of the voltages at the terminals of the battery/cell from a true or full equilibrium voltage during charging. Here, during charging, the voltage at the terminals rises to a value that may be, for example, 10 mV to 100 mV higher than the battery's full equilibrium resting voltage. This exemplary difference is noted as the overpotential of the battery (FIG. 15A). During the charging process, the charging current is interrupted and the voltage returns to its true equilibrium voltage. The overpotential or full relaxation time may be characterized and/or measured as the difference in terminal voltage after the charging current is interrupted and a second measurement when the voltage at the terminals is deemed to be unchanging or substantially constant—typically after a duration of, for example, about 1 to 1,000 seconds. Alternatively, the overpotential may be characterized as the difference in (i) the potential after a first relaxation period (with the cell reaching a partial-equilibrium point) or potential immediately before application of a charging signal or at the beginning of the application of the charging signal and (ii) the potential at the true equilibrium voltage of the battery/cell, when the terminal voltage of the battery/cell is relatively or substantially constant or unchanging under no charging current) (FIG. 15A). In either case, this overpotential value increases as the SOH degrades (capacity fade of the battery/cell), and is directly correlated to SOH of the battery/cell.

In yet another aspect, the SOH may be employed to improve the accuracy in estimating the SOC of the battery/cell, which may be a measure or estimate of the available discharge capacity (for example, in connection with a gauge, indicator and/or information which is representative of an available energy capacity of the battery/cell), and/or to improve safety in connection with, for example, charging or recharging a battery/cell. In this regard, as the battery/cell ages, for example as it is repeatedly charged and discharged during use or operation, the SOH of the battery/cell deteriorates and its capacity to store charge decreases or fades. In this aspect, the circuitry and techniques employ the SOH to compensate the data (for example, the SOC of the battery/cell) which may be employed in connection with a gauge, indicator and/or information which is representative of an available energy capacity of the battery/cell. In this way, such a gauge, indicator and/or information provides a more accurate representation of the available energy capacity of the battery/cell. Thus, in this embodiment, the circuitry and techniques which measure or estimate the available discharge capacity of the battery/cell adjust or compensate information which is representative of an available energy capacity of the battery/cell using the SOH of the battery/cell.

In yet another aspect, the adaptive charging techniques and/or circuitry of the present inventions may measure, monitor and/or determine the overpotential or full relaxation time of the battery/cell and, in response thereto, adapt, adjust and/or control one or more characteristics of the charge or current applied to or injected into the battery/cell so that the overpotential or full relaxation time is below a predetermined value and/or within a predetermined range and/or the full relaxation time is less than a predetermined value and/or within a predetermined range. The overpotential or full relaxation time may be characterized and/or measured as the difference in terminal voltage of the battery/cell after the charging current is interrupted and a second measurement when the voltage at the terminals is essentially, relatively or deemed to be unchanging—typically (for a conventional lithium ion battery/cell) after a duration lasting, for example, about 1 to 1,000 seconds. Alternatively, the overpotential may be characterized as the difference in terminal voltage after a first relaxation period (with the cell reaching a partial-equilibrium point) and the potential at the full equilibrium voltage of the battery/cell (FIG. 15A).

For example, where the adaptive charging techniques and/or circuitry determine the overpotential or full relaxation time of the battery/cell exceeds the predetermined range (via measuring or monitoring the terminal voltage), the amount of current applied to the battery/cell during the charging process may be adapted, adjusted and/or controlled so that, in response to subsequent charging signals, the terminal voltage of the battery/cell is below a predetermined value and/or does not exceed the predetermined range. In one embodiment, where the adaptive charging techniques and/or circuitry determine the overpotential or full relaxation time of the battery/cell exceeds the upper value of the predetermined range, the adaptive charging techniques and/or circuitry may reduce the average current applied or input into the battery/cell during the charging process. For example, in one embodiment, the adaptive charging techniques and/or circuitry may reduce the peak current of the packet applied or input into the battery/cell during the charging process. Alternatively, the adaptive charging techniques and/or circuitry may decrease the duty cycle of the pulses within a packet to decrease the amount of charge applied to the battery/cell. Where, however, the overpotential or full relaxation time of the battery/cell is less than the lower value of the predetermined range, the adaptive charging techniques and/or circuitry may increase the amount of current applied or input into the battery/cell during the charging process. Alternatively, the adaptive charging techniques and/or circuitry may increase the duty cycle within a packet to increase the amount of charge applied into the battery/cell.

In one embodiment, the adaptive charging techniques and/or circuitry of the present inventions intermittently, continuously and/or periodically determine, measure and/or monitor the overpotential or full relaxation time of the battery/cell less frequently relative to the measuring or monitoring the terminal voltage to assess, determine and/or monitor the terminal voltage difference in connection with or in response to a charge and/or discharge packet (as discussed above). For example, the adaptive charging techniques and/or circuitry of the present inventions may intermittently, continuously and/or periodically determine, measure and/or monitor the overpotential or full relaxation time of the battery/cell (for example, determine, measure and/or monitor the terminal voltage of the battery/cell every Nth packet (where N=1,000 to 10,000) and/or every 1-1000 seconds). Based thereon or using such data, the adaptive charging techniques and/or circuitry may intermittently, continuously and/or periodically determine and/or adapt the characteristics of the charge or current injected into the battery/cell (or adapt the characteristics of the charge removed from the battery/cell in those embodiments where a discharge current is employed) so that the overpotential or full relaxation time of the battery/cell is within a predetermined range or below a predetermined value (for example, determine and/or adapt the characteristics of the charge or current injected into the battery/cell every Nth packet (where N=1,000 to 10,000) and/or every 1-1000 seconds based on considerations of overpotential or full relaxation time). In one embodiment, the adaptive charging techniques and/or circuitry may intermittently, continuously and/or periodically determine, measure and/or monitor the overpotential or full relaxation time of the battery/cell (for example, via measuring or monitoring terminal voltage of the battery/cell) and, in response thereto or based thereon, may intermittently, continuously and/or periodically determine an adjust, control or adapt the amount of current or charge applied to or injected into the battery/cell (which, in one embodiment, may be charge pulses of the immediately subsequent packet(s) of the immediately subsequent charge signals) so that the overpotential or full relaxation time of the battery/cell due to such subsequent charging is within a predetermined range.

Thus, adaptive charging techniques and/or circuitry of the present inventions may (i) determine, measure and/or monitor the overpotential (via measuring or monitoring the terminal voltage) of the battery/cell on an intermittent, continuous and/or periodic basis, (ii) determine whether the overpotential is below a predetermined value and/or within a predetermined range on an intermittent, continuous and/or periodic basis, and/or (iii) adapt, adjust and/or control characteristics of the charge or current signals applied to or injected into the battery/cell (for example, amount of the applied charge or current) so that the overpotential of the battery/cell to such charging is below a predetermined value and/or within a predetermined range on an intermittent, continuous and/or periodic basis. For example, adaptive charging techniques and/or circuitry of the present inventions may (i) determine, measure and/or monitor the terminal voltage of the battery/cell every X packets (where X=100 to 10,000) and/or every 1-1000 seconds, (ii) determine, every Y packets (where X=100 to 10,000) and/or every 1-1000 seconds, whether the overpotential (which is response to charge and discharge signals) is within a predetermined range, and/or (iii) adapt, adjust and/or control characteristics of the charge or current signals applied to or injected into the battery/cell, every Z packets (where X=100 to 10,000) and/or every 1-1000 seconds, so that the overpotential is within a predetermined range. All permutations and combinations are intended to fall within the scope of the present inventions. Indeed, such embodiments are applicable to the charging techniques and/ or circuitry which apply or inject (i) charge packets having one or more charge pulses and (ii) charge packets having one or more charge pulses and one or more discharge pulses.

Notably, although the discussion below refers to overpotential, that discussion is applicable to full relaxation time of the battery/cell in addition to overpotential. As such, the adaptive charging techniques and/or circuitry of the present inventions may (i) determine, measure and/or monitor the full relaxation time (via measuring or monitoring the terminal voltage) of the battery/cell on an intermittent, continuous and/or periodic basis, (ii) determine whether the full relaxation time is below a predetermined value and/or within a predetermined range on an intermittent, continuous and/or periodic basis, and/or (iii) adapt, adjust and/or control characteristics of the charge or current signals applied to or injected into the battery/cell (for example, amount of the applied charge or current) so that the full relaxation time of the battery/cell to such charging is below a predetermined value and/or within a predetermined range on an intermittent, continuous and/or periodic basis. For the sake of brevity, that discussion will not be repeated in connection with full relaxation time.

The monitoring circuitry and/or control circuitry may determine, measure and/or monitor the overpotential of the battery/cell using any technique and/or circuitry now known or later developed. For example, in one embodiment, the monitoring circuitry measures, samples and/or monitors the terminal voltage of the battery/cell immediately before application of a charging signal or at the beginning of the application of the charging signal. Once the battery/cell reaches full equilibrium (which may be characterized as when the terminal voltage of the battery/cell is relatively constant or unchanging when no charging signal is applied), the monitoring circuitry measures, samples and/or monitors the terminal voltage of the battery/cell. The control circuitry may determine or measure the overpotential of the battery/cell as the difference between these two terminal voltages.

In addition thereto or in lieu thereof, the adaptive charging techniques and/or circuitry of the present inventions may determine, measure and/or monitor the overpotential of the battery/cell by measuring, sampling and/or monitoring the terminal voltage of the battery/cell after termination of a charging signal and, based on or using the characteristics of the decay of the terminal voltage after terminating the charging signal, the control circuitry may derive, calculate, estimate, and/or determine the overpotential. For example, the control circuitry may determine the overpotential by extrapolating from the terminal voltage of the battery/cell after termination of a charging signal and the characteristics of the decay of the terminal voltage. In one embodiment, the monitoring circuitry may measure, sample and/or monitor an "initial" terminal voltage of the battery/cell after terminating the charging signal (for example, immediately or substantially immediately after terminating the charge signal) and, based on the amount of time required for the terminal voltage to reach a predetermined percentage of the "initial" terminal voltage, determine an overvoltage. In this embodiment, the control circuitry may anticipate, assume and/or estimate a form, shape and/or rate of change of the terminal voltage over time (for example, the form, shape and/or rate of decay of the terminal voltage being at a rate of the square root of time). In this way, the charging techniques and/or circuitry of the present inventions may determine, measure and/or monitor the overpotential of the battery/cell more rapidly.

In another embodiment, the adaptive charging techniques and/or circuitry of the present inventions may determine, measure and/or monitor the overpotential of the battery/cell by measuring, sampling and/or monitoring the change in terminal voltage of the battery/cell in response to a plurality of temporally contiguous or sequential packets. (See, for example, FIGS. 5A and 5B). In this embodiment, the control circuitry sums or accumulates the change in terminal voltage of the battery/cell (as measured by the monitoring circuitry) over a plurality of temporally contiguous or sequential packets (for example, 100 to 10,000 and preferably 100 to 2,000 packets). Based on the sum of the change in terminal voltage of the battery/cell over a plurality of temporally contiguous or sequential packets, the control circuitry may determine the overpotential of the battery/cell.

Regardless of the measuring, monitoring and/or determining techniques, the adaptive charging techniques and circuitry of the present inventions may adapt, adjust and/or control characteristics of the charge or current signals applied to or injected into the battery/cell (for example, amount of the applied charge or current) based on or using data which is representative of the overpotential of the battery/cell. Here, the control circuitry may adjust characteristics of the charge or current signals (for example, the amount of charge or current for a given temporal period) applied to or injected into the battery/cell during the charging process (via control of the charging circuitry) to control the overpotential of the battery/cell so that the overpotential of the battery/cell is below a predetermined value and/or within a predetermined range.

For example, where the charging techniques and/or circuitry apply charge packets, having one or more charge pulses, to the battery/cell during a charging sequence, cycle or operation, in one embodiment, the charging techniques and/or circuitry may adapt, adjust and/or control the amplitude and/or pulse width and/or duty cycle of the charge or current pulses of one or more packets applied to or injected into the battery/cell (for example, the immediately subsequent packets) so that the overpotential of the battery/cell in response to such subsequent charge packet(s) is within a predetermined range. In this embodiment, the charging techniques and/or circuitry may adapt, adjust and/or control one or more characteristics of the charge or current applied to or injected into the battery/cell via adapting, adjusting and/or controlling the shape, amplitude and/or width of charge pulse(s) of the subsequent packet(s).

The predetermined range for the overpotential may be determined based on empirical data, test data, simulation data, theoretical data and/or a mathematical relationship. For example, based on empirical data, the adaptive charging techniques and/or circuitry associated with a given battery/cell (for example, a certain series, manufacturing lot, chemistry and/or design) may determine, calculate, estimate and/or employ a predetermined range as well as changes therein. The predetermined range for the overpotential may be fixed or may change, for example, based on based on one or more conditions or states of the battery/cell (for example, SOC and/or SOH and/or temperature).

Thus, in one embodiment, the predetermined range may change based on, for example, a condition or state of the battery/cell. Here, the circuitry and/or techniques of the present inventions may adjust, change and/or adapt the predetermined range of the overpotential based on or using data which is representative of the SOC of the battery/cell and/or the SOH of the battery/cell.

In one embodiment, based on or using initialization, characterization and/or calibration data, the adaptive charging techniques and/or circuitry of the present inventions may calculate, estimate or determine an initial predetermined overpotential range or set of predetermined overvoltage ranges for the particular battery/cell. For example, in one embodiment, based on or using (i) initialization, characterization and/or calibration data and (ii) empirical data, test data, simulation data, theoretical data and/or a mathematical relationship, the adaptive charging techniques and/or circuitry of the present inventions may calculate or determine one or more predetermined ranges for the overpotential for a particular or associated battery/cell. Indeed, in one embodiment, the adaptive charging techniques and/or circuitry of the present inventions, based on or using (i) initialization, characterization and/or calibration data and (ii) empirical data, test data, simulation data, theoretical data and/or a mathematical relationship, may calculate, estimate or determine a pattern or relationship of the change of the predetermined range of the overpotential.

Determination or calculation of a predetermined range or set of predetermined ranges for the overpotential may also employ data which is representative of a series, manufacturing lot, chemistry and/or design of the battery/cell. In one embodiment, based on empirical data, test data, simulation data, theoretical data and/or a mathematical relationship in conjunction with data which is representative of a series, manufacturing lot, chemistry and/or design of the battery/cell, one or more predetermined ranges of the overpotential may be determined or calculate. In addition, one or more changes to such predetermined overpotential ranges (which may be based on one or more conditions or states of the battery/cell and/or responses of the battery/cell to or during the charging processes) may be determined or calculate, estimated. In yet another embodiment, a predetermined range or set of predetermined ranges for the overpotential may be determined or calculate for a given battery/cell based on or using (i) the battery/cell response to an initialization, characterization and/or calibration signals or sequence, and (ii) empirical data, which may, for example, be developed based on a certain series, manufacturing lot, chemistry and/or design. Notably, data which is representative of a predetermined range or set of predetermined ranges for the overpotential may be stored in memory, coupled to the battery/cell, for use by the adaptive charging techniques and/or circuitry of the present inventions.

As indicated above, in one embodiment, an initial predetermined overpotential range or set of predetermined overpotential ranges for a particular battery/cell may be based on or using initialization, characterization or calibration data of the battery/cell. The initialization, characterization and/or calibration data may be representative of the response of the battery/cell to a characterization sequence. In one embodiment, the characterization sequence may apply charge signals to the battery/cell. Thereafter, the adaptive charging techniques and/or circuitry may evaluate the response to such signals by the battery/cell. Based thereon, the adaptive charging techniques and/or circuitry may calculate or determine predetermined overpotential ranges for the particular battery/cell. Such initialization, characterization or calibration data may be obtained, acquired and/or determined, for example, at manufacture, test or calibration which may include the characterization sequence to obtain "unique" data regarding a given battery/cell.

The initialization, characterization or calibration sequences seek to establish values for the predetermined limits and ranges discussed earlier. In one embodiment, the initialization, characterization or calibration sequences measure the overpotential values for new cells/batteries over the full range of SOC. These measurements may be frequent such that 10-50 measurements are made over the full SOC range. In an second embodiment, these values are used to cycle cells/batteries, and correlation data or tables are generated to correlate these overpotential values with the capacity fade of the cells/batteries, and consequently with cycle life. Different values may be used on different cells to create more complete correlation relationships between overpotential values and capacity fade. Additionally, the overpotential values may be correlated using physical models to the transport of lithium-ions, such as solving Fick's law and current transport law within the cell.

Notably, the predetermined overpotential range or ranges may be calculated or determined by the adaptive circuitry and/or processes of the present inventions or by other circuitry and processes (for example, circuitry which is "off-device", "off-chip" or separate from the circuitry of the present inventions). The predetermined overpotential range or ranges may be stored in memory (for example, in a database or look-up table) during manufacture, test or calibration, and accessible to the adaptive circuitry and/or processes of the present inventions during operation.

As noted above, the predetermined overpotential ranges may change relative to initial predetermined ranges in a predetermined manner (for example, in a fixed relationship over time/use—which may be based on or using empirical data, test data, simulation data, theoretical data and/or a mathematical relationship). In addition thereto, or in lieu thereof, such predetermined overpotential ranges may depend on considerations such as the state or status of one or more parameters of the battery/cell including, for example, the SOC, the SOH and/or temperature of the battery/cell.

For example, in one embodiment, the predetermined ranges for the overpotential depend on the SOC of the battery/cell. In this regard, as noted above, the adaptive charging circuitry and techniques may apply or inject a higher current or charge into the battery/cell when the SOC of the battery/cell is low and a lower current or charge when the SOC of the battery/cell is high. At a low SOC, the diffusion rate of lithium ions into the electrodes may be faster than the diffusion rate at a high SOC. The difference in diffusion rate can vary substantially. Additionally, it may be beneficial to use a higher charging current when the impedance (in particular, the real part thereof, which is representative of the resistance that the battery/cell exhibits to an applied electrical current) is low and a lower charging current when the impedance is high. Therefore, in one embodiment, the adaptive charging algorithm or technique tailors, changes and/or adjusts the charging current to control, manage and/or reduce the change in voltage in response to such charging current.

The predetermined overpotential range or ranges may be stored in permanent, semi-permanent or temporary memory. In this regard, the memory may store data, equations, relationships, database and/or look-up table in a permanent, semi-permanent or temporary (for example, until re-programmed) memory of any kind or type (for example, EEPROM, Flash, DRAM and/or SRAM). Moreover, the memory may be discrete or resident on (i.e., integrated in) other circuitry of the present inventions (for example, control circuitry). In one embodiment, the memory may be one-time programmable, and/or the data, equations, relationships, database and/or look-up table of the predetermined overpotential range(s) may be stored in a one-time programmable memory (for example, programmed during test or at manufacture). In another embodiment, the memory is more than one-time programmable and, as such, the predetermined overpotential range(s) may be updated, written, re-written and/or modified after initial storage (for example, after test and/or manufacture) via external or internal circuitry.

As mentioned above, in certain embodiments, two considerations in connection with implementing the adaptive charging circuitry and techniques of the present inventions are to:
   i. Minimize and/or reduce total charging time: For practical reasons, the battery/cell is charged within a given period of time (for example, a maximum allowed period of time). Typically, a specification value is defined or chosen depending on the application. For example, it is approximately 2 to 4 hours for batteries employed in consumer applications, and for batteries employed in transportation applications, it may be up to 8 hours. This results in a specification for a net effective charging current; and
   ii. Maximize and/or increase cycle life: To maximize and/or increase cycle life of the battery/cell, it may be desirable to charge the battery/cell (i) at a low current and/or (ii) provide rest periods between or in periods of charging (for example, between charging signals or packets) wherein no charge is applied to or injected into the battery/cell.

Thus, in certain aspects, the charging circuitry of the present inventions implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

With reference to FIGS. 1A-1C and, in one exemplary embodiment, charging circuitry 12 may apply one or more charging signals (which provide a net input of charge or current into the battery/cell) and one or more discharging signals (which provide a net removal of charge or current from the battery/cell). (See, for example, FIGS. 2C and 2D). As noted above, the adaptive charging circuitry and techniques of the present inventions may employ any charging circuitry 12, whether described herein, now known or later developed, to charge the battery/cell; all such charging circuitry 12 are intended to fall within the scope of the present inventions. For example, charging circuitry 12 of the present inventions may generate charging and discharging signals, packets and pulses (as described herein). Notably, charging circuitry 12 is generally responsive to control signals from control circuitry 16.

With continued reference to FIG. 1A, monitoring circuitry 14 monitors, senses, detects and/or samples, on an intermittent, continuous and/or periodic basis, condition or characteristics of the battery/cell including, for example, the terminal voltage, open circuit voltage (OCV) and/or temperature of the battery/cell. As noted above, the adaptive charging circuitry and techniques of the present inventions may employ any monitoring circuitry 14 and/or monitoring techniques, whether described herein, now known or later developed, to acquire such data; all such monitoring circuitry 14 and monitoring techniques are intended to fall within the scope of the present inventions. The monitoring circuitry 14 provides data which is representative of the condition or characteristics of the battery/cell to control circuitry 16.

The control circuitry 16, using data from monitoring circuitry 14, calculates, estimates, determines and/or assesses the state or condition of the battery/cell in connection with the charging or recharging process. For example, control circuitry 16 calculates, determines and/or estimates an overpotential of the battery/cell in response to charge or current applied to or injected into the battery/cell. Based thereon, control circuitry 16 adapts, adjusts and/or controls one or more characteristics of the charge or current applied to or injected into the battery/cell (via controlling the operation of charging circuitry 12) so that the overpotential of the battery/cell (in response to charge or current applied to or injected into the battery/cell during a charging or recharging sequence/operation) is below a predetermined value and/or within a predetermined range.

As discussed above, in one embodiment, where charging circuitry 12 applies charge packets (having one or more charge pulses) to the battery/cell, control circuitry 16 (implementing, for example, one or more of the inventive adaptive charging techniques described herein) adapts, adjusts and/or controls the characteristics of the charge packets applied to or injected into the battery/cell (via controlling charging circuitry 12) so that the overpotential of the battery/cell during charging (via charge packets) is within a predetermined range. For example, control circuitry 16 may instruct charging circuitry 12 to change the amount of charge or current applied to or injected into the battery/cell via controlling the shape, amplitude and/or width of charge pulse(s). In this way, control circuitry 16 may, in one embodiment, adapt, adjust and/or control the charge or current applied to or injected into the battery/cell (via controlling charging circuitry 12) so that the overpotential of the battery/cell in response to the charge or current is below a predetermined value and/or within a predetermined range.

In another embodiment, charging circuitry 12 applies charge packets, having one or more charge pulses and one or more discharge pulses, to the battery/cell during a charging or recharging sequence, operation or cycle. In this embodiment, control circuitry 16 may adapt, adjust and/or control (i) the characteristics of charge pulses applied and/or (ii) the characteristics of the discharge pulse so that the overpotential of the battery/cell is below a predetermined value and/or within a predetermined range. Here again, control circuitry 16 (via control of charging circuitry 14) may adapt, adjust and/or control the amount of current applied or injected into the battery/cell via adapting, adjusting and/or controlling the shape, amplitude and/or width of charge pulse(s) and the shape, amplitude and/or width of discharge pulse(s) (via control of charging circuitry 14) in a manner so that overpotential of the battery/cell due to the charging is below a predetermined value and/or within a predetermined range. Thus, in these embodiments, control circuitry 16 (implementing, for example, one or more of the inventive adaptive charging techniques described herein) adapts, adjusts and/or controls one or more characteristics of the charge and/or discharge pulses so that overpotential of the battery/cell due to the charging is below a predetermined value and/or within a predetermined range.

In operation, charging circuitry 12 applies a charge or current to the battery/cell. (See, for example, the exemplary charge waveforms of FIGS. 2A-2D). In one embodiment, monitoring circuitry 14 measures or detects voltages at the terminals of the battery/cell. Once the battery/cell reaches full equilibrium (which may be characterized as when the terminal voltage of the battery/cell is relatively constant or unchanging under no charging current), monitoring circuitry 14 measures, samples and/or monitors the terminal voltage of the battery/cell. The control circuitry 16 may determine or measure the overpotential of the battery/cell as the difference between these two terminal voltages.

In addition thereto or in lieu thereof, monitoring circuitry 12 and control circuitry 16 may determine, measure and/or monitor the overpotential of the battery/cell by measuring, sampling and/or monitoring the terminal voltage of the battery/cell after termination of a charging signal and, based on or using the characteristics of the decay of the terminal voltage after terminating the charging signal, control circuitry 16 may derive, calculate, estimate, and/or determine the overpotential. For example, control circuitry 16 may determine the overpotential by extrapolating from the terminal voltage of the battery/cell after termination of a charging signal and the characteristics of the decay of the terminal voltage. In one embodiment, monitoring circuitry 12 may measure, sample and/or monitor an "initial" terminal voltage of the battery/cell after terminating the charging signal (for example, immediately or substantially immediately after terminating the charge signal) and, based on the amount of time required for the terminal voltage to reach a predetermined percentage of the "initial" terminal voltage, determine an overvoltage. In this embodiment, control circuitry 16 may anticipate, assume and/or estimate a form, shape and/or rate of change of the terminal voltage over time (for example, the form, shape and/or rate of decay of the terminal voltage being at a rate of the square root of time).

In another embodiment, monitoring circuitry 12 and control circuitry 16 may determine, measure and/or monitor the overpotential of the battery/cell by measuring, sampling and/or monitoring the change in terminal voltage of the battery/cell in response to a plurality of temporally contiguous or sequential packets. In this embodiment, control circuitry 16 sums or accumulates the change in terminal voltage of the battery/cell (as measured by monitoring circuitry 12) over a plurality of temporally contiguous or sequential packets (for example, 100 to 50,000 and preferably 1,000 to 20,000 packets). Based on the sum of the change in terminal voltage of the battery/cell over a plurality of temporally contiguous or sequential packets, control circuitry 16 may determine the overpotential of the battery/cell. In this embodiment, the overpotential (OP) may be characterized as:

$$OP \propto \Sum_{i=1}^{n} DeltaV_i;$$

where $DeltaV_i$ is the change in terminal voltage, in response to a charge and/or discharge packet, of the battery/cell. (See, e.g., Delta $V_i=V_3-V_1$ in FIG. 5A and $V_i=V_5-V_1$ in FIG. 5B).

Regardless of the measuring, monitoring and/or determining techniques, the adaptive charging techniques and circuitry of the present inventions may adapt, adjust and/or control characteristics of the charge or current signals applied to or injected into the battery/cell (for example, amount of the applied charge or current) based on or using data which is representative of the overpotential of the battery/cell. Here, control circuitry 16 may adjust the amount of charge or current applied to or injected into the battery/cell during the charging process (via control of charging circuitry 12) to control the overpotential of the battery/cell so that the overpotential of the battery/cell is below a predetermined value and/or within a predetermined range.

Figure 16:
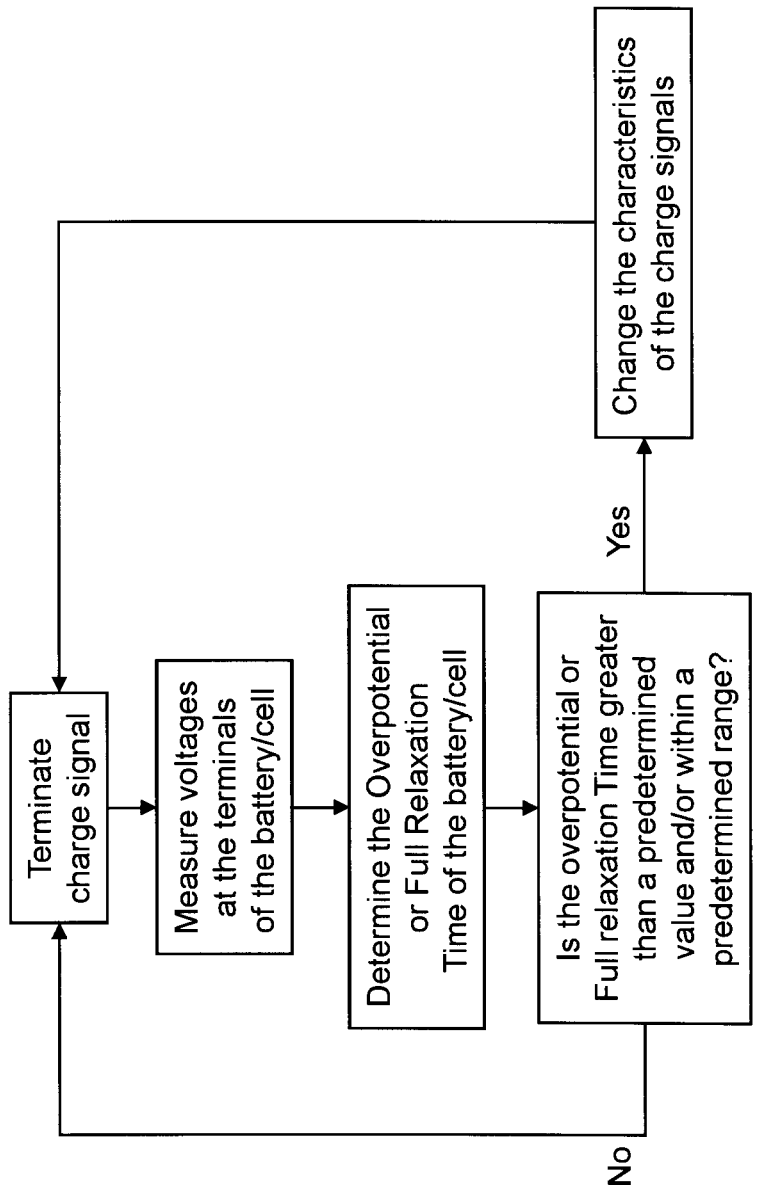
FIG. 16 is a flowchart of an exemplary process of determining, adapting and/or controlling the characteristics of a charging current based on or using the overpotential or full relaxation time of the battery/cell in response to a charging signals (which may include one or more charge packets/pulses and one or more discharge packets/pulses), according to certain aspects of the present inventions; wherein the charging techniques and/or circuitry adapt, adjust and/or control one or more characteristics of the charge or current applied to or injected into the battery/cell so that the overpotential or full relaxation time of the battery/cell in response to one or more subsequent charging is less than a predetermined value and/or within a predetermined range during subsequent charging or recharging of the charge operation or cycle.

With reference to FIG. 16, where the change in terminal voltage is below a predetermined value and/or within a predetermined range, control circuitry 16, in one embodiment, instructs charging circuitry 14 to apply the same or similar charge to the battery/cell during subsequent charging (subject to other considerations including SOC, SOH, partial relaxation time, change in terminal voltage in response to a packet). Where, however, the change in terminal voltage is greater than the predetermined value and/or outside the predetermined range (i.e., is less than or is greater than the predetermined range), control circuitry 16 adapts, adjusts and/or controls one or more characteristics of the charge or current applied to or injected into the battery/cell (via charging circuitry 14) so that a change in voltage at the terminals of the battery/cell in response to subsequent charging (for example, the immediately subsequent charge packet) is below a predetermined value and/or within a predetermined range.

Here, control circuitry 16 calculate or determines a change to one or more characteristics of the charging (for example, the amount of current injected or applied to the battery/cell) so that charge or current applied to or injected into the battery/cell via subsequent charging is within a predetermined range. Notably, the predetermined range may indeed change, for example, according to a predetermined rate or pattern, and/or according to the measured, determined and/or estimated SOC and/or SOH of the battery/cell.

In particular, with reference to FIGS. 1A-1C and 15B, in one embodiment, monitoring circuitry 14 measures, samples and/or determines the terminal voltage response to the charge pulse and provides data which is representative of a first voltage ($V_1$), which correlates to a terminal voltage of the battery/cell at the end/termination of the charge signal, and a second voltage ($V_2$), which correlates to a voltage which is a predetermined percentage of the first voltage. The monitoring circuitry and/or the control circuitry may also determine the amount of time between these two voltages ($T_2-T_1$). Based on or using such data, control circuitry 16 calculates, determines and/or estimates the overpotential by extrapolating from the terminal voltage of the battery/cell after termination of a charging signal and the characteristics of the decay of the terminal voltage. In this embodiment, control circuitry 16 may anticipate, assume and/or estimate a form, shape and/or rate of change of the terminal voltage over time (for example, the form, shape and/or rate of decay of the terminal voltage being at a rate of the square root of time) to determine an overpotential of the battery/cell.

Similarly with reference to FIGS. 1A-1C and 15C, in another embodiment, monitoring circuitry 14 measures, samples and/or determines the terminal voltage response to the charge pulse and provides data which is representative of a first voltage ($V_1$), which correlates to a terminal voltage of the battery/cell at the beginning/initiation of the charge signal, and a second voltage ($V_2$), which correlates to a voltage which is a predetermined percentage of the first voltage. The monitoring circuitry and/or the control circuitry may also determine the amount of time between these two voltages ($T_2-T_1$). As noted above, based on or using such data, control circuitry 16 calculates, determines and/or estimates the overpotential by extrapolating from the terminal voltage of the battery/cell after termination of a charging signal and the characteristics of the decay of the terminal voltage. The control circuitry 16 may again anticipate, assume and/or estimate a form, shape and/or rate of change of the terminal voltage over time (for example, the form, shape and/or rate of decay of the terminal voltage being at a rate of the square root of time) to determine an overpotential of the battery/cell.

Where control circuitry 16 calculates, determines and/or estimates the overpotential to be below a predetermined value and/or within a predetermined range, control circuitry 16 may not change the characteristics of subsequent charge packets due thereto (although control circuitry 16 may indeed change such characteristics as a result of other considerations, such as, for example, considerations measurements of—change in terminal voltage due to charge packets, relaxation time to partial equilibrium, the SOC and/or SOH). Where, however, control circuitry 16 determines the change in terminal voltage is outside the predetermined range, control circuitry 16 may change one or more characteristics of the charge packet including the shape, amplitude and/or width of charge pulse(s) in order to adapt, adjust and/or control the amount of charge or current applied to or injected into the battery/cell (via charging circuitry 14) so that the overpotential of the battery/cell in response to a subsequent charge or current is within below a predetermined value and/or within a predetermined range. For example, where the change in terminal voltage in response to one or more charge packets is less than a predetermined range, control circuitry 16 may increase the amplitude and/or width of the charge pulse(s) to thereby inject more current or charge into the battery/cell in a subsequent packet (for example, the immediately subsequent packet). Alternatively, control circuitry 16 may increase the amplitude and decrease the width of the charge pulse(s) to thereby inject the same amount of current or charge into the battery/cell in a subsequent packet (for example, the immediately subsequent packet) but at a higher amplitude relative to the previous packet/pulse.

Where, the change in terminal voltage in response to one or more charge packets is greater than the predetermined value and/or predetermined range, control circuitry 16 may decrease the amplitude and/or width of the charge pulse(s) to thereby inject less current or charge into the battery/cell in the subsequent packet (for example, the immediately subsequent packet). Alternatively, control circuitry 16 may decrease the amplitude and increase the width of the charge pulse(s) to thereby inject the same amount of current or charge into the battery/cell in a subsequent packet (for example, the immediately subsequent packet) but at a lower amplitude relative to the previous pulse. (See, for example, FIG. 6A).

Notably, with reference to FIGS. 6A and 6B, in one embodiment, control circuitry 16 may adapt, adjust and/or control the amplitude and/or duration of the charge pulse as well as the duration of the rest period ($T_{rest}$). For example, in one embodiment, control circuitry 16, via charging circuitry 12, adjusts the amplitude and duration of the charge pulse and the duration of the rest period ($T_{rest}$) to maintain a constant period of the charge packet ($T_{packet}$). Alternatively, control circuitry 16 may adapt, adjust and/or control the duration of the rest period ($T_{rest}$) to accommodate other considerations and parameters in relation to the response of the battery/cell to charging, for example, change in terminal voltage in response to one or more charge and/or discharge packets and/or relaxation time to partial-equilibrium of the battery/cell.

Thus, control circuitry 16 may adapt, adjust and/or control shape, amplitude and/or width of charge pulse(s) and the shape, amplitude and/or width of discharge pulse(s) (via controlling charging circuitry 14) in a manner so that the overpotential of the battery/cell is below a predetermined value and/or within a predetermined range during subsequent charging.

With continued reference to FIG. 5B, control circuitry 16 may, in addition to controlling the amplitude and width of the charge and/or discharge pulses, may control the duration of one or both of the rest periods ($T_{inter}$ and $T_{rest}$). In one embodiment, control circuitry 16, via charging circuitry 12, adjusts the amplitude and width of the charge and/or discharge pulses and duration of one or both of the rest periods ($T_{inter}$ and $T_{rest}$) to maintain a constant period of the charge packet ($T_{packet}$). Alternatively, control circuitry 16 may adapt, adjust and/or control the amplitude and/or duration of the charge and/or discharge pulses in relation to the change in terminal voltage of the battery/cell as well as adapt, adjust and/or control the duration of one or both of the rest periods ($T_{inter}$ and $T_{rest}$) to, for example, accommodate other considerations and parameters in relation to the response of the battery/cell to charging (for example, relaxation time to partial-equilibrium of the battery/cell).

In connection with overpotential, the predetermined limit and/or predetermined range may be fixed or may change or be adjusted, for example, over time or use and/or based on one or more conditions or states of the battery/cell and/or responses of the battery/cell to or during charging. In one embodiment, the predetermined limit and/or predetermined range is based on empirical data, test data, simulation data, theoretical data and/or a mathematical relationship. For example, based on empirical data, control circuitry 16 associated with the battery/cell may determine, calculate, estimate and/or employ predetermined ranges based on one or more conditions or states of the battery/cell (for example, the SOC and/or SOH of the battery/cell) and/or responses of the battery/cell to or during charging. Such predetermined ranges fixed (for example, conform to a fixed or predetermined pattern) or may be variable.

In one embodiment, the changes in the predetermined limit and/or predetermined range may be based on one or more conditions or states of the battery/cell and/or responses of the battery/cell to or during the charging process. For example, the predetermined range may change and/or adapt based on or according to one or more parameters of the battery/cell including, for example, the SOC, the SOH, change in terminal voltage in response to a packet and/or relaxation time (to partial-equilibrium of the battery/cell). In one embodiment, where the battery/cell is a typical rechargeable lithium-ion (Li+) battery/cell employing a conventional chemistry, design and materials, a predetermined range may be dependent on the SOC of the battery/cell and may range between 10 mv and 125 mv depending on the particular chemistry, design and materials of the battery and the SOC of the battery. For example, in one embodiment, the predetermined range may be (i) 100 mV±5% when the battery SOC is 0-5%, (ii) 60 mV±5% when the battery/cell includes a SOC of between 5-20%, (iii) 50 mV±5% when the battery/cell includes a SOC of between 20-40%, (iv) 40 mV±5% when the battery/cell includes a SOC of between 40-60%, (v) 30 mV±5% when the battery/cell includes a SOC of between 60-80%, (vi) 25 mV±5% when the battery/cell includes a SOC of between 80-100%. These values may collectively be modified and/or reduced as a function of SOH.

Indeed, as mentioned above, in one exemplary embodiment, the net effective charging current at 0-20% SOC may be 1-1.5 C, and at 80-100% SOC, it may be reduced to 0.1-0.4 C. Notably, the taper of the change in net effective charging current over time may be linear or non-linear (for example, square root of time which is typical of diffusion-limited transport dynamics). (See, for example, FIG. 7). It is also possible to make the net effective charging current initially low for an SOC less than 10%, then make it reach a maximum around 5-20% SOC, then gradually make it decline to a lower value near 90-100% SOC. All of these are various embodiments of the taper function of the net effective charging current with the purpose of optimizing the charging current and charging time while taking into account the underlying physical mechanisms in the battery, for example, mass transport of lithium ions, reaction kinetics and/or their associated time constants, and/or the strains in the anode during the intercalation of the lithium ions.

Thus, in one embodiment, control circuitry 16 may calculate, determine and/or employ one or more predetermined ranges based on the status or state of the battery/cell (for example, based on or using data which is representative of the SOC of the battery/cell, the SOH of the battery/cell and/or partial relaxation time). That is, the predetermined range employed by control circuitry 16 and upon which the change in terminal voltage is evaluated, may be dependent on status or state of the battery/cell, for example, the SOC of the battery/cell and the SOH of the battery/cell.

In one embodiment, based on or using initialization, characterization and/or calibration data, control circuitry 16 or external circuitry may calculate or determine an initial set predetermined limits and/or predetermined ranges of the overpotential for the particular battery/cell. For example, in one embodiment, based on or using (i) initialization, characterization and/or calibration data and (ii) empirical data, test data, simulation data, theoretical data and/or a mathematical relationship, control circuitry 16 or external circuitry may calculate, estimate or determine a set of predetermined limits and/or predetermined ranges for a particular or associated battery/cell. Such predetermined limits and/or ranges of the overpotential may be based on one or more states of the battery/cell (for example, SOC of the battery). Indeed, control circuitry 16 may adaptively adjust the predetermined ranges over the life or use of the battery/cell—for example, based on the changing conditions of the battery/cell (for example, a measured SOH of the battery/cell).

Notably, a set of predetermined limits and/or predetermined ranges of the overpotential may be calculated or determined by control circuitry 16 or by circuitry other than control circuitry 16 (for example, circuitry which is "off-device" or "off-chip" relative to control circuitry 16). The predetermined limits or ranges may be stored in memory (for example, in a database or look-up table) during manufacture, test or calibration, and accessible to the adaptive circuitry and/or processes of the present inventions during operation.

In one embodiment, a set of predetermined limits and/or predetermined ranges of the overpotential (based on, for example, SOC and/or SOH of the battery/cell) may be calculated or determined and stored in memory (for example, during manufacture, test or calibration). Thereafter, control circuitry 16 may adjust or adapt the set of predetermined limits and/or predetermined ranges of the overpotential based on the condition of the battery/cell—for example, the SOC or SOH of the battery/cell. Alternatively, the memory may store multiple sets of predetermined limits and/or predetermined ranges (for example, in a look-up table or matrix) and control circuitry 16 employs a given predetermined range based on one or more conditions of the battery/cell—including SOC and SOH of the battery/cell. Thus, in this embodiment, the predetermined ranges employed by control circuitry 16 depends on the SOH of the battery/cell, which designates or "identifies" a set of predetermined limits and/or predetermined ranges, and the SOC of the battery/cell which designates or "identifies" the particular predetermined limits and/or predetermined range within the set of predetermined ranges. In these embodiments, control circuitry 16 adapts the control of the charging process based on or in response to a degrading SOC and SOH of the battery/cell. The set of predetermined limits and/or predetermined ranges may also be depend on other considerations such as the state or status of other parameters of the battery/cell including, for example, the change in voltage of the battery/cell in response to each packet, relaxation time and/or temperature of the battery/cell (for example, in one embodiment, the predetermined limits or ranges of the overpotential may increase with an increase in temperature of the battery/cell).

The predetermined limits or predetermined ranges of the overpotential may be stored in any memory now known or later developed; all of which are intended to fall within the scope of the present inventions. For example, the memory may be a permanent, semi-permanent or temporary memory (for example, until re-programmed). In one embodiment, the memory may be one-time programmable, and/or the data, equations, relationships, database and/or look-up table of the predetermined range(s) may be stored in a one-time programmable memory (for example, programmed during test or at manufacture). In another embodiment, the memory is more than one-time programmable and, as such, the predetermined range(s) may be updated, written, re-written and/or modified after initial storage (for example, after test and/or manufacture) via external or internal circuitry.

With reference to FIGS. 1A-1C, memory 18 may be integrated or embedded in other circuitry (for example, control circuitry 16) and/or discrete. The memory 18 may be of any kind or type (for example, EEPROM, Flash, DRAM and/or SRAM). The memory 18 may store data which is representative of the predetermined ranges, equations, and relationships. Such data may be contained in a database and/or look-up table.

As noted above, in certain embodiments, two considerations in connection with implementing the adaptive charging circuitry and techniques of the present inventions include (i) minimizing and/or reducing total charging time and (ii) maximizing and/or increasing cycle life. This results in a specification for a net effective charging current. Moreover, to maximize and/or increase cycle life of the battery/cell, it may be desirable to charge the battery/cell (i) at a low current and/or (ii) provide relaxation or rest periods between charging periods. Thus, in certain aspects, the charging circuitry of the present inventions implement adaptive techniques which seek to (i) minimize and/or reduce total charging time of the battery/cell and (ii) maximize and/or increase the cycle life of the battery/cell (by, for example, minimizing and/or reducing degradation mechanisms of the charging operation).

In one embodiment, control circuitry 16 may evaluate the overpotential of the battery/cell less than ten times per charge cycle. In a preferred embodiment, control circuitry 16 evaluates the overpotential of the battery/cell between four and eight times per charge cycle. Moreover, in one embodiment, when the SOC of the battery/cell is greater than a predetermined value (for example, in one embodiment, greater than 80%, and in a preferred embodiment, greater than 90%), control circuitry 16 terminates (i) determining, measuring and/or monitoring the overpotential (via measuring or monitoring the terminal voltage) of the battery/cell, and/or (ii) determining whether the overpotential is below a predetermined value and/or within a predetermined range, and/or (iii) adapting, adjusting and/or controlling characteristics of the charge or current signals applied to or injected into the battery/cell (for example, amount of the applied charge or current) so that the overpotential of the battery/cell to such charging is below a predetermined value and/or within a predetermined range. In this embodiment, while control circuitry 16 determines, measures and/or monitors the overpotential when the SOC of the battery/cell is less than a predetermined value (for example, using any of the techniques described herein), control circuitry 16 may cease (i) determining, measuring and/or monitoring the overpotential (via measuring or monitoring the terminal voltage) of the battery/cell, and/or (ii) determining whether the overpotential is below a predetermined value and/or within a predetermined range, and/or (iii) adapting, adjusting and/or controlling characteristics of the charge or current signals applied to or injected into the battery/cell (for example, amount of the applied charge or current) when the SOC of the battery/cell is greater than the predetermined value (for example, in 80% of SOC or 90% of SOC).

As noted above, although the aforementioned discussion refers to overpotential, that discussion is applicable to full relaxation time of the battery/cell in addition to overpotential. As such, the adaptive charging techniques and/or circuitry of the present inventions may (i) determine, measure and/or monitor the full relaxation time (via measuring or monitoring the terminal voltage) of the battery/cell on an intermittent, continuous and/or periodic basis, (ii) determine whether the full relaxation time is below a predetermined value and/or within a predetermined range on an intermittent, continuous and/or periodic basis, and/or (iii) adapt, adjust and/or control characteristics of the charge or current signals applied to or injected into the battery/cell (for example, amount of the applied charge or current) so that the full relaxation time of the battery/cell to such charging is below a predetermined value and/or within a predetermined range on an intermittent, continuous and/or periodic basis. For the sake of brevity, that discussion will not be repeated in connection with full relaxation time.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions. Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the adaptive charging techniques and circuitry of the present inventions may monitor and/or determine one or more (or all) of the parameters discussed herein (including, for example, (i) change in terminal voltage in response to one or more charge/discharge pulses, (ii) partial relaxation time, (iii) SOC of the battery/cell, (iv) full relaxation time or overpotential and/or (v) SOH (or changes therein) of the battery/cell) and responsively adapt the characteristics of the charging sequence (for example, the amount of charge, length and relative location of rest periods, the amplitude of the charging signals, the duration or width of the charge or charging signals and/or shape of the charging signals) to control one or more (or all) of such parameters. The present inventions are neither limited to any combination and/or permutation of such monitoring and/or adaptation. Indeed, the control circuitry may employ such techniques and/or control such parameters in any combination; all combination or permutations thereof are intended to fall within the scope of the present inventions.

For example, in one embodiment, the control circuitry, using the state or status of one or more (or all) of the aforementioned parameters which are determined at differing rates, adapts, adjusts and/or controls the characteristics of the charge injected into the battery/cell (via controlling, for example, the shape, amplitude and/or duration of the current signal output by the charging circuitry). With reference to FIG. 17A-17E, the control circuitry may implement one or more adaptation loops to determine whether to adapt, adjust and/or control the characteristics of the charge injected into the battery/cell (via control of the charging circuitry). For example, the control circuitry may employ a first adaption loop which monitors and/or determines a change in terminal voltage in response to one or more charge/discharge pulses (of, for example, one or more packets) and/or the partial relaxation time to responsively adapt the characteristics of the charging sequence. (See, for example, FIG. 18A). Here, the control circuitry may monitor and/or determine the parameters of the first loop and/or responsively adapt the characteristics of the charging sequence based on or using the parameters of the first loop at a first rate (for example, 1 to 100 ms).

In addition thereto, or in lieu thereof, the control circuitry may employ a second adaption loop which determines or estimates the SOC of the battery/cell and/or the full relaxation time or overpotential to responsively adapt the characteristics of the charging sequence. (See, for example, FIG. 18B). Here, the control circuitry may monitor and/or determine or estimates the parameters of the second loop and/or responsively adapt the characteristics of the charging sequence based on or using the parameters of the second loop at a second rate (which is less than the first rate—for example, 1 to 1000 seconds).

The control circuitry may, in addition thereto or in lieu thereof, employ a third adaption loop which determines or estimates the SOH (or changes therein) of the battery/cell to responsively adapt the characteristics of the charging sequence. (See, for example, FIG. 18C). Here, the control circuitry may monitor and/or determine or estimate the parameter of the third loop and/or responsively adapt the characteristics of the charging sequence based on or using the parameter of the third loop at a third rate (which is less than the first and second rates—for example, after a predetermined number of charge and/or discharge cycles (for example, 1-10 charge and/or discharge cycles)).

Notably, the control circuitry may, in addition thereto or in lieu thereof, employ a fourth adaption loop which determines or estimates the temperature (or changes therein) of the battery/cell during charging to responsively adapt the characteristics of the charging sequence. (See, for example, FIG. 18D). Here, the control circuitry may monitor and/or determine or estimate the temperature of the battery/cell and/or responsively adapt the characteristics of the charging sequence based on or using the temperature of the battery/cell at a fourth rate (which is different from the first, second and/or third rates—for example, every 5 minutes and/or during a SOC determination or estimation).

Figure 17A:
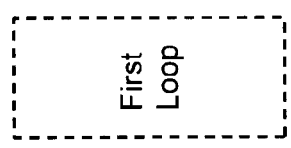
FIGS. 17A-17E illustrate, in flowchart like form, adaptive charging techniques having one or more adaption loops wherein each adaption loop estimates, calculates, measures and/or determines one or more different parameters; notably, the adaptation loops may be implemented alone/separately or in combination; all combination or permutations thereof are intended to fall within the scope of the present inventions.
Figure 17B:
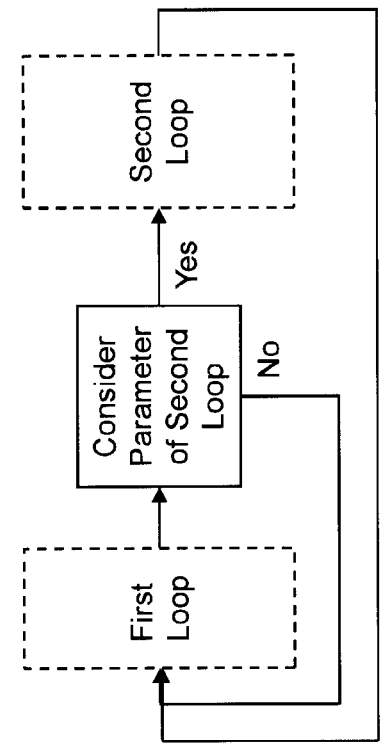
Figure 17C:
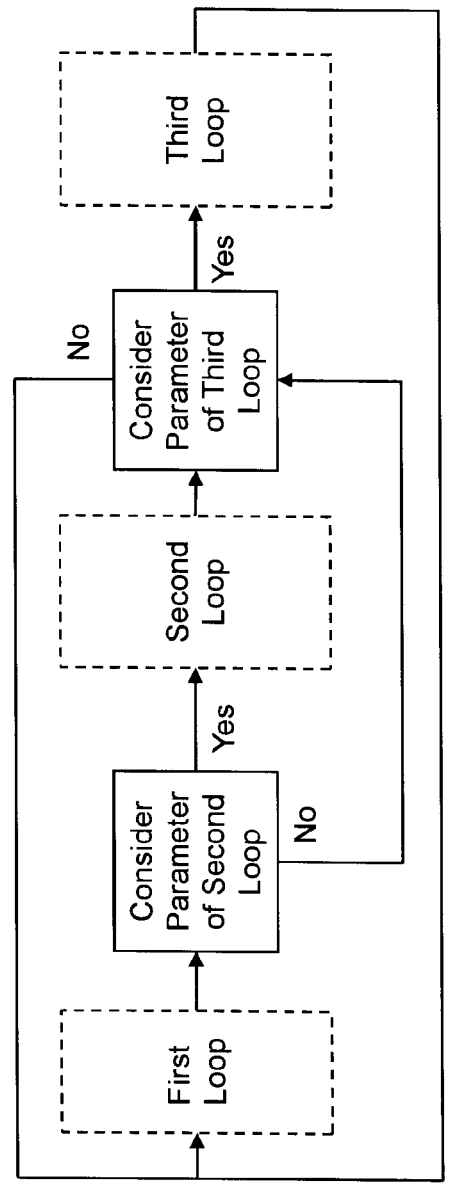
Figure 17D:
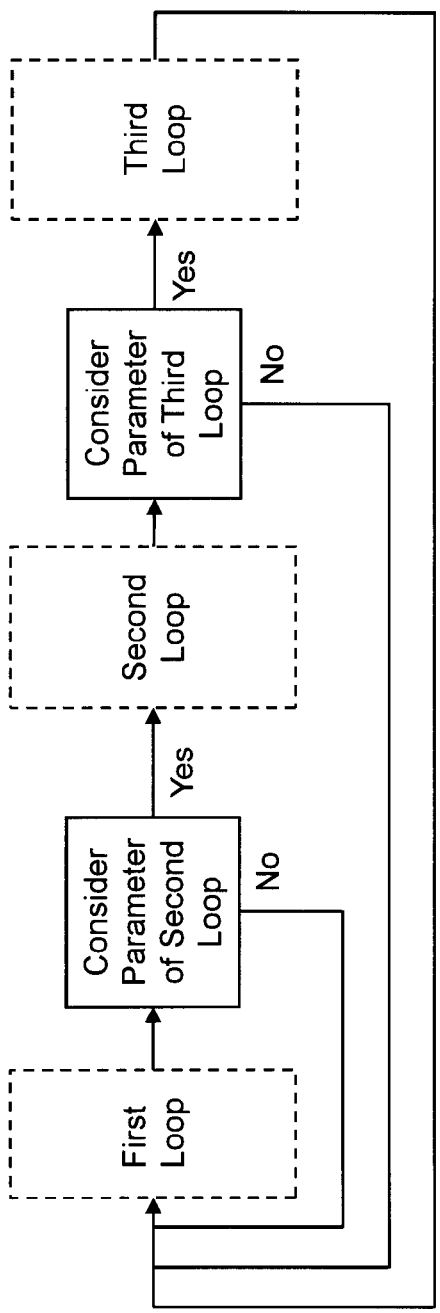
Figure 17E:
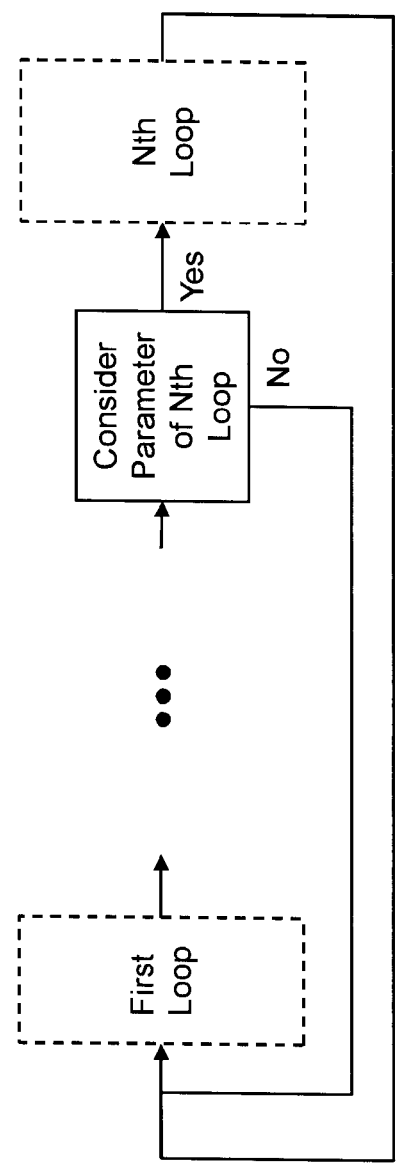
Figure 19A:
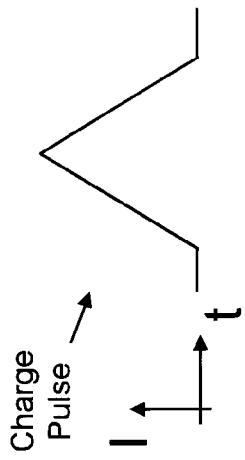
FIGS. 19A-19D illustrate exemplary charge pulses having different shapes and pulse widths; all combination or permutations of charge pulse characteristics are intended to fall within the scope of the present inventions.
Figure 19B:
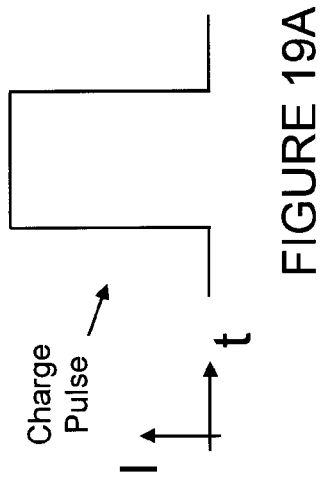
Figure 19C:
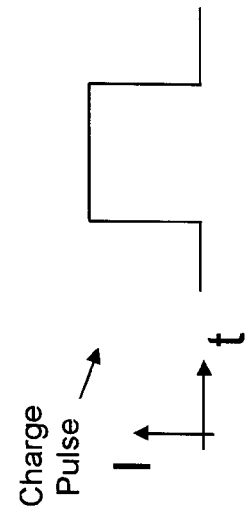
Figure 19D:
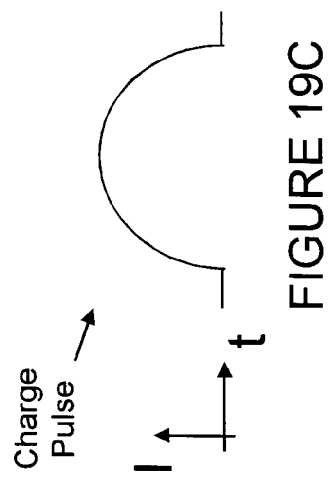

With reference to FIG. 17E, the control circuitry may implement a technique that includes N adaption loops (where N is a natural number—i.e., 1, 2, . . . ) wherein the control circuitry determines or estimates the parameters associated with each loop and/or responsively adapt the characteristics of the charging sequence based on or using the associated parameter of each loop at a corresponding rate. Notably, in each of the above embodiments, the monitoring circuitry may monitor the state, parameters and/or characteristics of the battery/cell (for example, terminal voltage) in accordance with the aforementioned rates and/or continuously, intermittently and/or periodically.

Thus, the adaptive charging techniques and circuitry of the present inventions may implement one or more adaption loops each based on one or more different parameter. The present inventions are neither limited to any combination and/or permutation of such adaptation loops. Indeed, the control circuitry may employ such adaption loops alone/separately or in any combination; all combination or permutations thereof are intended to fall within the scope of the present inventions.

The rate at which the control circuitry implements an adaption loop may be temporally based and/or event based. For example, the control circuitry may estimate, calculate, measure and/or determine the SOC or SOH (and/or changes therein) based on one or more events and/or charging response characteristics (for example, the charge retained and/or provided battery/cell is "inconsistent" with the SOC or SOH data and/or there is an "inconsistency" between the SOC, SOH, relaxation time and/or the voltage at the terminals of the battery/cell during charging). That is, in one embodiment, in response to detecting one or more events (for example, a beginning or initiation of a charging sequence/cycle) and/or "triggerable" charging response characteristics (due to, for example, an "inconsistency" between the battery charge response characteristics or parameters which suggests, for example, the SOH (which may be stored in memory) may not be as estimated or determined), the control circuitry estimates, calculates, measures and/or determines the SOH (and/or changes therein) of a battery/cell and adapts, adjusts and/or controls the amount of charge injected into the battery/cell based on or using SOH (and/or changes therein) of the battery/cell.

Further, although several of the exemplary embodiments are described and/or illustrated in the context of circuitry and/or techniques for a lithium ion technology/chemistry based battery/cell (for example, lithium-cobalt dioxide, lithium—manganese dioxide, lithium-iron phosphate, and lithium—iron disulfide), the inventions described and/or illustrated herein may also be implemented in conjunction with other electrolyte battery chemistries/technologies including, for example, nickel-cadmium and other nickel metal hydride chemistries/technologies. As such, the embodiments set forth in the context of lithium ion based batteries/cells are merely exemplary; and other electrolyte battery chemistries/technologies, implementing one or more of the features of the present inventions as described herein, are intended to fall within the scope of the present inventions. It is to be understood that other embodiments may be utilized and operational changes may be made without departing from the scope of the present inventions. Indeed, the foregoing description of the exemplary embodiments of the inventions has been presented for the purposes of illustration and description. It is intended that the scope of the inventions not be limited solely to the description above.

Further, as discussed above, the control circuitry may intermittently, continuously and/or periodically estimate, calculate, measure and/or determine a change in terminal voltage of the battery/cell in response to a charge or discharge signal, packet and/or pulse. In addition thereto, the control circuitry may intermittently, continuously and/or periodically adapt, adjust and/or control the characteristics of the charge or discharge signal, packet and/or pulse (via controlling, for example, the shape, amplitude and/or duration of the signal output of the charging circuitry) based on whether the change in terminal voltage is within a predetermined range. Thus, in one embodiment, the adaptive charging techniques and/or circuitry intermittently, continuously and/or periodically measure or monitor the terminal voltage of the battery/cell. Based thereon or using such data, the adaptive charging techniques and/or circuitry may intermittently, continuously and/or periodically determine and/or adapt the subsequent charging and discharging of the battery/cell so that the change in terminal voltage is within a predetermined range. Accordingly, adaptive charging techniques and/or circuitry of the present inventions may (i) measure or monitor the terminal voltage of the battery/cell on an intermittent, continuous and/or periodic basis, (ii) determine whether a change in terminal voltage (which is response to charge and discharge pulses) is within a predetermined range on an intermittent, continuous and/or periodic basis, and/or (iii) adapt, adjust and/or control characteristics of the charge or current (for example, amplitude of the applied charge or current) applied to or injected into the battery/cell so that the change in terminal voltage is within a predetermined range on an intermittent, continuous and/or periodic basis. All permutations and combinations are intended to fall within the scope of the present inventions. Indeed, such embodiments are applicable to the charging techniques and/or circuitry which apply or inject (i) charge packets having one or more charge pulses and (ii) charge packets having one or more charge pulses and one or more discharge pulses.

Moreover, in one embodiment, the exemplary charge and discharge signals generated, output and/or applied by the current charging circuitry to the battery/cell may be characterized as including a plurality of packets (for example, about 1,000 to about 50,000 packets—depending on the initial SOC and the final SOC), wherein each packet includes a plurality of current pulses (for example, 1 to about 50 pulses in each packet). (See, FIGS. 3A-3K and 5A wherein the illustrative exemplary packets depict various characteristics (for example, a programmable number of pulses, pulse shapes, sequence, combination and/or spacing of charge and discharge pulses, pulse widths and/or duty cycles)). The charge pulses and discharge pulses may be any shape (for example, rectangular, triangle, sinusoidal or square). (See, for example, FIGS. 19A-19D and 20A-20D). Moreover, the current or charge pulses may include charging and discharging pulses (each having fixed, programmable and/or controllable shapes, pulse widths and/or duty cycles). (See, for example, FIGS. 3C-3G and 5B).

In addition, the packets may also include one or more rest periods having programmable or controllable durations. That is, each packet may include one or more rest periods wherein each rest period (if more than one) having a programmable and/or controllable temporal width/duration. (See, for example, FIGS. 5A and 5B).

Notably, in one exemplary embodiment, the charge and/or discharge pulses of the packet are square shaped including a temporal duration of between about 1 ms and about 100 ms, and preferably less than 30 ms. (See, for example, FIGS. 5A and 5B). This exemplary packet includes one or two charge pulses and one discharge pulse (for example, 1:1, 2:1 and/or 3:2 charge pulses to discharge pulses) wherein the amplitudes and duty cycles are programmable. (See, for example, FIGS. 5A and 5B). Further, in this exemplary embodiment, each packet includes one rest period having a programmable and/or controllable temporal width/length. In one exemplary embodiment, the intermediate rest period includes a temporal length or duration of between about 1 ms and about 20 ms. In addition, the rest period, in one exemplary embodiment, includes a temporal length or duration of between about 1 ms and about 200 ms. Notably, control circuitry 16 adapts the temporal width/length programmable rest periods (for example, the rest period ($T_{rest}$) in FIGS. 5A and 5B) based on or using data which is representative of the relaxation time of the battery/cell.

Indeed, in operation, one, some or all of the characteristics of the charge pulses and/or discharge pulses are programmable and/or controllable via charging circuitry 12 including, for example, the shape, amplitude and/or duration of the pulses. Moreover, the sequence of the charge and discharge pulses (within a packet) is programmable via charging circuitry 12. For example, the discharge pulse may precede the charge pulse and/or the packet may include more charge pulses than discharge pulses (for example, 2:1 or 3:2 charge pulses to discharge pulses) or more discharge pulses than charge pulses (for example, 2:1 or 3:2 charge pulses to discharge pulses).

Moreover, the amplitude of the charge and/or discharge pulses may vary within the packet (and is/are programmable and/or controllable via the control circuitry), the duration of the charge and/or discharge pulses may vary (and is/are programmable and/or controllable via the control circuitry), and/or the duration and/or timing of the rest period(s) may vary within the packet (and is/are programmable and/or controllable via the control circuitry). Again, the control circuitry may employ such programmable characteristics so that the change in voltage at the terminals of the battery/cell in response to such pulses is within a predetermined range.

As intimated above, the control circuitry may manage, adjust, program, and/or control the amount of charge input into the battery/cell and/or the amount of charge removed from the battery/cell via the charging circuitry. For example, the amount of charge input into the battery/cell may be controlled via adjusting, controlling and/or modifying characteristics of the charge pulses (for example, pulse amplitude, pulse width/duration and pulse shape). Similarly, the amount of charge removed from the battery/cell may be controlled via adjusting, controlling and/or modifying characteristics of the discharge pulses (for example, pulse amplitude, pulse width/duration and pulse shape).

In addition thereto, or in lieu thereof, the control circuitry may manage, adjust, program, and/or control the ratio of the amount of charge input to the battery/cell to the amount of charge removed from the battery/cell, over time, via control of the charging circuitry. In one embodiment, the control circuitry adapts, adjusts and/or controls the ratio of charge packets (which input a certain or predetermined amount of charge into the battery/cell) to discharge packets (which remove a certain or predetermined amount of charge from the battery/cell). For example, the control may provide a ratio of between five and ten charge packets to discharge packets, and in a preferred embodiment the ratio is greater than ten.

In addition thereto, or in lieu thereof, in another embodiment, the control circuitry may adjust, program, and/or control the ratio on a per packet basis (i.e., charge packet and/or discharge packet). In this regard, the control circuitry adjusts, programs, and/or controls the amount of charge input per packet and the amount of charge removed per packet to provide, manage, adjust, program, and/or control the ratio of the amount of charge input to the battery/cell to the amount of charge removed from the battery/cell, over time. Thus, in this exemplary embodiment, the control circuitry adjust, program, and/or control the ratio on a packet-by-packet basis via controlling the charging circuitry.

Notably, a smaller ratio of the amount of charge input to the amount of charge removed will tend to lengthen the charge time to, for example, less than an optimal value. Under these circumstances, the charging technique is increasing cycle life via increasing charge time. However, as indicated above, in certain aspects, the adaptive charging circuitry and techniques of the present inventions may provide, enhance, control, optimize and/or adjust the charging profile to (i) minimize and/or reduce total charging time and (ii) maximize and/or increase cycle life. As such, in certain embodiments, the adaptive charging circuitry and techniques of the present inventions may provide, enhance, control, optimize and/or adjust the charging profile to reduce the charging time without managing, increasing and/or maximizing the cycle life of the battery/cell. Similarly, in certain embodiments, the adaptive charging circuitry and techniques of the present inventions may provide, enhance, control, optimize and/or adjust the charging profile to increase the cycle life of the battery/cell without managing, reducing and/or minimizing the charging time of the battery/cell.

Thus, the characteristics of the charge pulses and/or discharge pulses are programmable, controllable and determined by the control circuitry when implementing one or more of the adaptive charging techniques described and/or illustrated herein (charging techniques to adapt, adjust and/or control one or more characteristics of the charge or current applied to or injected into the battery/cell so that the change in voltage at the terminals of the battery/cell is within a predetermined range).

The characteristics of consecutive charge and discharge packets may be repetitive. That is, the combination of charging pulses, discharging pulses and rest periods may be repetitive, which, in combination form a packet. Such packets of a charge or discharge signal may be repetitive. All combination or permutations of charging pulses and discharging pulses are intended to fall within the scope of the present inventions.

Notably, such charge signals and discharge signals may be repeated over a charging period. The control circuitry may control, adjust, calculate and/or vary one or more of the parameters or characteristics of the charging signals and/or discharging signals via controlling one or more of the constituent packets including the charge pulses, discharging pulses and rest periods thereof. For example, the parameters or characteristics of the charging and/or discharging pulses of one or more packets of one or more charging and/or discharging signals, namely shape, durations and/or current amplitudes of the pulses, may be adaptively modified as described herein to implement the adaptive charging algorithm or techniques described herein. Indeed, in one embodiment, the duration of the charging signal may be from one millisecond to several seconds. Moreover, the duration of the discharging signal (in one embodiment) may be from one millisecond to a few hundreds of milliseconds.

Notably, the adaptive charging technique or algorithm may adaptively obtain or provide a predetermined relaxation time or period by adjusting and/or controlling the amount of electrical charge removed during the discharge period (by, for example, controlling the characteristics of the discharge signal(s) and/or period), the amount of electrical charge added during the charge period (by, for example, controlling the characteristics of the charge signal(s) and/or period), and/or the amount of time of the rest period. All combination or permutations thereof are intended to fall within the scope of the present inventions. In this regard, each of the charge signals, discharge signals and rest periods may be adapted to control and/or manage the relaxation time of the cell of the battery. In addition to adapting the sequence of the charge signals, discharge signals and rest periods—in relation to each other—the control circuitry may vary, adjust and/or control one or more of the variable characteristics of the charge signals, discharge signals and rest periods. In this way, the control circuitry may obtain or provide a desired or predetermined relaxation time or period (for example, a relaxation time that is within prescribed range, by adjusting and/or controlling the amount of electrical charge removed during the discharge period (by, for example, controlling the characteristics of the discharge signal(s) and/or period), the amount of electrical charge added during the charge period (by, for example, controlling the characteristics of the charge signal(s) and/or period), and/or the characteristics of the rest period. In one embodiment, the adaptive charging technique or algorithm employs a sequence of discharge signals where the relaxation time is calculated, determined and/or measured after each of the discharge signals. In this way, the control circuitry may adaptively determine the total amount of electrical charge that should be removed (and, in response thereto, control the charging circuitry accordingly).

There are numerous permutations involving the amount of electrical charge added to the battery/cell during the charge or charging signal and the amount of charge removed during the discharging signal. All permutations are intended to fall within the scope of the present inventions. Notably, each permutation may result in a different relaxation period. Moreover, within each permutation, there exists a large number of sub-permutations that i) combine the characteristics of the charge or charging signals (for example, the duration, shape and/or amplitude of the charging signal), the product of which determines the amount of electrical charge added to the cell; and ii) combine the characteristics of the discharging signal (for example, the duration, shape and/or amplitude of the discharging signal), the product of which determines the amount of electrical charge removed from the cell; and iii) the length of time of the rest period. The characteristics of the charge or charging signals may differ from the characteristics of the discharging signals. That is, one or more of the duration, shape and/or amplitude of the charging signal may differ from one or more of the duration, shape and/or amplitude of the discharging signal.

As indicated above, the discharging signal (negative current signal) may include a plurality of discharge pulses and one or more charging pulses. (See, for example, FIGS. 2C, 2D and 3K-3N). The discharge signals remove charge from the battery/cell and may be employed to reduce the time period for the battery/cell terminal voltage to return to equilibrium. In this regard, the discharge period may remove excess charge that has not diffused into the anode, and thus may, for example, contribute to degradation mechanisms, examples include the thickening of the solid-electrolyte interface (SEI) layer or metallic plating of lithium. Clearly, the difference between the electrical charge added to the cell during the charging signal and the electrical charge removed from the cell during the discharge period determines a net total electrical charge added to the cell in one period. This net total electrical charge divided by the period may determine a net effective charging current. All combination or permutations of charging signals and discharging signals are intended to fall within the scope of the present inventions.

As stated above, the SOC of a rechargeable battery/cell, for example, a lithium-ion battery/cell, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a zero reading indicates that the battery/cell is fully discharged. (See, for example, (1) "Method and Circuitry to Control Charging of a Rechargeable Battery", Maluf et al., U.S. Provisional Patent Application Ser. No. 61/346,953, filed May 21, 2010, (2) "Method and Circuitry to Measure the State of Charge and Impedance of a Rechargeable Battery and to Adaptively Control the Charging of Same", Maluf et al., U.S. Provisional Patent Application Ser. No. 61/358,384, filed Jun. 24, 2010, (3) "Method and Circuitry to Adaptively Charge a Rechargeable Battery", Maluf et al., U.S. Provisional Patent Application Ser. No. 61/368,158, filed Jul. 27, 2010, and (4) "Method and Circuitry to Adaptively Charge a Battery/Cell", Ghantous et al., U.S. Provisional Application No. 61/439,400, filed Feb. 4, 2011).

The present inventions may employ any technique and/or circuitry now known or later developed may be employed to estimate, calculate, measure and/or determine parameters of the battery/cell including, for example, the SOC or SOH of a battery/cell. For example, in one embodiment, the present inventions employ the techniques and/or circuitry described and/or illustrated in the U.S. Provisional Patent Applications and, in particular, the techniques and/or circuitry described and/or illustrated in U.S. Provisional Application Ser. No. 61/358,384 (Inventors: Maluf et al., filed Jun. 24, 2010) to estimate, calculate, measure and/or determine the SOC of the battery/cell. In this regard, in one embodiment, the control circuitry may calculate, measure and/or determine the relaxation time (in response to an applied charge, for example, one or more charge pulses) and thereafter correlate the relaxation time to a SOC of the battery/cell. In addition thereto, or in lieu thereof, the control circuitry may calculate, measure and/or determine characteristics of the change in terminal voltage in response to an applied charge (for example, one or more charge pulses) and thereafter correlate such change in characteristics (for example, the peak amplitude and/or increase) to a SOC of the battery/cell.

As noted above, in another aspect of the present inventions, the circuitry and/or techniques measure the SOC of a battery/cell. Here, the circuitry and/or techniques employ the voltage and current to obtain, measure, monitor, calculate and/or estimate data which are representative of the SOC of the battery/cell. In this regard, the present inventions may measure data which is representative of the relaxation time of the battery/cell to one or more charge pulse and, based thereon, determine the SOC of the battery/cell. As mentioned above, the circuitry and/or techniques may also employ the temperature of the battery/cell in addition to other parameters. Here, the monitoring circuitry may include one or more temperature sensors (not illustrated) which is/are thermally coupled to the battery/cell to generate, measure and/or provide data which is representative of the temperature of the battery/cell.

The data which is representative of the relaxation time may correlate to the amount of charge added to the battery/cell in response to an application of one or more charging pulses, the SOC of the battery/cell, and the temperature of the battery/cell. Using data corresponding to or representative of the relaxation time for a given charge pulse or pulses (and temperature), circuitry and techniques may estimate, derive, determine, calculate, generate and/or obtain the correlation of the relaxation time to the SOC of the battery/cell. In one embodiment, a functional relationship or look-up table may be determined, estimated, calculated, generated and/or obtained (by circuitry and/or techniques performed on-device and/or off-device) which correlates a measured relaxation time to the SOC of the battery/cell. The correlation of the relaxation time to the SOC of the battery/cell (for example, the aforementioned relationship or look-up table) may be employed by circuitry and/or techniques of the present inventions to adapt the charging profile of the battery/cell based on or using the SOC of the battery/cell to, for example, alleviate, minimize and/or reduce the adverse impact of the charging operation on the SOH of the battery/cell and increase, improve and/or maximize cycle life of the battery/cell thereof.

In addition thereto, or in lieu thereof, the present inventions may measure data which is representative of the characteristics (for example, peak amplitude) of the voltage change (for example, increase) to one or more charge pulse and, based thereon, determine the SOC of the battery/cell. Using data corresponding to or representative of the characteristics (for example, peak amplitude) of the voltage change (for example, increase) to one or more charge pulse, circuitry and techniques may derive, determine, calculate, generate and/or obtain the correlation of a peak amplitude of the voltage change to the SOC of the battery/cell. In one embodiment, a functional relationship or look-up table may be determined, calculated, generated and/or obtained which correlates a peak amplitude of the voltage change to the SOC of the battery/cell. The correlation of the peak amplitude of the voltage change to the SOC of the battery/cell (for example, the aforementioned relationship or look-up table may be employed by circuitry and/or techniques (which may be on-device and/or off-device) to adapt the charge operation of the battery/cell based on or using the SOC of the battery/cell. Adaptively controlling the charge profile or characteristics may alleviate, minimize and/or reduce the adverse impact of the charging operation on the SOH of the battery/cell and thereby increase, improve and/or maximize cycle life of the battery/cell.

As intimated above, data which is representative of the SOC of a rechargeable battery/cell may be dependent on temperature. With that in mind, the circuitry and techniques for adaptively charging such a battery/cell based on or using the SOC of the battery/cell, may also consider the temperature of the battery/cell in connection with the charging characteristics of the battery/cell. Thus, while temperature may not be necessarily mentioned, such data may be dependent on the temperature.

Notably, in one embodiment, the relaxation time, measurement of the SOC and/or measurement of overvoltage potential may be implemented via circuits that apply a short charge pulse or discharge pulse. Such circuits may be implemented in the charging circuitry or in measurement circuitry. For example, in one implementation, a current source is gated by a switch, and the terminal voltage of the battery/cell is monitored (for example, continuously). In another implementation, circuitry of the charging circuitry may is employed to generate a short charge or discharge pulse. For example, a laptop computer or smartphone includes an integrated charging circuit responsible for charging the battery. The charging integrated circuit is directly controlled through a communication bus such as, for example, I2C or SMBus®.

As indicated above, the monitoring circuitry monitors, senses, detects and/or samples (on an intermittent, continuous and/or periodic basis) characteristics of the battery/cell including, for example, the response of the battery/cell to one or more charge pulses, the terminal voltages and the temperature. In one embodiment, the monitoring circuitry includes a sensor to determine a voltage (for example, a voltmeter) and/or a sensor to determine a current (for example, a current meter). (See, for example, FIG. 1D). The monitoring circuitry and techniques may be those described herein, now known or later developed, to acquire data employed by the control circuitry to adaptive the charging profile of the battery; all such monitoring circuitry and techniques are intended to fall within the scope of the present inventions.

In addition, as mentioned above, the control circuitry acquires the data from the monitoring circuitry and, estimates, calculates and/or measures the change in voltage in response to the charge/discharge pulses and packets, relaxation time of the battery/cell to one or more charge pulses, the characteristics (for example, peak amplitude) of the OCV to one or more charge/discharge pulses, and/or the impedance of the battery/cell and, if appropriate, adapts the charging process by controlling the operation of the charging circuitry. The present inventions may employ any control circuitry and charging circuitry whether that described herein, now known or later developed, to charge the battery/cell as well as adapt the charging process.

Further, as noted above, control circuitry may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by the control circuitry using any programming language whether now known or later developed, including, for example, assembly, FORTRAN, C, C++, and BASIC, whether compiled or uncompiled code; all of which are intended to fall within the scope of the inventions.

Moreover, monitoring circuitry and control circuitry may share circuitry with each other as well as with other elements. Moreover, such circuitry may be distributed among a plurality of integrated circuits which may also perform one or more other operations, which may be separate and distinct from that described herein.

As noted above, the charging circuitry responsively applies one or more current or charging signal to the battery/cell to the battery/cell (which may include two terminals). The charging circuitry may also apply one or more charging signals (which provide a net input of charge or current into the battery/cell—for example, one or more charge pulses) and one or more discharging signals (which provide a net removal of charge or current from the battery/cell—for example, one or more discharge pulses which dissipate charge (see, for example, "Recovery of Energy from Discharge Pulses", Berkowitz et al., U.S. Provisional Application Ser. No. 61/360,048, filed Jun. 30, 2011). In one embodiment, the charging circuitry includes a current source. (See, for example, FIG. 1D). In addition thereto, or in lieu thereof, the charging circuitry may include a voltage source. As discussed herein, the charging circuitry is responsive to one or more control signals from the control circuitry. (See, for example, FIG. 1D).

Notably, at times, terms battery and cell have been employed interchangeably to mean an electrical storage device that may be electrically charged and discharged. Such a device may include a single electrical cell, or may include several cells electrically connected in series and/or parallel to form a battery of larger electrical capacity. It shall be noted that the embodiments for adaptive charging described above shall apply to either cells or batteries, as a single unit or multiple units electrically configured into a larger battery pack.

Notably, a "circuit" means, among other things, a single component (for example, electrical/electronic) or a multiplicity of components (whether in integrated circuit form, discrete form or otherwise), which are active and/or passive, and which are coupled together to provide or perform a desired operation. In addition, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of the present inventions. The computer-readable media corresponding to such simulations and/or testing tools are also intended to fall within the scope of the present inventions.

In the claims, the term "battery" means an individual cell (which stores energy) and/or a plurality of cells arranged electrically in a series and/or parallel configuration.

Notably, the terms "first," "second," and the like, herein do not denote any order, quantity, or importance, but rather are used to distinguish one element from another. Moreover, in the claims, the terms "a" and "an" herein do not denote a limitation of quantity, but rather denote the presence of at least one of the referenced item.

What is claimed is:

1. A method of controlling at least one characteristic of a charging process for a battery having positive and negative terminals, the method comprising:
    (a) measuring a terminal voltage between the terminals of the battery multiple times or continuously over a period of time;
    (b) from the measurements of the terminal voltage in (a), determining a relaxation time of the battery; and
    (c) based on the relaxation time determined in (b), controlling at least one characteristic of a charging process for the battery.

2. The method of claim 1, wherein the relaxation time is a full relaxation time.

3. The method of claim 1, wherein controlling the at least one characteristic of the charging process for the battery comprises adjusting the at least one characteristic so that the relaxation time is below a predetermined value and/or within a predetermined range.

4. The method of claim 3, wherein the predetermined value and/or predetermined range varies with state of charge of the battery and/or state of health of the battery.

5. The method of claim 1, wherein determining the relaxation time of the battery comprises determining from the measurements of the terminal voltage a period of time between an excitation signal applied to the battery terminals and a full or partial equilibrium state.

6. The method of claim 5, wherein the excitation signal comprises a charge pulse.

7. The method of claim 1, wherein determining the relaxation time of the battery comprises determining from the measurements of the terminal voltage a period of time for the terminal voltage to drop to a predetermined level and/or drop by a predetermined amount associated equilibrium in the battery.

8. The method of claim 1, wherein the at least one characteristic of the charging process for the battery are characteristics of a charge signal.

9. The method of claim 8, wherein the at least one characteristic is selected from the group consisting of an amplitude and/or a duration of the charge signal.

10. The method of claim 8, wherein the current signal comprises a plurality of charge pulses and a plurality of discharge pulses.

11. An apparatus to charge a battery including at least two terminals, the apparatus comprising:
    current generation circuitry, coupled to the battery, to:
        generate a current signal, and
        apply the current signal to the battery;
    measuring circuitry, coupled to the battery, to measure a voltage at the terminals of the battery; and
    control circuitry, coupled to the current generation circuitry and the measuring circuitry, and configured to (i) receive data which is representative of the measured voltage, and (ii) output one or more control signals to the current generation circuitry, wherein the control circuitry is further configured to:
        (a) obtain a terminal voltage measured multiple times or continuously over a period of time,
        (b) from the measurements of the terminal voltages obtained in (a), determining a relaxation time of the battery, and
        (c) based on the relaxation time determined in (b), control at least one characteristic of the current signal.

12. The apparatus of claim 11, wherein the relaxation time is a full relaxation time.

13. The apparatus of claim 11, wherein the control circuitry is configured such that controlling the at least one characteristic of the current signal comprises adjusting the at least one characteristic so that the relaxation time is below a predetermined value and/or within a predetermined range.

14. The apparatus of claim 13, wherein the predetermined value and/or predetermined range varies with state of charge of the battery and/or state of health of the battery.

15. The apparatus of claim 11, wherein the control circuitry is configured such that determining the relaxation time of the battery comprises determining from the measurements of the terminal voltage a period of time between an excitation signal applied to the battery terminals and a full or partial equilibrium state.

16. The apparatus of claim 15, wherein the excitation signal comprises a charge pulse.

17. The apparatus of claim 11, wherein the control circuitry is configured such that determining the relaxation time of the battery comprises determining from the measurements of the terminal voltage a period of time for the terminal voltage to drop to a predetermined level and/or drop by a predetermined amount associated equilibrium in the battery.

18. The apparatus of claim 11, wherein the at least one characteristic is selected from the group consisting of an amplitude and/or a duration of the current signal.

19. The apparatus of claim 11, wherein the current signal comprises a plurality of charge pulses and a plurality of discharge pulses.

* * * * *